US012712005B1

(12) United States Patent
Dokania et al.

(10) Patent No.: US 12,712,005 B1
(45) Date of Patent: Aug. 18, 2026

(54) MULTI-LEVEL BIT-CELL WITH NON-LINEAR POLAR MATERIAL

(71) Applicant: Kepler Computing Inc., San Francisco, CA (US)

(72) Inventors: Rajeev Kumar Dokania, Beaverton, OR (US); Steve Novakov, Beaverton, OR (US); Biswajeet Guha, Hillsboro, OR (US); James David Clarkson, El Sobrante, CA (US); Tanay Gosavi, Portland, OR (US); Amrita Mathuriya, Portland, OR (US); Debo Olaosebikan, San Francisco, CA (US); Sasikanth Manipatruni, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 0 days.

(21) Appl. No.: 18/443,188

(22) Filed: Feb. 15, 2024

(51) Int. Cl.

| | |
|---|---|
| ***G11C 11/22*** | (2006.01) |
| ***H10B 51/10*** | (2023.01) |
| ***H10B 51/20*** | (2023.01) |
| ***H10B 53/10*** | (2023.01) |
| ***H10B 53/20*** | (2023.01) |

(Continued)

(52) U.S. Cl.
CPC ........ *G11C 11/221* (2013.01); *G11C 11/2273* (2013.01); *G11C 11/2275* (2013.01); *H10B 51/10* (2023.02); *H10B 51/20* (2023.02); *H10B 53/10* (2023.02); *H10B 53/20* (2023.02); *H10D 30/0415* (2025.01); *H10D 30/701* (2025.01)

(58) Field of Classification Search
CPC .............. G11C 11/221; G11C 11/2273; G11C 11/2275; H10B 51/10; H10B 51/20; H10B 53/10; H10B 53/20; H10D 30/0415; H10D 30/701
USPC ........................................................ 365/145
See application file for complete search history.

(56) References Cited

U.S. PATENT DOCUMENTS

| | | |
|---|---|---|
| 4,809,225 A | 2/1989 | Dimmler et al. |
| 4,853,893 A | 8/1989 | Eaton, Jr. et al. |
| 5,086,412 A | 2/1992 | Jaffe et al. |

(Continued)

FOREIGN PATENT DOCUMENTS

| | | |
|---|---|---|
| EP | 0798736 A2 | 10/1997 |
| JP | H0982907 A | 3/1997 |

(Continued)

OTHER PUBLICATIONS

Notice of Allowance notified Nov. 25, 2022 for U.S. Appl. No. 17/531,577.

(Continued)

*Primary Examiner* — Fernando Hidalgo
(74) *Attorney, Agent, or Firm* — MUGHAL GAUDRY & FRANKLIN PC

(57) ABSTRACT

An apparatus comprising a transistor having a gate terminal coupled to a word-line, wherein the transistor is further coupled to a bit-line. The apparatus further comprises a capacitor having a first terminal coupled to a plate-line and a second terminal coupled to the transistor, wherein the capacitor includes a non-linear polar material, and wherein the capacitor includes at least four stable states. In at least one example, the capacitor has a first polarization loop and a second polarization loop, wherein the second polarization loop is within the first polarization loop.

19 Claims, 37 Drawing Sheets

(51) Int. Cl.
*H10D 30/01* (2025.01)
*H10D 30/69* (2025.01)

(56) References Cited

U.S. PATENT DOCUMENTS

| | | | |
|---|---|---|---|
| 5,218,566 | A | 6/1993 | Papaliolios |
| 5,270,967 | A | 12/1993 | Moazzami et al. |
| 5,381,364 | A | 1/1995 | Chern et al. |
| 5,383,150 | A | 1/1995 | Nakamura et al. |
| 5,539,279 | A | 7/1996 | Takeuchi et al. |
| 5,541,872 | A | 7/1996 | Lowrey et al. |
| 5,638,318 | A | 6/1997 | Seyyedy |
| 5,640,030 | A | 6/1997 | Kenney |
| 5,760,432 | A | 6/1998 | Abe et al. |
| 5,917,746 | A | 6/1999 | Seyyedy |
| 5,926,413 | A | 7/1999 | Yamada et al. |
| 5,969,380 | A | 10/1999 | Seyyedy |
| 6,002,608 | A | 12/1999 | Tanabe |
| 6,028,784 | A | 2/2000 | Mori et al. |
| 6,031,754 | A | 2/2000 | Derbenwick et al. |
| 6,043,526 | A | 3/2000 | Ochiai |
| 6,147,895 | A | 11/2000 | Kamp |
| 6,346,741 | B1 | 2/2002 | Buskirk et al. |
| 6,358,810 | B1 | 3/2002 | Dornfest et al. |
| 6,388,281 | B1 | 5/2002 | Jung et al. |
| 6,448,911 | B1 | 9/2002 | Somayajula |
| 6,483,737 | B2 | 11/2002 | Takeuchi et al. |
| 6,500,678 | B1 | 12/2002 | Aggarwal et al. |
| 6,515,957 | B1 | 2/2003 | Newns et al. |
| 6,538,914 | B1 | 3/2003 | Chung |
| 6,548,343 | B1 | 4/2003 | Summerfelt et al. |
| 6,587,367 | B1 | 7/2003 | Nishimura et al. |
| 6,590,245 | B2 | 7/2003 | Ashikaga |
| 6,610,549 | B1 | 8/2003 | Aggarwal et al. |
| 6,643,163 | B2 | 11/2003 | Takashima |
| 6,646,906 | B2 | 11/2003 | Salling |
| 6,656,301 | B2 | 12/2003 | Kirby |
| 6,656,748 | B2 | 12/2003 | Hall et al. |
| 6,713,342 | B2 | 3/2004 | Celii et al. |
| 6,717,838 | B2 | 4/2004 | Hosoi |
| 6,720,600 | B2 | 4/2004 | Okita |
| 6,728,128 | B2 | 4/2004 | Nishimura et al. |
| 6,734,477 | B2 | 5/2004 | Moise et al. |
| 6,795,331 | B2 | 9/2004 | Noro |
| 6,798,686 | B2 | 9/2004 | Takashima |
| 6,809,949 | B2 | 10/2004 | Ho |
| 6,819,584 | B2 | 11/2004 | Noh |
| 6,856,534 | B2 | 2/2005 | Rodriguez et al. |
| 6,873,536 | B2 | 3/2005 | Komatsuzaki |
| 6,906,944 | B2 | 6/2005 | Takeuchi et al. |
| 6,924,997 | B2 | 8/2005 | Chen et al. |
| 7,029,925 | B2 | 4/2006 | Celii et al. |
| 7,173,844 | B2 | 2/2007 | Lee et al. |
| 7,405,959 | B2 | 7/2008 | Koide et al. |
| 7,426,130 | B2 | 9/2008 | Jeon |
| 7,514,734 | B2 | 4/2009 | Aggarwal et al. |
| 7,642,099 | B2 | 1/2010 | Fukada et al. |
| 7,791,922 | B2 | 9/2010 | Doumae et al. |
| 7,812,385 | B2 | 10/2010 | Noda |
| 8,129,200 | B2 | 3/2012 | Kang |
| 8,177,995 | B2 | 5/2012 | Kobayashi et al. |
| 8,300,446 | B2 | 10/2012 | Qidwai |
| 8,441,833 | B2 | 5/2013 | Summerfelt et al. |
| 8,508,974 | B2 | 8/2013 | Clinton et al. |
| 8,665,628 | B2 | 3/2014 | Kawashima |
| 8,717,800 | B2 | 5/2014 | Clinton et al. |
| 8,865,628 | B2 | 10/2014 | Manabe et al. |
| 9,472,560 | B2 | 10/2016 | Ramaswamy et al. |
| 9,620,206 | B2 | 4/2017 | Nazarian et al. |
| 9,786,348 | B1 | 10/2017 | Kawamura et al. |
| 9,812,204 | B1 | 11/2017 | Yan et al. |
| 9,818,468 | B2 | 11/2017 | Müller |
| 9,830,969 | B2 | 11/2017 | Slesazeck et al. |
| 9,899,085 | B1 | 2/2018 | Yan |
| 10,043,567 | B2 | 8/2018 | Slesazeck et al. |
| 10,354,712 | B2 | 7/2019 | Derner et al. |
| 10,600,808 | B2 | 3/2020 | Schröder |
| 10,872,905 | B2 | 12/2020 | Müller |
| 10,963,776 | B2 | 3/2021 | Mulaosmanovic et al. |
| 11,107,516 | B1 | 8/2021 | Rabkin et al. |
| 11,335,391 | B1 | 5/2022 | Ocker |
| 11,545,204 | B1 * | 1/2023 | Dokania ............... G11C 11/417 |
| 2002/0079520 | A1 | 6/2002 | Nishihara et al. |
| 2002/0125517 | A1 | 9/2002 | Nakamura |
| 2002/0153550 | A1 | 10/2002 | An et al. |
| 2003/0012984 | A1 | 1/2003 | Ueda |
| 2003/0112650 | A1 | 6/2003 | Kang |
| 2003/0119211 | A1 | 6/2003 | Summerfelt et al. |
| 2003/0129847 | A1 | 7/2003 | Celii et al. |
| 2003/0137866 | A1 | 7/2003 | Nishihara |
| 2003/0141528 | A1 | 7/2003 | Ito |
| 2003/0174553 | A1 | 9/2003 | Saito et al. |
| 2004/0027873 | A1 | 2/2004 | Nishihara |
| 2004/0089854 | A1 | 5/2004 | Chen et al. |
| 2004/0104754 | A1 | 6/2004 | Bruchhaus et al. |
| 2004/0129961 | A1 | 7/2004 | Araujo et al. |
| 2004/0233696 | A1 | 11/2004 | Kang |
| 2004/0245547 | A1 | 12/2004 | Stipe |
| 2005/0012126 | A1 | 1/2005 | Udayakumar et al. |
| 2005/0214954 | A1 | 9/2005 | Maruyama et al. |
| 2005/0230725 | A1 | 10/2005 | Aggarwal et al. |
| 2005/0244988 | A1 | 11/2005 | Wang et al. |
| 2006/0001070 | A1 | 1/2006 | Park et al. |
| 2006/0002170 | A1 | 1/2006 | Kumura et al. |
| 2006/0006447 | A1 | 1/2006 | Kim et al. |
| 2006/0073613 | A1 | 4/2006 | Aggarwal et al. |
| 2006/0073614 | A1 | 4/2006 | Hara |
| 2006/0134808 | A1 | 6/2006 | Summerfelt et al. |
| 2006/0258113 | A1 | 11/2006 | Sandhu et al. |
| 2007/0298521 | A1 | 12/2007 | Obeng et al. |
| 2008/0025063 | A1 | 1/2008 | Kang |
| 2008/0073680 | A1 | 3/2008 | Wang |
| 2008/0081380 | A1 | 4/2008 | Celii et al. |
| 2008/0101107 | A1 | 5/2008 | Shiga et al. |
| 2008/0107885 | A1 | 5/2008 | Alpay et al. |
| 2008/0191252 | A1 | 8/2008 | Nakamura et al. |
| 2009/0003042 | A1 | 1/2009 | Lee et al. |
| 2010/0174513 | A1 * | 7/2010 | Obradovic ............ G06F 30/367 703/2 |
| 2012/0127776 | A1 | 5/2012 | Kawashima |
| 2012/0134196 | A1 | 5/2012 | Evans, Jr. et al. |
| 2012/0307545 | A1 | 12/2012 | McAdams et al. |
| 2012/0313218 | A1 | 12/2012 | Fujimori et al. |
| 2013/0147295 | A1 | 6/2013 | Shimizu |
| 2014/0208041 | A1 | 7/2014 | Hyde et al. |
| 2015/0069481 | A1 | 3/2015 | Sun et al. |
| 2015/0294702 | A1 | 10/2015 | Lee et al. |
| 2017/0069735 | A1 | 3/2017 | Oh et al. |
| 2017/0277459 | A1 | 9/2017 | Rodriguez et al. |
| 2017/0345831 | A1 | 11/2017 | Chavan et al. |
| 2018/0082981 | A1 | 3/2018 | Gowda |
| 2018/0226418 | A1 | 8/2018 | Morandi et al. |
| 2018/0286987 | A1 | 10/2018 | Lee et al. |
| 2018/0323309 | A1 | 11/2018 | Ando et al. |
| 2018/0331113 | A1 | 11/2018 | Liao et al. |
| 2019/0051642 | A1 | 2/2019 | Hyde et al. |
| 2019/0051815 | A1 | 2/2019 | Kakinuma et al. |
| 2019/0115353 | A1 | 4/2019 | O'Brien et al. |
| 2019/0138893 | A1 | 5/2019 | Sharma et al. |
| 2020/0004583 | A1 | 1/2020 | Kelly et al. |
| 2020/0051607 | A1 | 2/2020 | Pan et al. |
| 2020/0273866 | A1 | 8/2020 | Manipatruni et al. |
| 2020/0273867 | A1 | 8/2020 | Manipatruni et al. |
| 2020/0357453 | A1 | 11/2020 | Slesazeck et al. |
| 2021/0090662 | A1 | 3/2021 | Mennenga et al. |
| 2021/0111179 | A1 | 4/2021 | Shivaraman et al. |
| 2021/0142837 | A1 | 5/2021 | Yu et al. |
| 2021/0193209 | A1 | 6/2021 | Swami et al. |

(56) References Cited

U.S. PATENT DOCUMENTS

| | | | |
|---|---|---|---|
| 2021/0398580 | A1 | 12/2021 | Yuh |
| 2022/0069131 | A1 | 3/2022 | Pesic |

FOREIGN PATENT DOCUMENTS

| | | | |
|---|---|---|---|
| JP | H10242426 | A | 9/1998 |
| JP | H10255484 | A | 9/1998 |
| JP | H1174488 | A | 3/1999 |
| JP | 2000174224 | A | 6/2000 |
| JP | 2001237393 | A | 8/2001 |
| JP | 2002026256 | A | 1/2002 |
| JP | 2002158339 | A | 5/2002 |
| JP | 2003123465 | A | 4/2003 |
| JP | 2005057103 | A | 3/2005 |
| JP | 2005142322 | A | 6/2005 |
| JP | 2005322925 | A | 11/2005 |
| JP | 2006164321 | A | 6/2006 |
| JP | 3959341 | B2 | 8/2007 |
| JP | 2008210955 | A | 9/2008 |
| JP | 2010021544 | A | 1/2010 |
| JP | 2011151370 | A | 8/2011 |
| JP | 2017518632 | A | 7/2017 |
| KR | 20050105695 | A | 11/2005 |
| TW | 200718237 | A | 5/2007 |
| TW | 200919705 | A | 5/2009 |
| TW | 200935151 | A | 8/2009 |
| TW | 201227879 | A | 7/2012 |
| TW | 201725736 | A | 7/2017 |
| WO | 20130147295 | | 10/2013 |
| WO | 2013147295 | A4 | 7/2014 |
| WO | 2015167887 | A1 | 11/2015 |
| WO | 2018125024 | A1 | 7/2018 |
| WO | 2021112247 | A1 | 6/2021 |

OTHER PUBLICATIONS

Notice of Allowance notified Nov. 27, 2023 for U.S. Appl. No. 17/654,802.
Notice of Allowance notified Nov. 29, 2023 for U.S. Appl. No. 17/654,908.
Notice of Allowance notified Oct. 20, 2022 for Taiwan Patent Application No. 110129115.
Notice of Allowance notified Oct. 31, 2022 for U.S. Appl. No. 17/390,796.
Notice of Allowance notified Sep. 13, 2022 for U.S. Appl. No. 17/530,364.
Notice of Allowance notified Sep. 14, 2022 for U.S. Appl. No. 17/530,360.
Notice of Allowance notified Sep. 21, 2022 for U.S. Appl. No. 17/530,366.
Notice of Allowance notified Sep. 23, 2022 for U.S. Appl. No. 17/339,850.
Notice of Allowance notified Sep. 26, 2022 for U.S. Appl. No. 17/367,217.
Notice of Allowance notified Sep. 27, 2022 for U.S. Appl. No. 17/346,083.
Notice of Grant notified May 18, 2021 for Taiwan Patent Application No. 109106095.
Notice of Preliminary Rejection notified Jul. 18, 2023 for Korean Patent Application No. 10-2021-7027261.
Notice of Preliminary Rejection notified Oct. 28, 2022 for Korean Patent Application No. 10-2021-7027303.
Notice of Reasons for Rejection notified Dec. 6, 2022 for Japanese Patent Application No. 2021-546823.
Notice of Reasons for Rejection notified Jun. 20, 2023 for Japanese Patent Application No. 2021-546823.
Notice of Reasons for Rejection notified Nov. 22, 2022 for Japanese Patent Application No. 2021-546864.
Office Action notified May 16, 2023 for Japanese Patent Application No. 2021-546864.
Official Communication notified Jun. 22, 2023 for German Patent Application No. 112020000956.4.
Ogiwara, R. et al., "A 0:5-/spl mu/m, 3-V 1T1C, 1-Mbit FRAM with a variable reference bit-line voltage scheme using a fatigue-free reference capacitor", in IEEE Journal of Solid-State Circuits, vol. 35, No. 4, pp. 545-551, Apr. 2000.
Oh, S. et al. "Noble FeRAM technologies with MTP cell structure and BLT ferroelectric capacitors", IEEE International Electron Devices Meeting 2003, Washington, DC, USA, 2003, pp. 34.5.1-34.5.4.
Restriction Requirement notified Aug. 5, 2022 for U.S. Appl. No. 17/359,325.
Restriction Requirement notified Aug. 26, 2022 for U.S. Appl. No. 17/390,796.
Run-Lan et al., "Study on Ferroelectric Behaviors and Ferroelectric Nanodomains of YMno3 Thin Film", Acta Phys. Sin. vol. 63, No. 18 (2014). Supported by the National Natural Science Foundation of China. DOI: 10.7498/aps.187701. 6 pages.
Second Office Action notified Jul. 26, 2022 for Taiwan Patent Application No. 110129115.
Tanaka, S. et al., "FRAM cell design with high immunity to fatigue and imprint for 0.5 /spl mu/m 3 V 1T1C 1 Mbit FRAM", in IEEE Transactions on Electron Devices, vol. 47, No. 4, pp. 781-788, Apr. 2000.
Yamaoka, K. et al., "A 0.9-V 1T1C SBT-based embedded nonvolatile FeRAM with a reference voltage scheme and multilayer shielded bit-line structure", in IEEE Journal of Solid-State Circuits, vol. 40, No. 1, pp. 286-292, Jan. 2005.
1st Office Action notified Dec. 11, 2020 for Taiwan Patent Application No. 109106095.
1st Taiwan Office Action notified Mar. 3, 2022 for Taiwan Patent Application No. 110129115.
Advisory Action notified Jul. 25, 2022 for U.S. Appl. No. 17/339,850.
Advisory Action notified Nov. 16, 2021 for U.S. Appl. No. 16/287,953.
Advisory Action notified Nov. 16, 2021 for U.S. Appl. No. 16/288,004.
Advisory Action notified Nov. 16, 2021 for U.S. Appl. No. 16/288,006.
Chandler, T. "An adaptive reference generation scheme for 1T1C FeRAMs", 2003 Symposium on VLSI Circuits. Digest of Technical Papers (IEEE Cat. No.03CH37408), Kyoto, Japan, 2003, pp. 173-174.
Decision of Rejection notified Feb. 1, 2024 for Taiwan Patent Application No. 111150380.
Examination Report notified Jun. 21, 2023 for German Patent Application No. 112020000955.6.
Final Office Action notified Apr. 25, 2022 for U.S. Appl. No. 16/287,953.
Final Office Action notified Aug. 15, 2022 for U.S. Appl. No. 17/346,083.
Final Office Action notified Feb. 5, 2024 for U.S. Appl. No. 17/654,564.
Final Office Action notified Feb. 5, 2024 for U.S. Appl. No. 17/654,905.
Final Office Action notified Jun. 13, 2022 for U.S. Appl. No. 17/339,850.
Final Office Action notified May 11, 2022 for U.S. Appl. No. 16/288,004.
Final Office Action notified May 11, 2022 for U.S. Appl. No. 16/288,006.
Final Office Action notified Oct. 7, 2021 for U.S. Appl. No. 16/287,953.
Final Office Action notified Oct. 7, 2021 for U.S. Appl. No. 16/288,004.
Final Office Action notified Oct. 7, 2021 for U.S. Appl. No. 16/288,006.
Final Office Action notified Sep. 12, 2022 for U.S. Appl. No. 17/367,217.
First Office Action notified Jul. 5, 2023 for Taiwan Patent Application No. 111150380.
International Preliminary Report on Patentability notified Sep. 10, 2021 for PCT Patent Application No. PCT/US2020/018870.
International Preliminary Report on Patentability notified Sep. 10, 2021 for PCT Patent Application No. PCT/US2020/066963.

(56) References Cited

OTHER PUBLICATIONS

International Search Report & Written Opinion notified Jun. 19, 2020 for U.S. Patent Application No. PCT/US2020/018879.
International Search Report & Written Opinion notified Jun. 24, 2020 for PCT Patent Application No. PCT/US2020/018870.
Jung, D. et al., "Highly manufacturable 1T1C 4 Mb FRAM with novel sensing scheme," International Electron Devices Meeting 1999. Technical Digest (Cat. No.99CH36318), Washington, DC, USA, 1999, pp. 279-282. International Electron Devices Meeting 1999. Technical Digest (Cat. No.99CH36318), Washington, DC, USA, 1999, pp. 279-282.
Non-Final Office Action notified Aug. 5, 2020 for U.S. Appl. No. 16/287,953.
Non-Final Office Action notified Aug. 5, 2020 for U.S. Appl. No. 16/288,004.
Non-Final Office Action notified Aug. 5, 2020 for U.S. Appl. No. 16/288,006.
Non-Final Office Action notified Aug. 16, 2022 for U.S. Appl. No. 17/367,217.
Non-Final Office Action notified Aug. 28, 2023 for U.S. Appl. No. 17/653,811.
Non-Final Office Action notified Aug. 30, 2023 for U.S. Appl. No. 17/654,526.
Non-Final Office Action notified Dec. 20, 2021 for U.S. Appl. No. 16/288,004.
Non-Final Office Action notified Dec. 28, 2023 for U.S. Appl. No. 17/805,665.
Non-Final Office Action notified Dec. 29, 2023 for U.S. Appl. No. 17/805,664.
Non-Final Office Action notified Feb. 2, 2023 for U.S. Appl. No. 17/516,526.
Non-Final Office Action notified Feb. 2, 2023 for U.S. Appl. No. 17/516,587.
Non-Final Office Action notified Feb. 2, 2023 for U.S. Appl. No. 17/516,594.
Non-Final Office Action notified Feb. 16, 2023 for U.S. Appl. No. 17/516,572.
Non-Final Office Action notified Feb. 16, 2023 for U.S. Appl. No. 17/517,298.
Non-Final Office Action notified Feb. 16, 2023 for U.S. Appl. No. 17/517,345.
Non-Final Office Action notified Feb. 16, 2023 for U.S. Appl. No. 17/517,349.
Non-Final Office Action notified Jan. 2, 2024 for U.S. Appl. No. 17/653,811.
Non-Final Office Action notified Jan. 18, 2022 for U.S. Appl. No. 16/287,953.
Non-Final Office Action notified Jan. 19, 2022 for U.S. Appl. No. 16/288,006.
Non-Final Office Action notified Jan. 20, 2023 for U.S. Appl. No. 17/516,577.
Non-Final Office Action notified Jun. 13, 2022 for U.S. Appl. No. 17/346,083.
Non-Final Office Action notified Jun. 15, 2022 for U.S. Appl. No. 17/367,101.
Non-Final Office Action notified Jun. 26, 2020 for U.S. Appl. No. 16/287,876.
Non-Final Office Action notified Mar. 2, 2023 for U.S. Appl. No. 17/517,948.
Non-Final Office Action notified Mar. 2, 2023 for U.S. Appl. No. 17/517,945.
Non-Final Office Action notified Mar. 7, 2022 for U.S. Appl. No. 17/339,850.
Non-Final Office Action notified Mar. 30, 2022 for U.S. Appl. No. 17/346,083.
Non-Final Office Action notified Mar. 31, 2022 for U.S. Appl. No. 17/346,087.
Non-Final Office Action notified May 9, 2023 for U.S. Appl. No. 18/061,270.
Non-Final Office Action notified May 16, 2023 for U.S. Appl. No. 17/532,647.
Non-Final Office Action notified Nov. 21, 2022 for U.S. Appl. No. 7/532,657.
Non-Final Office Action notified Nov. 28, 2022 for U.S. Appl. No. 17/532,552.
Non-Final Office Action notified Oct. 12, 2022 for U.S. Appl. No. 17/530,363.
Non-Final Office Action notified Oct. 12, 2023 for U.S. Appl. No. 17/654,564.
Non-Final Office Action notified Oct. 26, 2022 for U.S. Appl. No. 17/531,577.
Non-Final Office Action notified Oct. 31, 2023 for U.S. Appl. No. 17/654,764.
Non-Final Office Action notified Sep. 1, 2022 for U.S. Appl. No. 17/339,850.
Non-Final Office Action notified Sep. 7, 2022 for U.S. Appl. No. 17/530,360.
Non-Final Office Action notified Sep. 14, 2023 for U.S. Appl. No. 17/654,379.
Notice of Allowance notified Apr. 4, 2023 for U.S. Appl. No. 17/532,552.
Notice of Allowance notified Apr. 13, 2023 for U.S. Appl. No. 17/516,594.
Notice of Allowance notified Apr. 20, 2022 for U.S. Appl. No. 17/359,311.
Notice of Allowance notified Apr. 26, 2023 for U.S. Appl. No. 17/517,345.
Notice of Allowance notified Aug. 8, 2022 for U.S. Appl. No. 17/529,258.
Notice of Allowance notified Aug. 17, 2022 for U.S. Appl. No. 17/346,087.
Notice of Allowance notified Aug. 22, 2022 for U.S. Appl. No. 17/390,791.
Notice of Allowance notified Aug. 25, 2022 for U.S. Appl. No. 17/367,101.
Notice of Allowance notified Aug. 31, 2022 for U.S. Appl. No. 17/359,325.
Notice of Allowance notified Jan. 5, 2024 for Korean Patent Application No. 10-2021-7027261.
Notice of Allowance notified Jan. 10, 2024 for U.S. Appl. No. 17/654,379.
Notice of Allowance notified Jan. 12, 2021 for U.S. Appl. No. 16/287,876.
Notice of Allowance notified Jan. 18, 2024 for U.S. Appl. No. 17/654,383.
Notice of Allowance notified Jan. 20, 2023 for U.S. Appl. No. 17/532,657.
Notice of Allowance notified Jul. 3, 2023 for U.S. Appl. No. 17/532,647.
Notice of Allowance notified Jul. 27, 2020 for U.S. Appl. No. 16/287,927.
Notice of Allowance notified Jun. 9, 2022 for U.S. Appl. No. 16/288,006.
Notice of Allowance notified Jun. 10, 2022 for U.S. Appl. No. 16/288,004.
Notice of Allowance notified Jun. 13, 2022 for U.S. Appl. No. 16/287,953.
Notice of Allowance notified Jun. 15, 2022 for U.S. Appl. No. 17/367,083.
Notice of Allowance notified Jun. 16, 2023 for U.S. Appl. No. 17/532,652.
Notice of Allowance notified Jun. 22, 2023 for U.S. Appl. No. 17/517,945.
Notice of Allowance notified Jun. 22, 2023 for U.S. Appl. No. 17/517,948.
Notice of Allowance notified Jun. 23, 2022 for U.S. Appl. No. 17/367,172.
Notice of Allowance notified Jun. 23, 2022 for U.S. Appl. No. 17/367,210.
Notice of Allowance notified Jun. 26, 2023 for U.S. Appl. No. 18/061,270.

(56) References Cited

OTHER PUBLICATIONS

Notice of Allowance notified Mar. 13, 2023 for U.S. Appl. No. 17/516,577.
Notice of Allowance notified Mar. 15, 2023 for U.S. Appl. No. 17/516,293.
Notice of Allowance notified Mar. 17, 2023 for U.S. Appl. No. 17/532,545.
Notice of Allowance notified Mar. 29, 2023 for U.S. Appl. No. 17/516,526.
Notice of Allowance notified Mar. 29, 2023 for U.S. Appl. No. 17/516,572.
Notice of Allowance notified Mar. 29, 2023 for U.S. Appl. No. 17/516,587.
Notice of Allowance notified May 2, 2023 for U.S. Appl. No. 17/532,556.
Notice of Allowance notified Nov. 17, 2022 for U.S. Appl. No. 17/530,363.
Notice of Allowance notified Nov. 22, 2022 for U.S. Appl. No. 17/530,362.

* cited by examiner

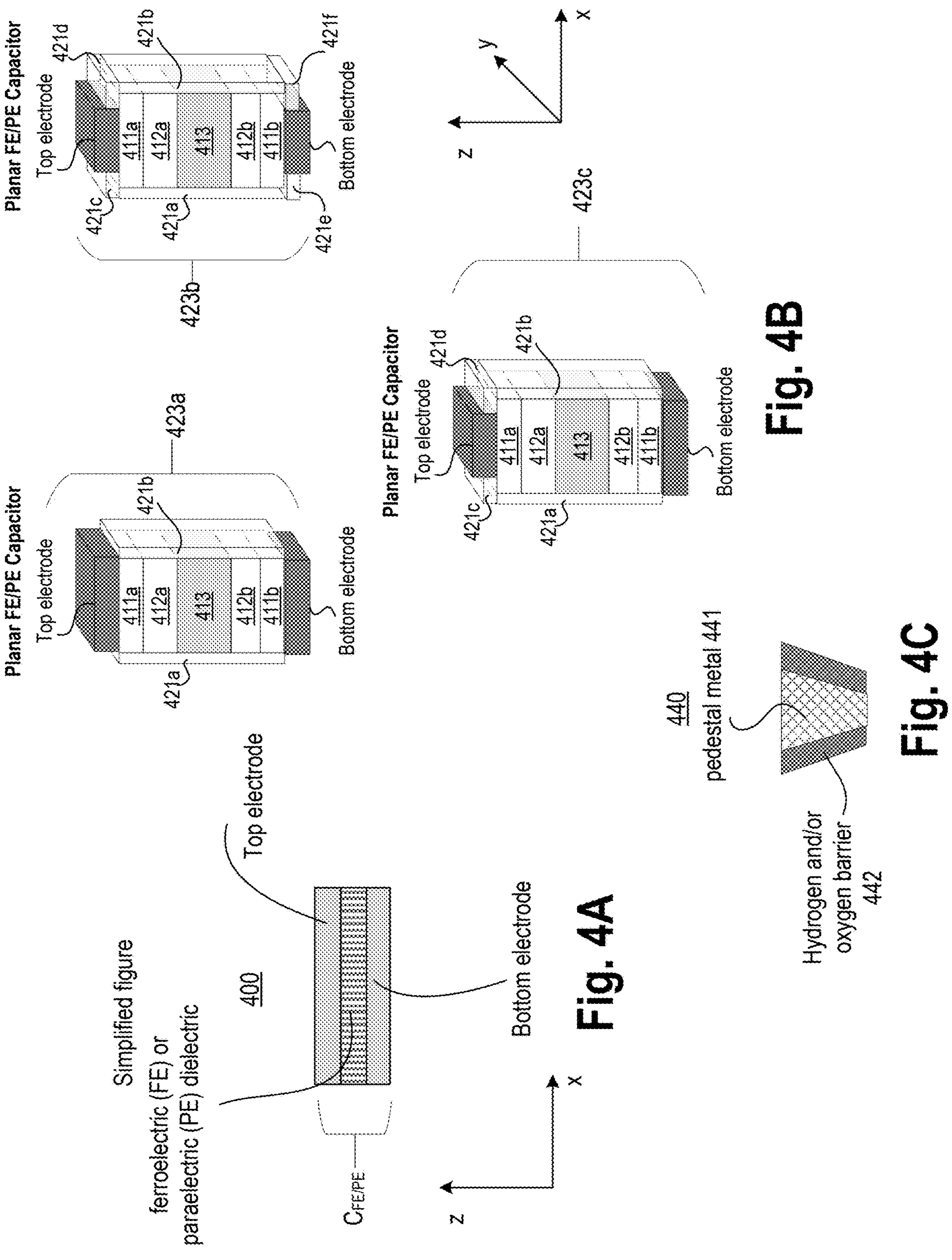

Simplified figure
ferroelectric (FE) or
paraelectric (PE) dielectric
400
Top electrode
$C_{FE/PE}$
Bottom electrode
z
x
Planar FE/PE Capacitor
Top electrode
411a
412a
413
412b
411b
421a
421b
423a
Bottom electrode
Planar FE/PE Capacitor
Top electrode
421d
421c
411a
412a
413
412b
411b
421a
421b
423b
421e
421f
Bottom electrode
Planar FE/PE Capacitor
Top electrode
421d
421c
411a
412a
413
412b
411b
421a
421b
423c
Bottom electrode
z
y
x
440
pedestal metal 441
Hydrogen and/or
oxygen barrier
442

Pillar Ferroelectric Capacitor 500

Conductive Oxide contact 512b

FE/PE Cap Dielectric 513

Conductive Oxide contact 512a

FE/PE Cap Dielectric 513

Conductive Oxide contacts 512a, 512b

Top Electrode 501b

Bottom Electrode 501a

Bottom Electrode 501a

Top Electrode 501b

Oxide Scaffolding 502 or metal tower a b

513

512a

512b

502

501b

501a a b

1500

Reset Phase
Write Phase
t0
t1
t1+tshort
t1+tlong
t2
t2+tshort
t2+tlong
t3
VDD+Vboost
WL1
0V
PLx_Write state 1, 01
Write01
Reset 11
0V
BLx (Write State 1, 01)
Reset 11
Write01
0V
PLx_Write state 0, 00
Write00
Reset 11
0V
BLx (Write State 0, 00)
Reset 11
Write00
0V
PLx_Write state 2, 10
Reset 00
Write10
0V
BLx (Write State 2, 10)
Write10
Reset 00
0V
PLx_Write state 3, 11
Reset 00
0V
BLx (Write State 3, 11)
Write11
Reset 00
0V
PL0.....N
0V
WL0,2,....M
0V

MULTI-LEVEL BIT-CELL WITH NON-LINEAR POLAR MATERIAL

BACKGROUND

The standard memory used in processors is static random-access memory (SRAM) or dynamic random-access memory (DRAM), and their derivatives. These memories are volatile memories. For example, when power to the memories is turned off, the memories lose their stored data. Non-volatile memories are now commonly used in computing platforms to replace magnetic hard disks. Non-volatile memories retain their stored data for prolonged periods (e.g., months, years, or forever) even when power to those memories is turned off. Examples of non-volatile memories are magnetic random-access memory (MRAM), NAND, or NOR flash memories. These memories may not be suitable for low power and compact computing devices because these memories suffer from high write energy, low density, and high-power consumption.

The background description provided here is for the purpose of generally presenting the context of the disclosure. Unless otherwise indicated here, the material described in this section is not prior art to the claims in this application and are not admitted as prior art by inclusion in this section.

BRIEF DESCRIPTION OF THE DRAWINGS

The examples of the disclosure will be understood more fully from the detailed description given below and from the accompanying drawings of various examples of the disclosure, which, however, should not be taken to limit the disclosure to the specific examples, but are for explanation and understanding only.

FIG. 4A is a schematic of a planar ferroelectric or paraelectric capacitor structure configured as a multi-level capacitor (MLC), in accordance with at least one example.

FIG. 4B is a schematic of three planar ferroelectric or paraelectric capacitor structures, respectively, in accordance with at least one example.

FIG. 4C is a schematic of a pedestal that connects to the top and/or bottom electrodes of the planar ferroelectric or paraelectric capacitor, in accordance with at least one example.

DETAILED DESCRIPTION

Figure 1:
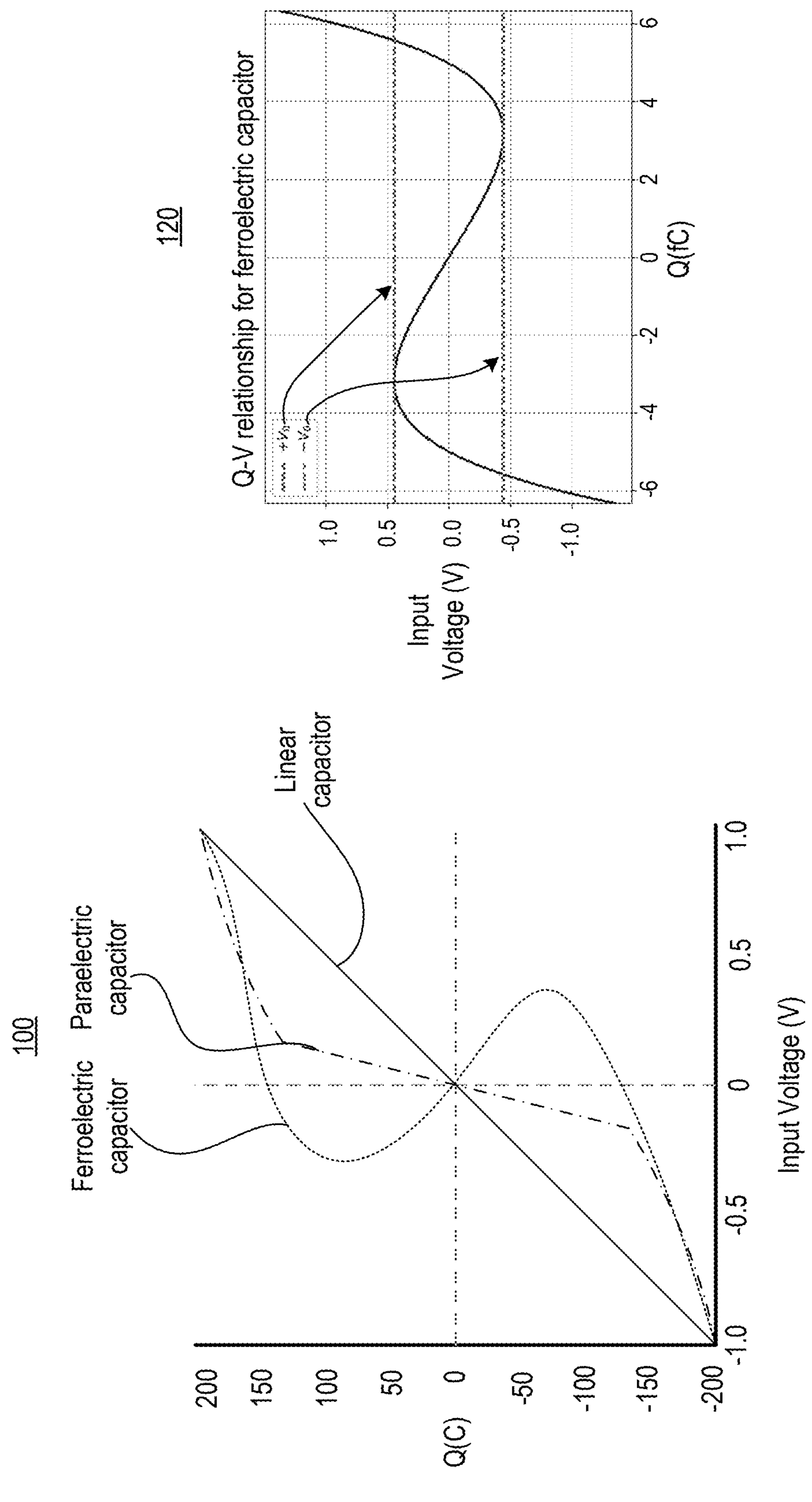
FIG. 1 illustrates a set of plots that show behavior of a ferroelectric capacitor, a paraelectric capacitor, and a linear capacitor.

At least one example describes a multi-level capacitor (MLC) that is configured to store multiple stable states (e.g., four or more states). In at least one example, the MLC comprises a film of non-linear polar material which exhibits dual polarization loops, where the dual polarization loops include a first polarization loop and a second polarization loop. In at least one example, the first polarization loop provides two remnant polarization states, and the second polarization loop provides the additional two remnant polarization states. In at least one example, the second polarization loop is a smaller loop and resides inside the first polarization loop. These polarization states are stable states and referred to as partially switched polarization states. These polarization states can be achieved by applying either different voltage levels to the MLC (e.g., amplitude modulation), or different time pulse widths to the MLC at the same or constant voltage level (e.g., pulse width modulation).

An MLC can be used with a transistor to form a bit-cell, herein referred to as a one-transistor one-capacitor (1T1C) bit-cell. In at least one example, the MLC may have a first terminal coupled to a node (e.g., a storage node) and a second terminal coupled to a plate-line. In at least one example, the MLC can be a planar capacitor or a non-planar capacitor (also known as pillar capacitor). In at least one example, the memory comprises a transistor (e.g., an access transistor) coupled to the node and a bit-line (BL), wherein the transistor is controllable by a word-line (WL), and wherein the plate-line (PL) is parallel to the bit-line. A memory bit-cell is coupled to one or more plate-lines, a word-line, and a bit-line. The routing of the plate-line(s) relative to the word-line or the bit-line impacts the performance of the bit-cell. At least one example describes a read and write scheme (herein referred to as a pulsing scheme) for memory arrays where plate-line(s) is/are parallel to a bit-line. At least one example describes a pulsing scheme for memory arrays where plate-line(s) is/are parallel to a word-line.

In at least one example, the MLC comprises two different films of non-linear polar material to create two or more than two logic levels in one 1T1C bit-cell. In at least one example, the MLC comprises two parallel films of non-linear polar material that are coupled to the first and second terminals of the MLC. In at least one example, the two parallel films of non-linear polar material have different thicknesses. In at least one example, the two parallel films have the same thickness but different doping. In at least one example, one or more circuit elements (e.g., a resistive device) is coupled in series with one of the non-linear polar material films, and the combination of the series coupled devices and the other film of non-linear polar material are coupled to the first and second terminals of the MLC. In at least one example, the two parallel films of non-linear polar material generate the first and second polarization loops.

In at least one example, the memory comprises a refresh circuitry (e.g., wear-leveling logic) to refresh charge on the MLC periodically or at a predetermined time. The refresh circuit can utilize one or more of the endurance mechanisms described herein. When the plate-line is parallel to the bit-line, a specific read and write scheme may be used to reduce the disturb voltage for unselected bit-cells, in accordance with at least one example. In at least one example, a transistor switch is coupled to the plate-line and the MLC (e.g., a transistor is coupled between the plate-line and the MLC) to remove the effect of PL toggles on an unselected bit-line.

In at least one example, an opposite state is written to a memory bit-cell with MLC prior to writing the desired or target state. For instance, if state3 11 is the target state then state0 00 or state1 01 is written prior to writing state3 11. This allows for removing any history accumulated when the same states are consistently written to the bit-cell. In at least one example, for read operation, the bit-line can be pre-charged to 0V or to a nominal supply voltage before the bit-line is floated to determine the voltage level stored in the MLC. The stored voltage is then sensed by a sense amplifier when the sense amplifier is enabled. In at least one example, the MLC is written back the states that are read from the MLC to mitigate any read disturbance.

The MLC of various examples allow for increasing storage density (e.g., by 2×) for 1T1C bit-cell configurations. The pulsing scheme for reading and writing to the MLC can be applied to other types of storage devices such as resistive memories, phase change memories, magnetic tunneling junctions, etc. While various examples are illustrated with reference to four stable states, MLCs can be configured to provide more than four stable states and those MLCs are within the scope of various examples. Other technical effects will be evident from the various examples and figures.

In the following description, numerous details are discussed to provide a more thorough explanation of examples of the present disclosure. It will be apparent, however, to one skilled in the art, that examples of the present disclosure may be practiced without these specific details. In other instances, well-known structures and devices are shown in block diagram form, rather than in detail, to avoid obscuring examples of the present disclosure.

Note that in the corresponding drawings of the examples, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary examples to facilitate easier understanding of a circuit or a logical unit. Any represented signal, as dictated by design needs or preferences, may actually comprise one or more signals that may travel in either direction, and may be implemented with any suitable type of signal scheme.

It is pointed out that those elements of the figures having the same reference numbers (or names) as the elements of any other figure can operate or function in any manner like that described but are not limited to such.

FIG. 1 illustrates a set of plots showing behavior of a ferroelectric capacitor, a ferroelectric capacitor, and a linear capacitor. Plot 100 compares the transfer function for a linear capacitor, a paraelectric (PE) capacitor (a nonlinear capacitor) and a ferroelectric (FE) capacitor (a nonlinear capacitor). Here, the x-axis is input voltage or voltage across the capacitor, while the y-axis is the charge on the capacitor. The ferroelectric material can be any suitable low voltage FE material that allows the FE material to switch its state by a low voltage (e.g., 100 mV). Threshold in the FE material has a highly nonlinear transfer function in the polarization versus voltage response. The threshold is related to: a) nonlinearity of switching transfer function; and b) the squareness of the FE switching. The nonlinearity of switching transfer function is the width of the derivative of the polarization versus voltage plot. The squareness is defined by the ratio of the remnant polarization to the saturation polarization, perfect squareness will show a value of 1. The squareness of the FE switching can be suitably manipulated with chemical substitution. For example, in $PbTiO_3$ a P-E (polarization-electric field) square loop can be modified by La or Nb substitution to create an S-shaped loop. The shape can be systematically tuned to ultimately yield a nonlinear dielectric. The squareness of the FE switching can also be changed by the granularity of an FE layer. A perfectly epitaxial, single crystalline FE layer will show higher squareness (e.g., ratio is closer to 1) compared to a polycrystalline FE. This perfect epitaxial can be accomplished using lattice matched bottom and top electrodes. In one example, $BiFeO_3$ (BFO) can be epitaxially synthesized using a lattice matched SrRuO3 bottom electrode yielding P-E loops that are square. Progressive doping with La will reduce the squareness.

Plot 120 shows the charge and voltage relationship for a ferroelectric capacitor. A capacitor with ferroelectric material (also referred to as an FEC) is a nonlinear capacitor with its potential $V_F(Q_F)$ as a cubic function of its charge. Plot 120 illustrates characteristics of an FEC. Plot 120 is a charge-voltage (Q-V) plot for a block of $Pb(Zr_{0.5}Ti_{0.5})O_3$ of area $(100\ nm)^2$ and thickness 30 nm (nanometer). Plot 120 shows local extrema at $+/-V_o$ indicated by the dashed lines. Here, the term $V_c$ is the coercive voltage. In applying a potential V across the FEC, its charge can be unambiguously determined only for $|V|>V_o$. Otherwise, the charge of the FEC is subject to hysteresis effects. Ferroelectric material is one example of a non-linear polar material.

In at least one example, the non-linear polar material includes one of: a ferroelectric material, a paraelectric material, a relaxor ferroelectric, or a non-linear dielectric. In at least one example, the paraelectric material is the same as ferroelectric material but with chemical doping of the active ferroelectric ion by an ion with no polar distortion. In some cases, the non-polar ions are non-s orbital ions formed with p, d, or f external orbitals. In at least one example, non-linear dielectric materials are the same as paraelectric materials, relaxors, and dipolar glasses.

In at least one embodiment, non-linear polar material can be doped, e.g., by one or more elements from lanthanide series of periodic table, or one or more elements of 3d, 4d, 5d, 6d, 4f, or 5*f* series of periodic table. In at least one embodiment, perovskites can be suitably doped to achieve a spontaneous distortion in a range of 0.3% to 2%. In at least one embodiment, in chemically substituted lead titanate such as Zr in Ti site or La and Nb in Ti site, concentration of these substitutes is such that it achieves spontaneous distortion in range of 0.3% to 2%.

In at least one embodiment, non-linear polar material has a form $ABB'O_3$, and wherein "A" includes one of: Ba, K, Bi, Y, La, Sc, Ce, Pr, Nd, Pm, Sm, Eu, Gd, Tb, Dy, Ho, Er, Yb, Lu, Li, Bi, K, or Na, wherein "B" includes one of Mn, Fe, Ta, or Nb, and wherein "B'" includes one of: Sc, Ti, V, Cr, Mn, Fe, Co, Ni, Cu, or Zn.

In at least one embodiment, non-linear polar material has a form $AA'BO_3$, and wherein "A" includes one of: Ba, K, Bi, Y, La, Sc, Ce, Pr, Nd, Pm, Sm, Eu, Gd, Tb, Dy, Ho, Er, Yb, Lu, Li, Bi, K, or Na, wherein "B" includes one of Mn, Fe, Ta, or Nb, and wherein "A'" includes one of Y, La, Sc, Ce, Pr, Nd, Pm, Sm, Eu, Gd, Tb, Dy, Ho, Er, Yb, Lu, wherein A' comprises a valency of site A, but different ferroelectric polarizability from A.

In at least one embodiment, non-linear polar material has a form $ABO_3$, and wherein "A" includes one of: Ba, K, Bi, Y, La, Sc, Ce, Pr, Nd, Pm, Sm, Eu, Gd, Tb, Dy, Ho, Er, Yb, Lu, Li, Bi, K, or Na, wherein "B" includes one of Mn, Fe, Ta, or Nb.

In at least one example, the non-linear polar material includes a lead-based perovskite material which includes lead zirconium titanate (PZT) or PZT with a first doping material, wherein the first doping material is one of La or Nb. In at least one example, the non-linear polar material includes non-Pb perovskites that can also be doped, e.g., by La or lanthanides. Non-Pb perovskite material can include one or more of: La, Sr, Co, Cr, K, Nb, Na, Sr, Ru, Y, Fe, Ba, Hf, Zr, Cu, Ta, Bi, Ca, Ti, or Ni. In at least one example, non-Pb perovskite material includes one of: $BaTiO_3$, $KNbO_3$, or $NaTaO_3$.

In at least one embodiment, non-linear polar material includes bismuth ferrite (BFO) with a first doping material, wherein the first doping material is one of lanthanum, elements from lanthanide series of a periodic table, or elements of 3d, 4d, 5d, 6d, 4f, or 5*f* series of periodic table. In at least one embodiment, BFO is doped with Mn or Sc, wherein Mn or Sc achieve a spontaneous distortion in BFO in a range of 0.3% to 2%.

In at least one embodiment, non-linear polar material includes a relaxor ferroelectric material. In at least one embodiment, the relaxor ferroelectric material is a $BaTiO_3$ (BTO) based relaxor ferroelectric which includes one of:

$BaTiO_3$—$Bi(Zn_{1/2}Ti_{1/2})O_3$ (BTO-BZT), $BaTiO_3$—$BiScO_3$ (BTO-BS): $BiScO_3$, $Ba_{(1-x)}Sr_xTiO_3$ (BST), $BaTiO_3$—$Pb(Mg_{1/3}Nb_{2/3})O_3$ (BTO-PMN), $BaTi_{(1-x)}Zr_xO_3$ (BTZ), $BaTiO_3$—$Pb(Zn_{1/3}Nb_{2/3})O_3$ (BTO-PZN), or $BaTiO_3$—$Pb(Sc_{1/2}Nb_{1/2})O_3$ (BTO-PSN).

In at least one example, the relaxor ferroelectric material is a PZT based relaxor which includes one of: PZT-$Pb(Mg_{1/3}Nb_{2/3})O_3$ (PZT-PMN), PZT-$Pb(Ni_{1/3}Nb_{2/3})O_3$ (PZT-PNN), PZT-$Pb(Zn_{1/3}Nb_{2/3})O_3$ (PZT-PZN), PZT-$Pb(Sc_{1/2}Nb_{1/2})O_3$ (PZT-PSN), PZT-$Pb(Fe_{1/2}Nb_{1/2})O_3$ (PZT-PFN), or PZT-$Pb_xLa_{1-x}(Zr_yTi_{1-y})O_3$ (PZT-PLZT), where $0 \le x \le 1$ and where $0 \le y \le 1$, or PZT-$PbTi_{(1-x)}Mn_{(x)}O_3$ (PZT-PTM), where $0 \le x \le 1$.

In at least one example, the paraelectric material is a $SrBi_2Ta_2O_9$ (SBT) based paraelectric which includes one of: SBT-$SrBi_2[Nb_{(1-x)}Ta_{(x)}]_2O_9$ (SBT-SBNT), where $0 \le x \le 1$ SBT doped with transition metals such as Mn, Fe, Co; SBT doped with rare earth ions such as La, Ce, or Nd; or SBT doped with alkaline earth metals with Ba or Ca.

In at least one embodiment, the relaxor ferroelectric material is based on lead magnesium niobate (PMN), lead magnesium niobate-lead titanate (PMN-PT), barium titanium-bismuth zinc niobium tantalum (BT-BZNT), or barium titanium-barium strontium titanium (BT-BST).

In at least one embodiment, non-linear polar material includes a hafnium oxide of a form $Hf_{(1-x)}E_{(x)}O_z$, where 'x' denotes a fraction, and E includes one of Al, Ca, Ce, Dy, Er, Gd, Ge, La, Sc, Si, Sr, Sn, Zr, or Y.

In at least one embodiment, non-linear polar material includes $Al_{(1-x)}Sc_{(x)}N$, $Ga_{(1-x)}Sc_{(x)}N$, $Al_{(1-x)}Y_{(x)}N$ where 'x' and 'y' are respective compositional fractions or $Al_{(a)}Mg_{(b)}Nb_{(c)}N$, where a, b, and c are respective compositional fractions.

In at least one embodiment, non-linear polar material includes one of: $LiNbO_3$, $LiTaO_3$, $LiTaO_2F_2$, or $Sr_{(x)}Ba_{(1-x)}Nb_2O_6$ where $0.32 \le x \le 0.8$, or $KSr_2Nb_5O_{15}$.

In at least one example, non-linear polar material includes an anti-ferroelectric material. In at least one example, antiferroelectric material may include one of: an antiferroelectric material comprising one of: $HfSiO_2$ doped with >30% Si or >30% Zr; $HfZrO_2$ doped with >30% Si or >30% Zr; $ZrO_2$ or $NaNbO_3$; $NaNbO_3$, $PbZrO_3$, or $PbZrO_3$ doped with >5% K; a first solid solution including one of: $PbTiO_3$, $SrTiO_3$, $PbHfO_3$, $PbHfO_3$, $Pb(Lu_{0.5}Nb_{0.5})O_3$, $Pb(Lu_{0.5}Nb_{0.5})O_3$, $Pb(Yb_{0.5}Nb_{0.5})O_3$, $AgNbO_3$ or $NaNbO_3$; or a second solid solution including $PbTiO_3$ and one of: $SrTiO_3$, $PbHfO_3$, $PbHfO_3$, $Pb(Lu_{0.5}Nb_{0.5})O_3$, $Pb(Lu_{0.5}Nb_{0.5})O_3$, $Pb(Yb_{0.5}Nb_{0.5})O_3$, $AgNbO_3$ or $NaNbO_3$.

In at least one example, non-linear polar material includes one of: Pb(Zr, Sn, Ti)$NbO_3$ (PNZST), $(NH_4)H_2PO_4$(ADP), $La_{0.2}Sr_{0.7}Fe_{12}O_{19}$, $AgBiP_2Se_6$, $CuInP_2S_6$ $CuBiP_2Se_6$ $[Na_{(1-x/2)}La_{(x/2)}][Nb_{(1-y)}Ti_{(y)}]O_3$, $(Ag_{0.90}Ca_{0.05})(Nb_{0.95}Ta_{0.05})O_3$, $(1-z)NaNbO_3$-$zBi(Ni_{1/2}Sn_{1/2})O_3$, $(1-z)Bi_{0.5}Na_{0.5}TiO_3$-$zAg_{0.91}Sm_{0.03}NbO_3$, $0.90NaNbO_3$-$0.10BiFeO_3$, $(1-z)NaNbO_3$-$zBi(Zn_{2/3}Nb_{1/3})O_3$, $(1-z)NaNbO_3$-$zBi(Zn_{0.5}Ti_{0.5})O_3$, $Ag_{0.76}La_{0.08}NbO_3$, $Ag_{0.97}Nd_{0.01}Ta_{0.20}Nb_{0.8}O_3$, $Lu_2O_3$ modified $AgNbO_3$, or (La)Pb(Zr,Ti)$O_3$ (Zr-rich), where x is less than or equal to 1, y is less than or equal to 1, and z is less than or equal to 1.

In at least one example, non-linear polar material includes $CsGeX_3$, with bandgap of 1.6 to 3.3 eV, wherein X is a halide, $CuInP_2S_6$, $WTe_2$, $LiOsO_3$, $Ca_3Ru_2O_7$, $In_2Se_3$, SnTe, SnS, SnSe, $MoTe_2$, $Bi_{(1-x)}La_xTi_3O_{12}$, $SrBi_2Ta_2O_9$, $Bi_4Ni_3Ti_{12}$, $Bi_4Na_{0.5}TiO_3$, $CH_3NH_3PbI_3$, $CH_3NH_3PbI_{(3-x)}Cl_x$, $PbZr_{0.2}Ti_{0.8}O_3$, wherein x is a compositional fraction, $(CH_3(CH_2)_3NH_3)_2(CH_3NH_3)_{n-1}Pb_nI_{3n+1}$, wherein n is a positive integer, $(Sr_{0.96}La_{0.04})(Zr_{0.90}Ti_{0.10})O_3$, $La_{0.7}Sr_{0.3}MnRu_{0.05}O_3$, $Ca_{0.99}Ce_{0.11}MnO_3$, $H_xSrRuO_3$, $SrRuO_3$, or EuO.

In at least one example, non-linear polar material includes a paraelectric material. In at least one example, paraelectric material is a $BaTiO_3$ (BTO) based paraelectric which includes one of: $BaTiO_3$—$Bi(Zn_{1/2}Ti_{1/2})O_3$ (BTO-BZT), $BaTiO_3$—$BiScO_3$ (BTO-BS): $BiScO_3$, $Ba_{1-x}Sr_xTiO_3$ (BST), $BaTiO_3$—$Pb(Mg_{1/3}Nb_{2/3})O_3$ (BTO-PMN), $BaTi_{1-x}Zr_xO_3$ (BTZ), $BaTiO_3$—$Pb(Zn_{1/3}Nb_{2/3})O_3$ (BTO-PZN), or $BaTiO_3$—$Pb(Sc_{1/2}Nb_{1/2})O_3$ (BTO-PSN).

In at least one example, paraelectric material is a PZT based paraelectric which includes one of: PZT-$Pb(Mg_{1/3}Nb_{2/3})O_3$ (PZT-PMN), PZT-$Pb(Ni_{1/3}Nb_{2/3})O_3$ (PZT-PNN), PZT-$Pb(Zn_{1/3}Nb_{2/3})O_3$ (PZT-PZN), PZT-$Pb(Sc_{1/2}Nb_{1/2})O_3$ (PZT-PSN), PZT-$Pb(Fe_{1/2}Nb_{1/2})O_3$ (PZT-PFN), or PZT-$Pb_xLa_{1-x}(Zr_yTi_{1-y})O_3$ (PZT-PLZT), where $0 \le x \le 1$ and where $0 \le y \le 1$, or PZT-$PbTi_{(1-x)}Mn_{(x)}O_3$ (PZT-PTM), where $0 \le x \le 1$.

In at least one example, the ferroelectric material comprises a perovskite of the type $ABO_3$, where 'A' and 'B' are two cations of different sizes, and 'O' is oxygen which is an anion that bonds to both the cations. Generally, the size of atoms of A is larger than the size of B atoms. In at least one example, the perovskite can be doped (e.g., by La or lanthanides). In at least one example, the FE material is perovskite, which includes one or more of: La, Sr, Co, Sr, Ru, Y, Ba, Cu, Bi, Ca, and Ni. For example, metallic perovskites such as: $(La,Sr)CoO_3$, $SrRuO_3$, $(La,Sr)MnO_3$, $YBa_2Cu_3O_7$, $Bi_2Sr_2CaCu_2O_8$, $LaNiO_3$, $BaTiO_3$, $KNbO_3$, $NaTaO_3$, etc., may be used for the FE material. Perovskites can be suitably doped to achieve a spontaneous distortion in a range of 0.3% to 2%. For example, for chemically substituted lead titanate such as Zr in Ti site; La and Nb in Ti site, the concentration of these substitutes is such that it achieves the spontaneous distortion in the range of 0.3% to 2%. For chemically substituted $BiFeO_3$, $BrCrO_3$, $BuCoO_3$ class of materials, La or rare earth substitution into the Bi site can tune the spontaneous distortion. In at least one example, the FE material is contacted with a conductive metal oxide that includes one of the conducting perovskite metallic oxides exemplified by: La—Sr—$CoO_3$, $SrRuO_3$, La—Sr—$MnO_3$, $YBa_2Cu_3O_7$, $Bi_2Sr_2CaCu_2O_8$, and $LaNiO_3$.

In at least one example, the ferroelectric material comprises a stack of layers including low voltage ferroelectric material between conductive oxides. In at least one example, when FE material is a perovskite, the conductive oxides are of the type $AA'BB'O_3$. A' is a dopant for atomic site A, it can be an element from the lanthanides series. B' is a dopant for atomic site B, it can be an element from the transition metal elements, especially Sc, Ti, V, Cr, Mn, Fe, Co, Ni, Cu, Zn. A' may have the same valency of site A, with a different ferroelectric polarizability. In at least one example, when metallic perovskite is used for the FE material, conductive oxides can include one or more of: $IrO_2$, $RuO_2$, $PdO_2$, $OsO_2$, or $ReO_3$. In at least one example, the perovskite is doped with La or lanthanides. In at least one example, thin layer (e.g., approximately 10 nm) perovskite template conductors such as $SrRuO_3$ coated on top of $IrO_2$, $RuO_2$, $PdO_2$, $PtO_2$, which have a non-perovskite structure but higher conductivity to provide a seed or template for the growth of pure perovskite ferroelectric at low temperatures, can be used as conductive oxides. In at least one example, the conductive oxides include one or more of: Ir, In, Fe, Ru, Pd, Os, or Re.

In at least one example, ferroelectric materials are doped with s-orbital material (e.g., materials for first period, second period, and ionic third and fourth periods). In at least one example, f-orbital materials (e.g., lanthanides) are doped to ferroelectric material to make paraelectric material. Examples of room temperature paraelectric materials include: $SrTiO_3$, $Ba_{(x)}Sr_{(y)}TiO_3$ (e.g., where x is −0.05 or 0.5, and y is 0.95), $HfZrO_2$, Hf—Si—O, La-substituted $PbTiO_3$, PMN-PT based relaxor ferroelectrics.

In at least one example, the ferroelectric material comprises one or more of: hafnium (Hf), zirconium (Zr), aluminum (Al), silicon (Si), their oxides, or their alloyed oxides. In at least one embodiment, non-linear polar material includes $Al_{(1-x)}Sc_{(x)}N$, $Ga_{(1-x)}Sc_{(x)}N$, $Al_{(1-x)}Y_{(x)}N$ where 'x' and 'y' are respective compositional fractions or $Al_{(a)}Mg_{(b)}Nb_{(c)}N$, where a, b, and c are respective compositional fractions.

In at least one example, FE material includes one or more of: bismuth ferrite (BFO), lead zirconate titanate (PZT), BFO with a first doping material, or PZT with a second doping material, wherein the doping material is one of Nb or La; and relaxor ferroelectrics such as PMN-PT.

In at least one example, the ferroelectric material includes bismuth ferrite (BFO) with a first doping material where in the first doping material is one of lanthanum, or any element from the lanthanide series of the periodic table. In at least one example, ferroelectric material includes lead zirconium titanate (PZT), or PZT with a second doping material, wherein the second doping material is one of La or Nb. In at least one example, ferroelectric material includes a relaxor ferroelectric including one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST).

In at least one example, the FE material includes niobate type compounds $LiNbO_3$, $LiTaO_3$, lithium iron tantalum oxy fluoride, barium strontium niobate, sodium barium niobate, or potassium strontium niobate.

In at least one example, the ferroelectric material comprises hexagonal ferroelectrics of the type $h\text{-}RMnO_3$, where R is a rare earth element which includes one of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered $MnO_5$ polyhedra, accompanied by displacements of the Y ions, which lead to a net electric polarization. In at least one example, hexagonal FE includes one of: $YMnO_3$ or $LuFeO_3$. In at least one example, when the FE material comprises hexagonal ferroelectrics, the conductive oxides are of $A_2O_3$ (e.g., $In_2O_3$, $Fe_2O_3$) and $ABO_3$ type, where A is a rare earth element and B is Mn.

In at least one example, non-linear polar material comprises multiple layers, for example, alternating layers of $[Bi_2O_2]2+$, and pseudo-perovskite blocks ($Bi_4Ti_3O_{12}$ and related Aurivillius phases), with perovskite layers that are 'n' octahedral layers. In at least one example, layered perovskite includes materials comprising a Dion-Jacobson phase, for example a tri-layered material where outer layers comprise an $ABO_3$ described above, and an intervening layer comprising an alkali earth metal, where the composite layer has a formula $M^+A_{(n-1)}B_2O_7$, where n is the number of $ABO_3$ layers. In at least one example, the FE material comprises organic material. For example, polyvinylidene fluoride or polyvinylidene difluoride (PVDF).

In at least one example, examples of multiple layers include improper ferroelectric material. An improper ferroelectric is a ferroelectric where primary order parameter is an order mechanism such as strain or buckling of atomic order.

In at least one example, improper ferroelectric material includes an epitaxial stack of two or more materials. The representation of $[A/B]_n$ is a superlattice which refers to a material 'A' stacked adjacent to a material 'B', where the stack is repeated 'n' times. In at least one example, epitaxial stack of two or more materials includes one of: $[BaTiO_3/SrTiO_3]_n$ superlattice, $[LaAl_2O_3/SrTiO_3]_n$ superlattice, $[SrTiO_3/PbTiO_3/SrTiO_3]_n$ superlattice, $[SrIrO_3/SrRuO_3/SrTiO_3]_n$ superlattice, $[(PbTiO_3)_n/(SrTiO_3)]_n$ superlattice, $[SrIrO_3/SrRuO_3]_n$ super lattice, $[SrRuO_3/La_{0.7}Sr_{0.3}MnO_3]_n$ superlattice, $[La_{0.7}Sr_{0.3}MnO_3/SrIrO_3]_n$ superlattice, $Pt/TmFe_5O_{12}]_n$ superlattice, $[BaTiO_3/SrRuO_3/SrTiO_3]_n$ (001) superlattice, or superlattice of ferroelectric and paraelectric materials for example, $[PbTiO_3/SnTiO_3]$., where 'n' represents a number of bilayers, and where 'n' is between 1 and 100.

While some examples are illustrated with reference to ferroelectric material, the ferroelectric material can be replaced with anti-ferroelectric (AFE) material. Examples of anti-ferroelectric material include $AgNbO_3$-based ceramics, $AgNb_{0.85}Ta_{0.15}O_3$, $0.75Na_{0.5}Bi_{0.5}TiO_3\text{-}0.25SrTiO_3$, $NaNbO_3$, etc.

Figure 2:
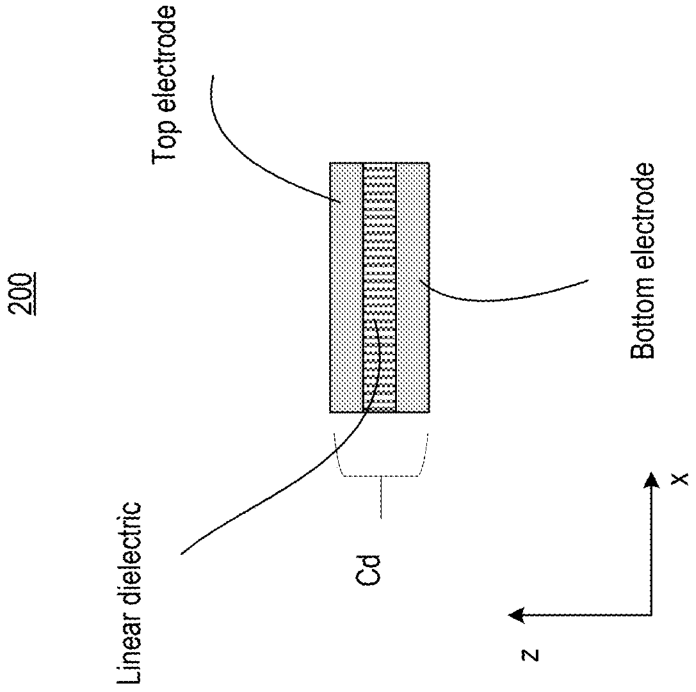
FIG. 2 is a schematic of a planar linear capacitor structure, in accordance with at least one example.

FIG. 2 is a schematic of a planar linear capacitor structure 200, in accordance with at least one example. In at least one example, capacitors for the multi-input capacitive structures are linear capacitors. These capacitors can take any planar form. One such form is illustrated in FIG. 2. Here, planar capacitor structure 200 is a metal-insulator-metal (MIM) capacitor comprising a bottom electrode, a top electrode, and a linear dielectric between the top electrode and the bottom electrode as shown. In at least one example, conductive oxide layer(s) are formed between the bottom electrode and the linear dielectric. In at least one example, conductive oxide layer(s) are formed between the top electrode and the linear dielectric. Examples of conductive oxides include: $IrO_2$, $RuO_2$, $PdO_2$, $OsO_2$, or $ReO_3$. In some examples, conductive oxides are of the form $A_2O_3$ (e.g., $In_2O_3$, $Fe_2O_3$) and $ABO_3$ type, where 'A' is a rare earth element and B is Mn.

In at least one example, the dielectric layer includes one or more of: $SiO_2$, $Al_2O_3$, $Li_2O$, $HfSiO_4$, $Sc_2O_3$, SrO, $HfO_2$, $ZrO_2$, $Y_2O_3$, $Ta_2O_5$, BaO, $WO_3$, $MoO_3$, or $TiO_2$. Any suitable conductive material may be used for the top electrode and the bottom electrode. For example, the material or the electrode may include one or more of: Cu, Al, Ag, Au, W, or Co. In at least one example, the thickness along the z-axis of the top electrode and bottom electrode is in a range of 1 nm to 30 nm. In at least one example, the thickness along the z-axis of the dielectric is in a range of 1 nm to 30 nm. In at least one example, the thickness along the z-axis of the conductive oxide is in a range of 1 nm to 30 nm.

Figure 3A:
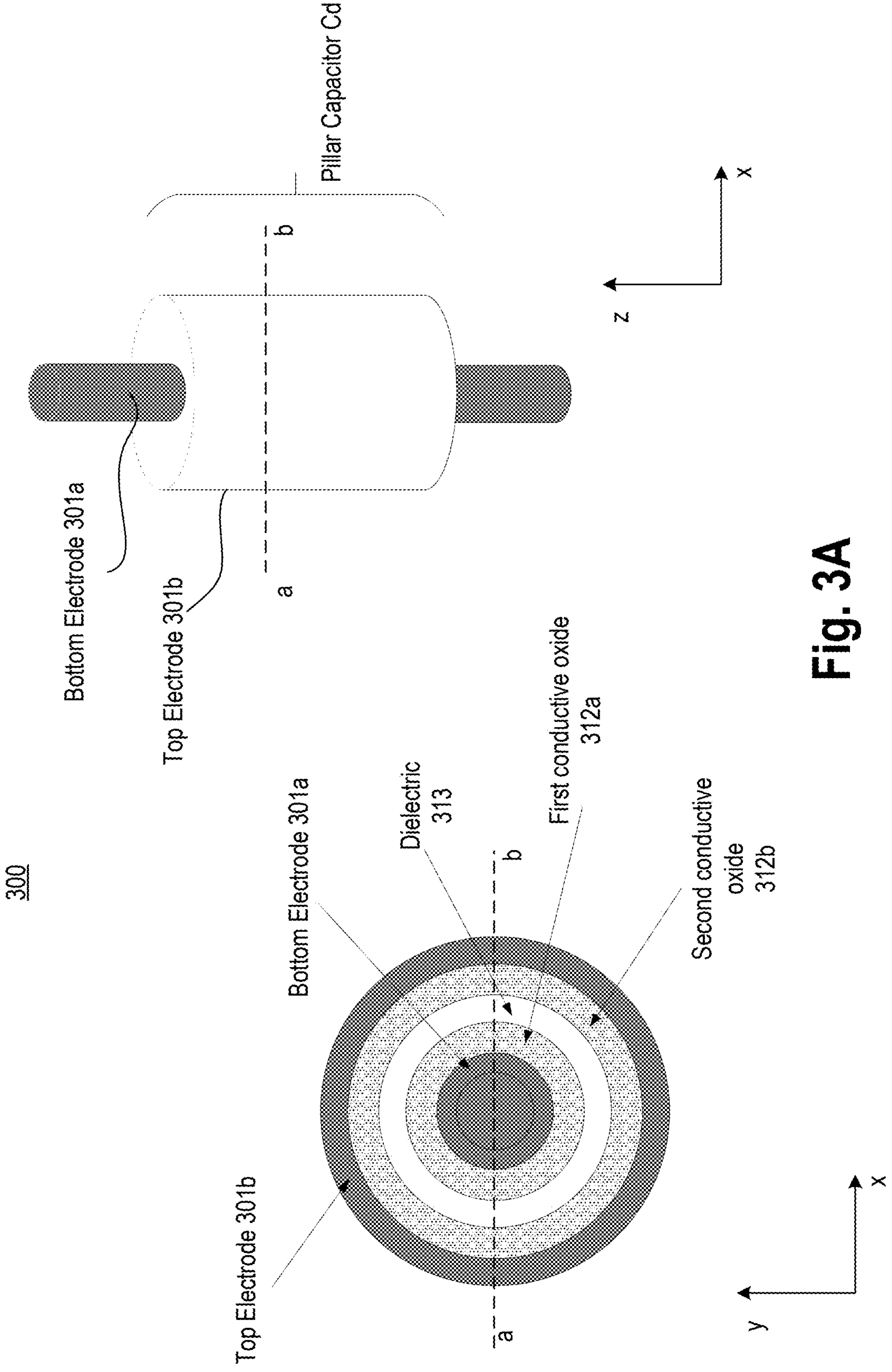
FIG. 3A is a schematic of a non-planar linear capacitor structure, in accordance with at least one example.

FIG. 3A is a schematic of a non-planar capacitor structure 300, in accordance with at least one example. In at least one example, non-planar capacitor structure 300 is rectangular in shape. Taking the cylindrical shaped case for example, in at least one example, the layers of non-planar capacitor structure 300 from the center going outwards include bottom electrode 301*a*, first conductive oxide 312*a*, linear dielectric material 313, second conductive oxide 312*b*, and top electrode 301*b*. A cross-sectional view along the "ab" dashed line is illustrated in the middle of FIG. 3A. In at least one example, conducting oxides are removed and the linear dielectric is directly connected to top electrode 301*b* and bottom electrodes 301*a*. In at least one example, linear dielectric material 313 can include any suitable dielectric, where the thickness of dielectric film is a range of 1 nm to 20 nm. In at least one example, linear dielectric material 313 comprises a higher-K dielectric material. In at least one example, linear dielectrics include one of: $SIO_2$, $Al_20_3$, $Li_2O$, $HfSiO_4$, $Sc_2O_3$, SrO, $HfO_2$, $ZrO_2$, $Y_2O_3$, $Ta_2O_5$, BaO, $WO_3$, $MoO_3$, or $TiO_2$. The high-k dielectric material may include elements such as: zinc, niobium, scandium, lean yttrium, hafnium, silicon, strontium, oxygen, barium, titanium, zirconium, tantalum, aluminum, and lanthanum. Examples of high-k materials that may be used in the gate dielectric layer include one or more of: lead zinc niobate, hafnium oxide, lead scandium tantalum oxide, hafnium silicon oxide, yttrium oxide, aluminum oxide, lanthanum oxide, barium strontium titanium oxide, lanthanum aluminum oxide, titanium oxide, zirconium oxide, tantalum oxide, and zirconium silicon oxide.

In at least one example, first conductive oxide 312*a* is conformally deposited over bottom electrode 301*a*. In at least one example, dielectric material 313 is conformally deposited over first conductive oxide 312*a*. In at least one example, second conductive oxide 312*b* is conformally deposited over dielectric material 313. In at least one example, top electrode 301*b* is conformally deposited over second conductive oxide 312*b*. In at least one example, bottom electrode 301*a* is in the center while top electrode 301*b* is on an outer circumference of non-planar capacitor structure 300.

In at least one example, material for bottom electrode 301*a* may include one or more of: Cu, Al, Ag, Au, W, or Co, or their alloys. In at least one example, material for first conductive oxide 312*a* includes $IrO_2$, $RuO_2$, $PdO_2$, $OsO_2$, or $ReO_3$. In some examples, conductive oxides are of the form $A_2O_3$ (e.g., $In_2O_3$, $Fe_2O_3$) and $ABO_3$ type, where 'A' is a rare earth element and B is Mn. In at least one example, material for second conductive oxide 312*b* may be same as the material for first conductive oxide 312*a*. In at least one example, material for top electrode 301*b* may include one or more of: Cu, Al, Ag, Au, W, or Co, or their alloys.

In at least one example, a first refractive inter-metallic layer (not shown) is formed between dielectric material 313 and first conductive oxide 312*a*. In at least one example, a second refractive inter-metallic layer (not shown) is formed between dielectric capacitor material 313 and second conductive oxide 312*b*. In these cases, the first and second refractive inter-metallic layers are directly adjacent to their respective conductive oxide layers and to dielectric capacitor material 313. In at least one example, refractive inter-metallic maintains the capacitive properties of the dielectric capacitor material 313. In at least one example, refractive inter-metallic comprises Ti and Al (e.g., TiAl compound). In at least one example, refractive inter-metallic comprises one or more of Ta, W, and/or Co.

For example, refractive inter-metallic includes a lattice of Ta, W, and Co. In at least one example, refractive inter-metallic includes one of: Ti—Al such as Ti3Al, TiAl, $TiAl_3$; Ni—Al such as $Ni_3Al$, $NiAl_3$, NiAl; Ni—Ti, Ni—Ga, $Ni_2MnGa$; FeGa, $Fe_3Ga$; borides, carbides, or nitrides. In at least one example, TiAl material comprises Ti-(45-48)Al-(1-10)M (at. X trace amount %), with M being at least one element from: V, Cr, Mn, Nb, Ta, W, and Mo, and with trace amounts of 0.1% to 5% of Si, B, and/or Mg. In at least one example, TiAl is a single-phase alloy γ(TiAl). In at least one example, TiAl is a two-phase alloy γ(TiAl)+α2(Ti3Al). Single-phase γ alloys contain third alloying elements such as Nb or Ta that promote strengthening and additionally enhance oxidation resistance. The role of the third alloying elements in the two-phase alloys is to raise ductility (e.g., V, Cr, or Mn), oxidation resistance (Nb or Ta) or combined properties. Additions such as Si, B, and Mg can markedly enhance other properties. The thicknesses of the layers of non-planar capacitor structure 300 in the x-axis are in the range of 1 nm to 30 nm. In at least one example, refractive inter-metallic layers are not used for non-planar capacitor structure 300.

Figure 3B:
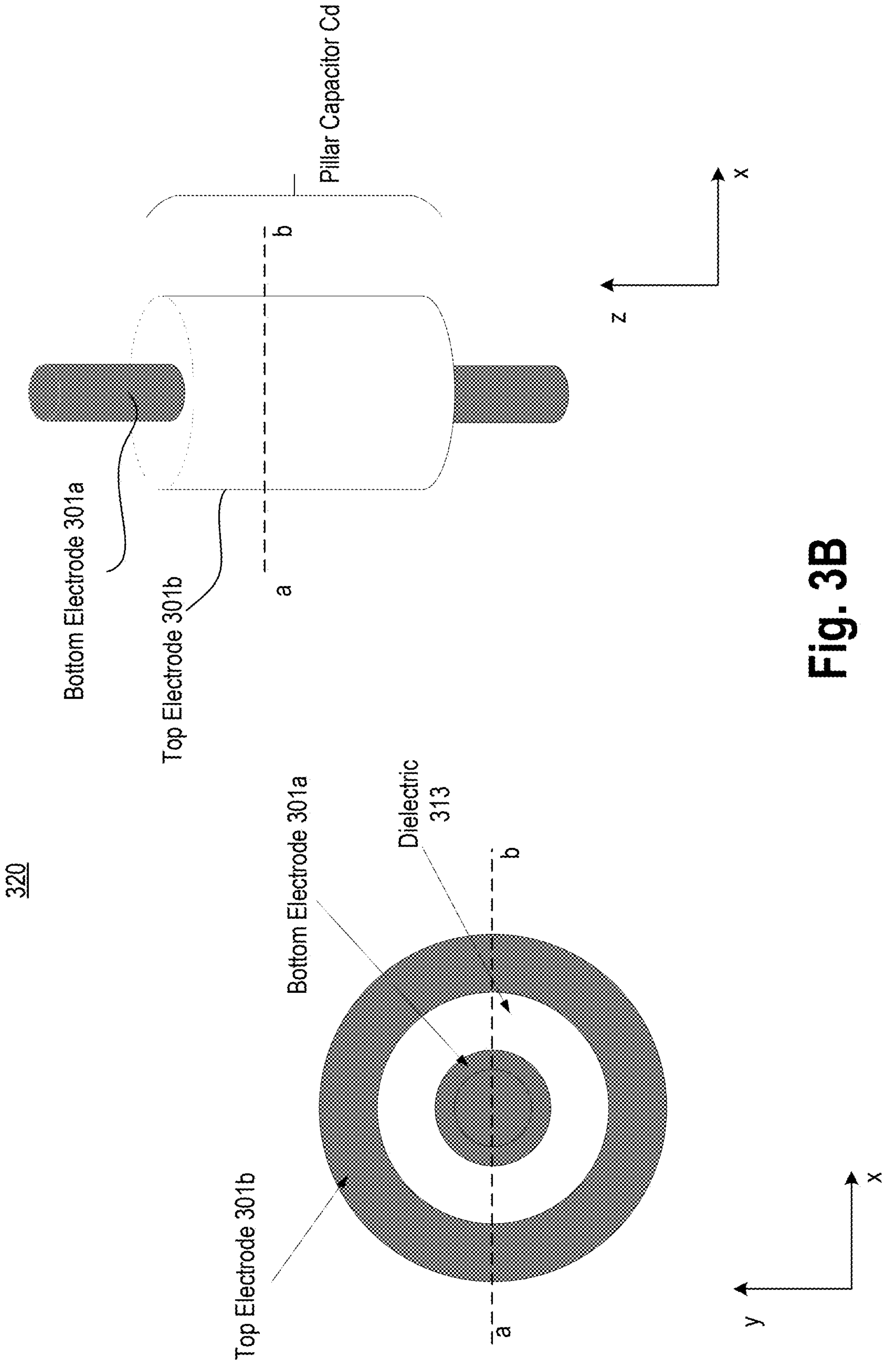
FIG. 3B is a schematic of a non-planar linear capacitor structure without conductive oxides, in accordance with at least one example.

FIG. 3B is a schematic of a non-planar linear capacitor structure 320 without conductive oxides, in accordance with at least one example. Compared to FIG. 3A, here the linear dielectric is adjacent to the top electrode and the bottom electrode.

FIG. 4A is a schematic of a planar ferroelectric or paraelectric capacitor structure configured as a multi-level capacitor (MLC), in accordance with at least one example. FIG. 4B illustrates three planar ferroelectric or paraelectric capacitor structures, respectively, in accordance with at least one example.

In at least one example, capacitors are ferroelectric or paraelectric capacitors. These capacitors can take any planar form. One such simplified form is illustrated in FIG. 4A. Here, capacitor structure 400 is a planar metal-insulator-metal (MIM) capacitor comprising a bottom electrode, a top electrode, and a ferroelectric dielectric between the top electrode and the bottom electrode as shown. In at least one example, conductive oxide layer(s) are formed between the bottom electrode and the ferroelectric dielectric.

In at least one example, planar capacitor 423*a* includes encapsulation portions 421*a* and 421*b* (also referred to as sidewall barrier seal) that are adjacent to the side walls of the plurality of layers of the planar capacitor. In at least one example, planar capacitor 423*b* includes encapsulation portions 421*c* and 421*d* that are partially adjacent to sidewall barrier seal 421*a* and 421*b*, and refractive inter-metallic layers 411*a*. In at least one example, sidewall barrier seals 421*a* and 421*b* extend in the z-plane. In at least one example, encapsulation portions 421*c* and 421*d* terminate into a via (not shown). The material for encapsulation portions 421*c* and 421*d* is the same as those for sidewall barrier seal 421*a* and 421*b*. In at least one example, the barrier material includes one or more of an oxide of: Ti, Al, or Mg.

In at least one example, planar capacitor 423*c* includes encapsulation portions 421*e* and 421*f* that are partially adjacent to sidewall barrier seal 421*a* and 421*b*, and refractive inter-metallic layers 411*b*. In at least one example, encapsulation portions 421*e* and 421*f* terminate into a via (not shown). In at least one example, encapsulation portions 421*e* and 421*f* extend in an x-plane. The material for encapsulation portions 421*e* and 421*f* is the same as those for sidewall barrier seal 421*a* and 421*b*. Material for 421*a* and 421*b* includes one or more of: Ti—Al—O, $Al_2O_3$, MgO, or nitride. Material for 421*a* and 421*b* is a sidewall barrier (e.g., insulative material) that protects the stack of layers from hydrogen and/or oxygen diffusion. In at least one example, the sidewall barrier material is not an interlayer dielectric (ILD) material. In at least one example, the lateral thickness (along x-axis) of the sidewall barrier seal 421*a/b* (insulating material) is in a range of 0.1 nm to 20 nm. In at least one example, sidewall barriers are in direct contact with ILD.

In at least one example, planar capacitors 423*a*, 423*b*, and 423*c* comprise a number of layers stacked together to form a planar capacitor. These layers may extend in an x-plane when the capacitor is a planar capacitor. In at least one example, the stack of layers includes refractive inter-metallic 411_a/b_ as a barrier material; conductive oxides 412_a/b_, and FE material 413. FE material 413 can be any of the FE materials discussed herein. In at least one example, refractive inter-metallic 411_a/b_ are removed, and electrodes are in direct contact with conductive oxides 412_a/b_.

In at least one example, refractive inter-metallic 411_a/b_ maintains the FE properties of the FE capacitor. In the absence of refractive inter-metallic 411_a/b_, the FE material 413 of the capacitor may lose its potency. In at least one example, refractive inter-metallic 411_a/b_ comprises Ti and Al (e.g., TiAl compound). In at least one example, refractive inter-metallic 411_a/b_ comprises one or more of Ta, W, and/or Co. For example, refractive inter-metallic 411_a/b_ includes a lattice of Ta, W, and Co.

In at least one example, refractive inter-metallic 411_a/b_ is part of a barrier layer which is a super lattice of a first material and a second material, wherein the first material includes Ti and Al (e.g., TiAl) and the second material includes Ta, W, and Co (e.g., layers of Ta, W, and Co together). In at least one example, the lattice parameters of the barrier layer are matched with the lattice parameters of the conductive oxides and/or FE material 413.

In at least one example, refractive inter-metallic 411_a/b_ includes one of: Ti—Al such as $Ti_3Al$, TiAl, $TiAl_3$; Ni—Al such as $Ni_3Al$, $NiAl_3$, NiAl; Ni—Ti, Ni—Ga, $Ni_2MnGa$; FeGa, $Fe_3Ga$; borides, carbides, or nitrides. In at least one example, TiAl material comprises Ti-(45-48)Al-(1-10)M (X trace amount %), with M being at least one element from: V, Cr, Mn, Nb, Ta, W, and Mo, and with trace amounts of 0.1% to 5% of Si, B, and/or Mg. In at least one example, TiAl is a single-phase alloy γ(TiAl). In at least one example, TiAl is a two-phase alloy γ(TiAl)+α2(Ti3Al). Single-phase γ alloys contain third alloying elements such as Nb or Ta that promote strengthening and additionally enhance oxidation resistance. The role of the third alloying elements in the two-phase alloys is to raise ductility (V, Cr, Mn), oxidation resistance (Nb, Ta) or combined properties. Additions such as Si, B, and Mg can markedly enhance other properties. In at least one example, barrier layer 411_a_ is coupled to a top electrode. In at least one example, sidewall barrier seal 421_a/b_ (insulating material) is placed around layers 411_a_, 412_a_, 413, 412_b_, and 411_b_ along while the top and bottom surfaces of 411_a_ and 411_b_ are exposed for coupling to metal layers, vias, or a metallic pedestal.

In at least one example, conductive oxide layer(s) are formed between the top electrode and the ferroelectric dielectric. Examples of conductive oxides include: $IrO_2$, $RuO_2$, $PdO_2$, $OsO_2$, or $ReO_3$. In some examples, conductive oxides are of the form A2O3 (e.g., $In_2O_3$, $Fe_2O_3$) and $ABO_3$ type, where 'A' is a rare earth element and B is Mn.

Any suitable conductive material may be used for the top electrode and the bottom electrode. For example, the material or the electrode may include one or more of: Cu, Al, Ag, Au, W, or Co. In at least one example, the thickness along the z-axis of the top electrode and bottom electrode is in a range of 1 nm to 30 nm. In at least one example, the thickness along the z-axis of the dielectric is in a range of 1 nm to 30 nm. In at least one example, the thickness along the z-axis of the conductive oxide is in a range of 1 nm to 30 nm.

FIG. 4C is a schematic of a pedestal 440 that connects to the top and/or bottom electrodes of the planar ferroelectric or paraelectric capacitor, in accordance with at least one example. In at least one example, pedestal 440 comprises pedestal metal 441 and sidewall barrier 442. In at least one example, barrier 442 includes materials to protect hydrogen and/or oxygen from interacting with pedestal metal 441. In at least one example, barrier 442 comprises Ti—Al—O, $Al_2O_3$, MgO, or nitride. In at least one example, pedestal metal 441 includes one of Cu, Al, Ag, Au, W, or Co.

In at least one example, capacitor structure 400 is a multi-level capacitor (MLC). In at least one example, capacitor structure 400 is placed in a partially switched polarization state. Partial polarization state can be achieved by applying either different voltage levels to the capacitor, or different time pulse widths at the same voltage level.

For a 1T1C (one-transistor and one-capacitor) bit-cell, the top electrode of capacitor structure 400 is coupled to plate-line (PL), while the bottom electrode (or storage node) is coupled to a drain or source terminal of a transistor MN. The gate terminal of transistor MN is controlled by word-line (WL), while the source or drain terminal of transistor MN is coupled to bit-line (BL). Table 1 illustrates multi-level storage in 1T1C bit-cell using amplitude modulation (e.g., different voltage levels applied to the ferroelectric or paraelectric capacitor), in accordance with at least one example.

TABLE 1

| | PL =+ V1 | PL =+ 1.5*V1 | PL =− V1 | PL =− 1.5*V1 |
|---|---|---|---|---|
| Write Operation | | | | |
| Remnant polarization (pr) state | +pr1 (10 state) | +pr2 (11 state) | −pr1 (01 state) | −pr2 (00 state) |
| Read Operation (apply PL=+ 1.5*V1) | | | | |
| | delta polarization (dp) dp (10 state) | dp (11) | dp(01 state) | dp (00 state) |
| Sense charge | pr2 − pr1 | 0 | pr2 + pr1 | 2*pr2 |

Table 2 illustrates multi-level storage in 1T1C bit-cell using pulse width modulation (e.g., different time pulse width (PW) at the same voltage level applied to the ferroelectric or paraelectric capacitor), in accordance with at least one example.

TABLE 2

| | PL =+ V, PW = T0 | PL =+ V, PW = 2*T0 | PL =− V, PW = T0 | PL =− V, PW = 2*T0 |
|---|---|---|---|---|
| Write Operation | | | | |
| Remnant polarization state | +pr1 (10 state) | +pr2 (11 state) | −pr1 (01 state) | −pr2 (00 state) |
| Read Operation (apply PL =+ V, PW = 2*T0) | | | | |
| | dp (10 state) | dp (11) | dp(01 state) | dp (00 state) |
| Sense charge | pr2 − pr1 | 0 | pr2 + pr1 | 2*pr2 |

Figure 5A:
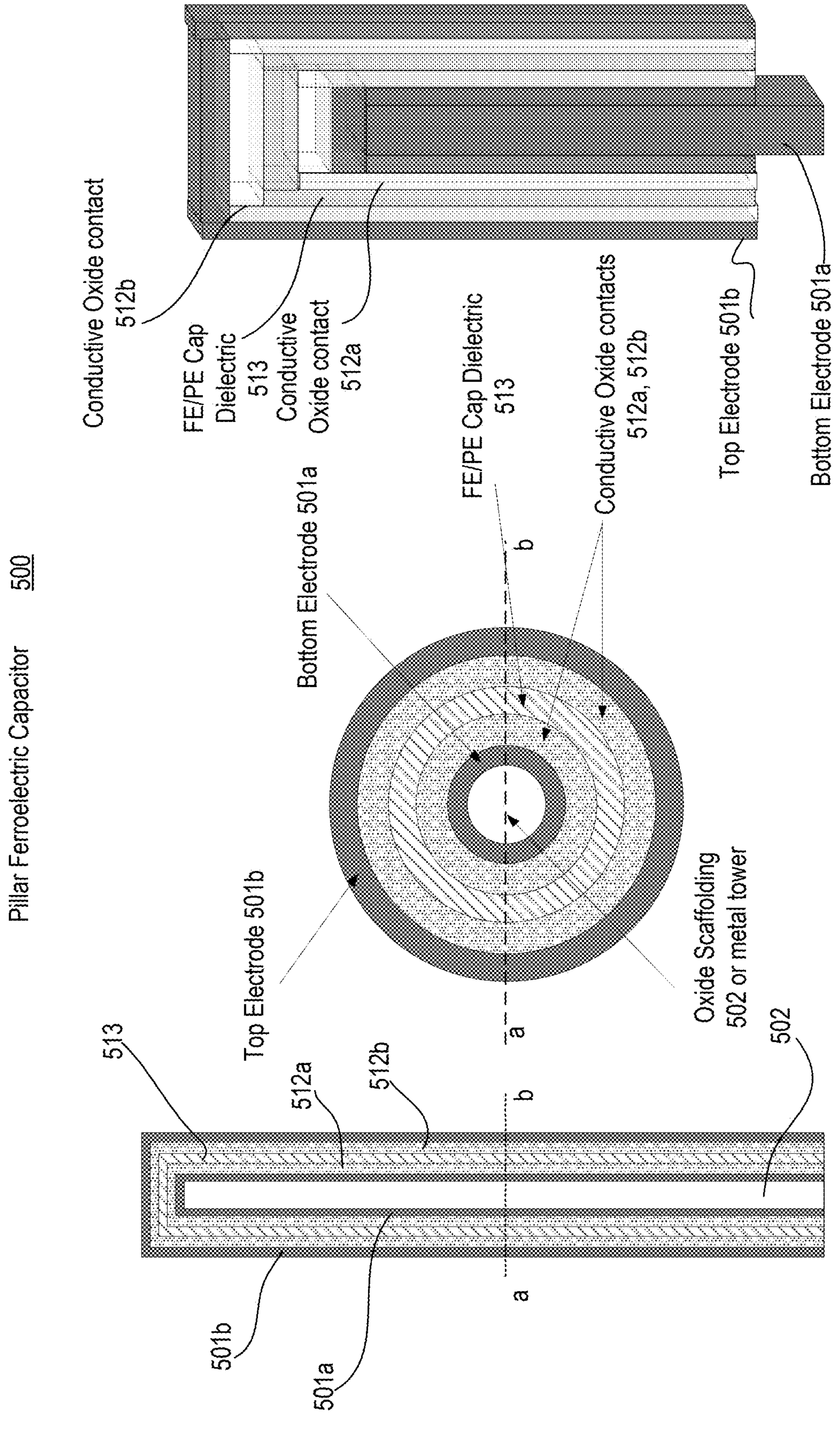
FIG. 5A is a schematic of a non-planar ferroelectric or paraelectric capacitor structure, in accordance with at least one example.

FIG. 5A is a schematic of a non-planar ferroelectric (FE) or paraelectric (PE) capacitor structure, in accordance with at least one example. In at least one example, non-planar capacitor structure 500 is rectangular in shape. Taking the cylindrical shaped case for example, in at least one example, the layers of non-planar capacitor structure 500 from the center going outwards include bottom electrode 501_a_, first conductive oxide 512_a_, ferroelectric (FE) or paraelectric (PE) dielectric material 513, second conductive oxide 512_b_, and top electrode 501_b_. In at least one example, conducting oxides are removed and the FE/PE dielectric is directly connected to top electrode 501_b_ and bottom electrode 501_a_. In at least one example, ferroelectric dielectric material 513 can include any suitable dielectric, where the thickness of FE/PE dielectric film is a range of 1 nm to 20 nm. In at least one example, FE/PE dielectric material 513 includes any one of the materials discussed herein for ferroelectrics or paraelectric. In at least one example, central region 502 of non-planar capacitor structure 500 is filled with oxide or an insulative material. In at least one example, central region 502 is filled with metal that abuts with bottom electrode 501*a* to form a thicker bottom electrode.

In at least one example, first conductive oxide 512*a* is conformally deposited over bottom electrode 501*a*. In at least one example, FE/PE dielectric material 513 is conformally deposited over first conductive oxide 512*a*. In at least one example, second conductive oxide 512*b* is conformally deposited over FE/PE dielectric material 513. In at least one example, top electrode 501*b* is conformally deposited over second conductive oxide 512*b*. In at least one example, bottom electrode 501*a* is in the center while top electrode 501*b* is on an outer circumference of non-planar capacitor structure 500.

In at least one example, material for bottom electrode 501*a* may include one or more of: Cu, Al, Ag, Au, W, or Co, or their alloys. In at least one example, material for first conductive oxide 512*a* includes $IrO_2$, $RuO_2$, $PdO_2$, $OsO_2$, or $ReO_3$. In some examples, conductive oxides are of the form $A_2O_3$ (e.g., $In_2O_3$, $Fe_2O_3$) and $ABO_3$ type, where 'A' is a rare earth element and B is Mn. In at least one example, material for second conductive oxide 512*b* may be same as the material for first conductive oxide 512*a*. In at least one example, material for top electrode 501*b* may include one or more of: Cu, Al, Ag, Au, W, or Co, or their alloys.

In at least one example, a first refractive inter-metallic layer (not shown) is formed between dielectric material 513 and first conductive oxide 512*a*. In at least one example, a second refractive inter-metallic layer (not shown) is formed between FE/PE dielectric capacitor material 513 and second conductive oxide 512*b*. In these cases, the first and second refractive inter-metallic layers are directly adjacent to their respective conductive oxide layers and to FE/PE dielectric capacitor material 513. In at least one example, refractive inter-metallic maintains the capacitive properties of the dielectric capacitor material 513. In at least one example, refractive inter-metallic comprises Ti and Al (e.g., TiAl compound). In at least one example, refractive inter-metallic comprises one or more of Ta, W, and/or Co.

For example, refractive inter-metallic includes a lattice of Ta, W, and Co. In at least one example, refractive inter-metallic includes one of: Ti—Al such as $Ti_3Al$, TiAl, $TiAl_3$; Ni—Al such as $Ni_3Al$, $NiAl_3$, NiAl; Ni—Ti, Ni—Ga, $Ni_2MnGa$; FeGa, $Fe_3Ga$; borides, carbides, or nitrides. In at least one example, TiAl material comprises Ti-(45-48)Al-(1-10)M (X trace amount %), with M being at least one element from: V, Cr, Mn, Nb, Ta, W, and Mo, and with trace amounts of 0.1% to 5% of Si, B, and/or Mg. In at least one example, TiAl is a single-phase alloy $\gamma$(TiAl). In at least one example, TiAl is a two-phase alloy $\gamma$(TiAl)+$\alpha$2($Ti_3Al$). Single-phase $\gamma$ alloys contain third alloying elements such as Nb or Ta that promote strengthening and additionally enhance oxidation resistance. The role of the third alloying elements in the two-phase alloys is to raise ductility (V, Cr, Mn), oxidation resistance (Nb, Ta) or combined properties. Additions such as Si, B, and Mg can markedly enhance other properties. The thicknesses of the layers of non-planar capacitor structure 500 in the x-axis are in the range of 1 nm to 30 nm. In at least one example, refractive inter-metallic layers are not used for non-planar capacitor structure 500.

Figure 5B:
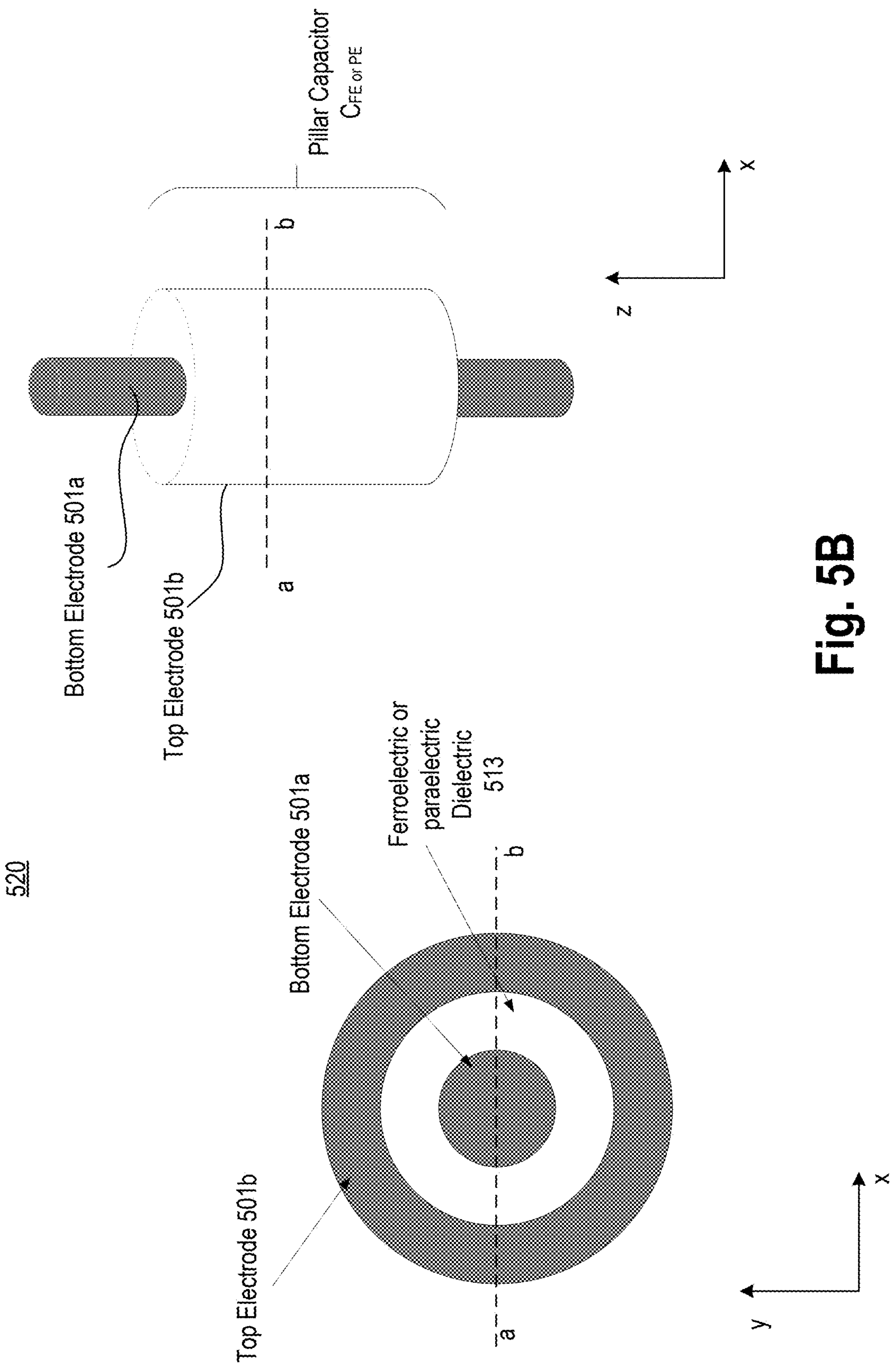
FIG. 5B is a schematic of a non-planar ferroelectric or paraelectric capacitor structure without conductive oxides, in accordance with at least one example.

FIG. 5B is a schematic of a non-planar ferroelectric or paraelectric capacitor structure 520 without conductive oxides, in accordance with at least one example. Compared to non-planar capacitor structure 500, here first conductive oxide 512*a* and second conductive oxide 512*b* are removed and ferroelectric material 513 is adjacent to top electrode 501*b* and bottom electrode 501*a* as shown.

In at least one example, non-planar capacitor structure 500 is a multi-level capacitor (MLC). In at least one example, top electrode 501*b* is coupled to PL while bottom electrode 501*a* is coupled to a source or drain of a transistor (e.g., access transistor). Table 1 and Table 2 apply for non-planar capacitor structure 500.

Figure 6A:
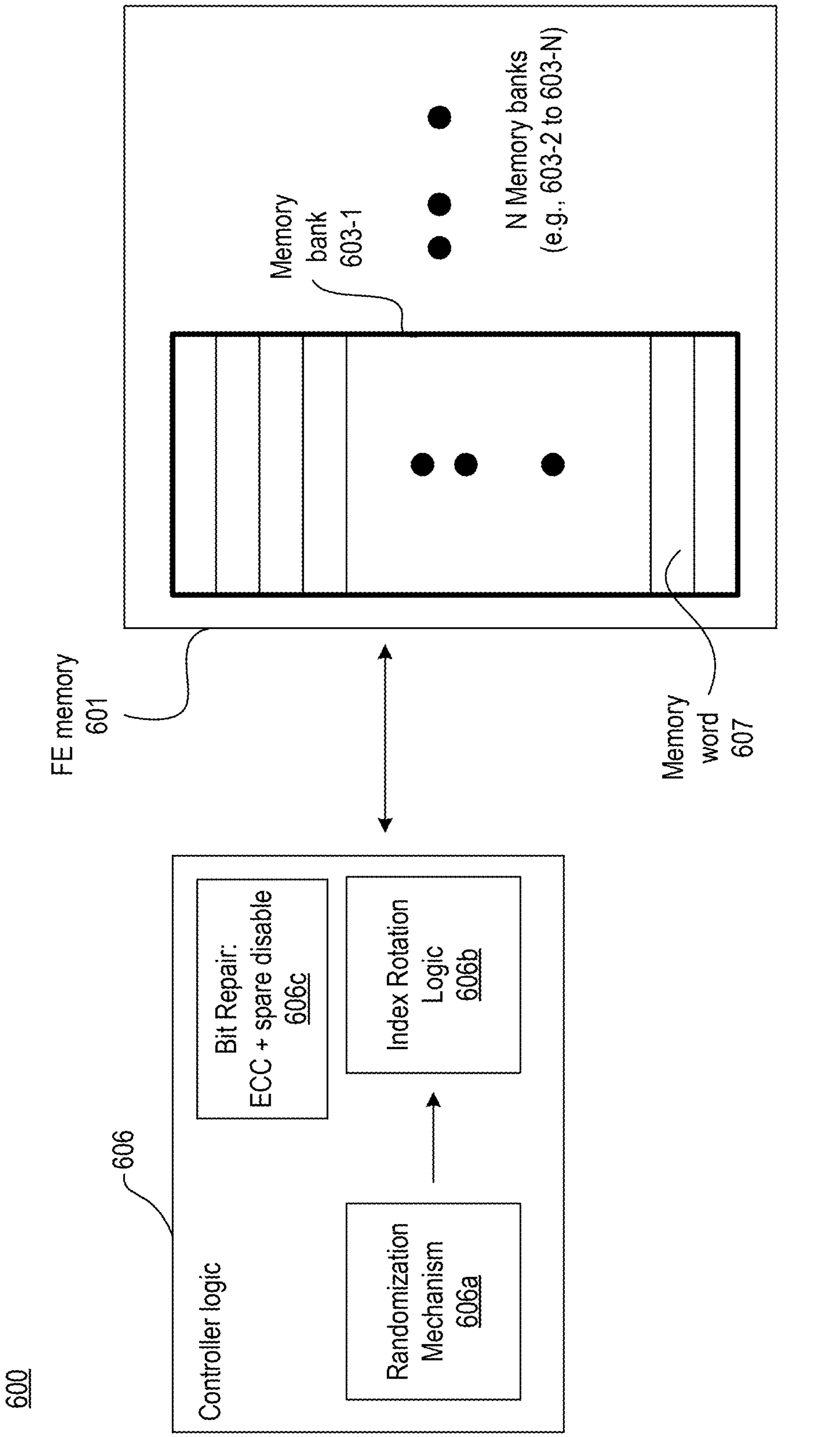
FIG. 6A is a schematic of a high-level endurance enhancement architecture for a paraelectric (PE) or ferroelectric (FE) memory, in accordance with at least one example.

FIG. 6A is a schematic of a high-level endurance enhancement architecture 600 for a paraelectric (PE) or ferroelectric (FE) memory, in accordance with at least one example. While memory with memory bit-cells comprising ferroelectric material provides a new class of non-volatile memories, traditional ferroelectric memories suffer from charge degradation over time, for example, during read operations. Such memories also suffer from charge disturbance when neighboring bit-cells are accessed. Such disturbance may be a function of routing configuration of plate-line(s), relative to bit-lines and word-lines. Further, leakage from transistors coupled to ferroelectric capacitor(s) may further degrade charge on a storage node connected to the capacitor.

Consider the case for an unselected memory bit-cell where word-line to a gate of an n-type transistor of the bit-cell is at logic low. Continuing with this example, when the plate-line coupled to the capacitor is parallel to a bit-line, which is coupled to a source terminal or a drain terminal of the n-type transistor, transitions from logic low to logic high on the plate line results in a field across the ferroelectric capacitor of this unselected memory bit-cell. This field causes polarization decay for a ferroelectric material in the ferroelectric capacitor. The polarization decay causes the charge on the storage node to rise, which in turn weakens the disturb electric field across the ferroelectric material of the unselected bit-cell. The weakened disturb electric field causes the n-type transistor to leak, which in turn causes the disturb field to increase. As such, the unselected bit-cell suffers from charge disturbance when the plate-line is parallel to the bit-line. Depending on the charge stored in the ferroelectric capacitor, this disturb field can either disturb or reinforce the stored value in the ferroelectric capacitor.

Parasitic capacitance (Cp) from the transistor and a dielectric component (Cde) of the ferroelectric capacitor also results in a capacitor divider. This capacitor divider causes a voltage drop across the ferroelectric capacitor of the unselected bit-cell. The voltage drop across the unselected ferroelectric capacitor can be approximately one-third to one-fourth of a voltage on the plate-line. In one example, when the plate-line voltage is twice the coercive voltage (Vc) of the ferroelectric capacitor, the disturb voltage can be two-thirds to one-half of the Vc for the unselected cell. Depending on the charge stored in the ferroelectric capacitor, this disturb voltage can either disturb or reinforce the stored value in the ferroelectric capacitor.

To mitigate such charge disturbance, the memory bit-cells may be refreshed, in accordance with at least one example. For example, ferroelectric based random access memory (FeRAM) may apply a refresh scheme to make sure the contents in its capacitor remain valid. The refresh may be applied periodically or on an as needed basis. For instance, refresh may be applied every 1 second, or applied when a sensor determines that the contents on a storage node may have been disturbed. While various examples are described with reference to an FeRAM, the examples are applicable to other non-volatile memories (NVMs) such as magnetic random-access memory (MRAM), resistive RAM (ReRAM), ferroelectric RAM (FeRAM), paraelectric RAM (PeRAM), phase-change memory (PCM), etc.

In at least one example, the NVM is integrated on a die which includes compute logic. In at least one example, the NVM is a separate die which is packaged in a single package with a compute die. In at least one example, the NVM is on a different package than the compute die. Here, examples of compute die include a die that is used for computations such as an inference logic, graphics processing unit (GPU), central processing unit (CPU), application specific integrated circuit (ASIC), digital signal processor (DSP), etc. In at least one example, features of endurance mechanisms (e.g., randomizing mechanisms) are applicable to volatile memories such as static random-access memory (SRAM), and dynamic random-access memory (DRAM).

The endurance mechanisms (or refresh logic) of some examples include a wear leveling scheme that uses index rotation, outlier compensation to handle weak bits, and random swap injection (which is an example of a randomizing mechanism) to mitigate wear out attacks. In at least one example, an index rotation logic is provided, which rotates the addresses throughout a memory bank to perform a wear leveling function. Index rotation logic ensures that memory requests are spread across memory locations rather than a single memory location. In at least one example, a randomizing mechanism is used to randomize a mapping of an incoming address to an intermediate index. One example of a randomizing mechanism includes a random invertible bit matrix. This intermediate index is used by an index rotation logic to map to an actual physical index. In at least one example, the rotation of gap words in the memory bank is randomized. In some cases, malicious users (or attackers) may write programs that deliberately track the wear leveling scheme described herein. These attackers may attempt to alter a memory reference pattern to continue to stress a single physical line even as the wear leveling scheme assigns that physical line to different addresses. Some examples provide a facility to make tracking of the physical lines difficult. This facility makes a random decision (e.g., using an externally generated random number) to either swap or not each time a swap opportunity arises. Over time the randomness injected into the swapping process makes tracking cache lines more difficult. In at least one example, random invertible bit matrix enables random swap injection which randomizes index rotation to obfuscate the mapping from addresses to rotated indexes. In at least one example, bit repair logic is provided, which includes double error correcting, or triple error detecting error correction code (ECC) to discover new bit errors and spare disable which eliminates memory words with particularly high error rates.

Architecture 600 comprises memory array 601 and controller logic 606. In at least one example, memory array 601 is memory with non-linear polar material. For example, memory array 601 includes bit-cells that comprise at least one transistor and at least one capacitor coupled to it, where the capacitor has non-linear polar material. Examples of non-linear material include ferroelectric (FE) material, paraelectric (PE) material, and non-linear dielectric material.

In at least one example, memory array 601 includes a plurality of memory banks (e.g., 603-1 through 603-N, where 'N' is a number). Each memory bank (e.g., 603-1) includes a plurality of memory words (e.g., memory word 607). Each memory word includes a plurality of memory bit-cells. For the sake of simplicity, other memory components are not shown such as write drivers, column multiplexers, sense-amplifiers, etc.

In at least one example, controller logic 606 comprises endurance hardware and/or software to provide memory endurance to memory array 601. In general, memory endurance is needed to ensure write and/or read operations from memory array 601 are reliable. Write endurance is a number of programs and erase cycles that, when applied to a memory block, bank, or word before the memory block, bank, or word, becomes unreliable. The endurance mechanisms of some examples include a wear leveling scheme that uses index rotation, outlier compensation to handle weak bits, and random swap injection to mitigate wear out attacks. For the sake of simplicity, memory banks are generally referred to their reference 603 instead of a particular memory bank reference (e.g., 603-1, 603-2, etc.). Examples described to the general reference are applicable to an individual particular reference. For instance, description of memory bank 603 is applicable for memory banks 603-1, 603-2, through 603-N.

In at least one example, controller logic 606 (also referred to as refresh logic) comprises random invertible bit matrix **606*a*, index rotation logic 606*b*, and bit repair logic 606*c*. In at least one example, index rotation logic 606*b* enables random swap injection which randomizes index rotation to obfuscate the mapping from addresses to rotated indexes. In at least one example, index rotation logic 606*b* randomizes the rotation of gap words in memory bank 603**. In some cases, malicious users (or attackers) may write programs that deliberately track the wear leveling scheme described herein. These attackers may attempt to alter a memory reference pattern to continue to stress a single physical line even as the wear leveling scheme assigns that physical line to different addresses. Some examples provide a facility to make tracking of the physical lines difficult. This facility makes a random decision (e.g., using an externally generated random number) to either swap or not each time a swap opportunity arises. Over time the randomness injected into the swapping process makes tracking cache lines more difficult.

In at least one example, index rotation logic **606*b* is used for implementing the wear leveling scheme. In at least one example, index rotation logic 606*b* rotates the addresses throughout memory bank 603 to perform a wear leveling function. In at least one example, index rotation logic 606*b*** ensures that memory requests are spread across memory locations rather than a single memory location.

In at least one example, bit repair logic **606*c* includes double error correcting, or triple error detecting error correction code (ECC) to discover new bit errors and spare disable which eliminate memory words with particularly high error rates. Spare disable involves having a buffer of spare cache lines. When cache lines are particularly unreliable, spare disable can swap out unreliable cache lines for the reliable spares. In at least one example, the spares may be implemented with a memory technology other than FE memory such as static random-access memory (SRAM). In at least one example, bit repair logic 606*c* addresses the problem of weak memory bits. In at least one example, each cache line or word 607 in memory bank 603 includes a valid bit. The valid bit indicates whether the data associated with that line/word is stored in the memory or the redundant word array. The redundant word array comprises spares that can be used to compensate for defective words in memory. When accessing memory, controller logic 606 checks the valid bit, if the valid bit is set then the data is stored in the redundant memory rather than the memory array or bank 603. In at least one example, ECC is used to identify and/or correct bit errors in both the memory array and the redundant memory. As the ECC discovers bit errors, additional lines may be marked valid, and the data stored in the redundant memory location rather than the memory. The various endurance mechanisms discussed herein can be used in any combination or order. Some memory products may select one or more of the endurance mechanisms instead of all three discussed herein. Some memory products may apply all three endurance mechanisms to achieve most endurance for memory array 601. These endurance mechanisms are applied to memory array 601** to maximize usage of such memory.

Figure 6B:
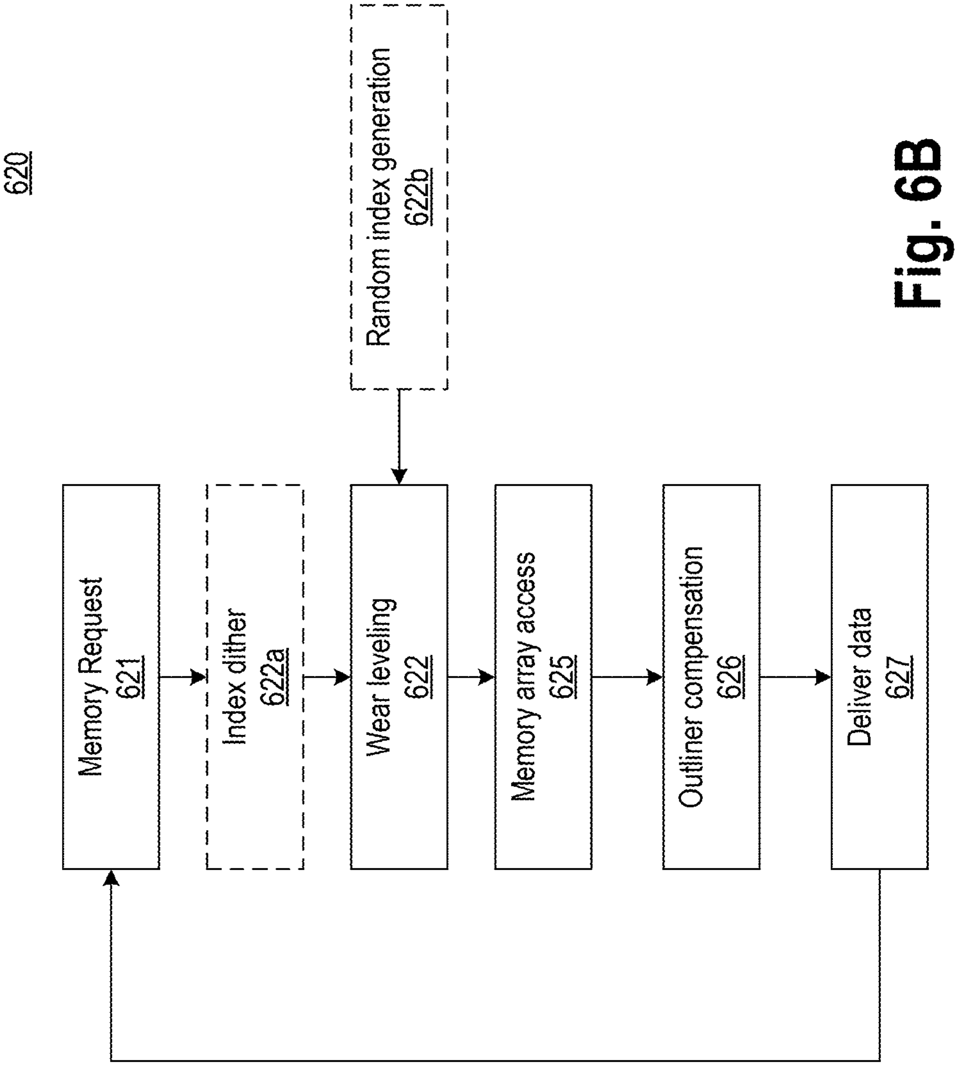
FIG. 6B illustrates a flowchart of memory endurance for the PE and FE memory, in accordance with at least one example.

FIG. 6B illustrates flowchart 620 of memory endurance for the PE and FE memory, in accordance with at least one example. While the blocks in flowchart 620 are illustrated in a particular order, the order can be modified. For example, some blocks may be performed before others based on whether read or write operations are being performed. As described herein, the various blocks can be implemented in hardware, software, or a combination of them.

At block 621, controller logic 606 sends a memory request to memory array 601. This request may be a read request or a write request. If it is a write request, controller logic 606 applies the wear leveling scheme at block 622. In at least one example, the wear leveling scheme is linear in that a gap word or gap cache line is swapped with an adjacent word or cache line. In at least one example, wear leveling is dithered as indicated by block 622*a*. In at least one example, the index or pointer to gap word or gap cache line is used to swap the gap word or gap cache line with either an adjacent cell with one higher index or address or with an adjacent cell with one lower index or address. As such, wear leveling is dithered.

In at least one example, wear leveling is randomized. In at least one example, a random index is generated at block 622*b*. This random index is then used to swap the gap word or gap cache line with an adjacent or a non-adjacent word or cache line. In at least one example, the random index is dithered. This dithered random index is then used for wear leveling.

In at least one example, if the memory request is a read access (as indicated by block 625), outlier compensation is applied as indicated by block 626. At block 626, controller logic 606 addresses the problem of weak memory bits by checking a valid bit for the memory word being addressed or accessed. The valid bit indicates whether the data associated with that line or word is stored in the memory or the redundant word array. The redundant word array comprises spares that can be used to compensate for defective words in memory. When accessing memory, controller logic 606 checks the valid bit, if the valid bit is set then the data is stored in the redundant memory rather than the memory array or bank 603. In at least one example, an ECC is used to identify and/or correct bit errors in both the memory array and the redundant memory. As the ECC discovers bit errors, additional lines may be marked valid and the data stored in the redundant memory location rather than the memory. After ECC is applied, the requested data is provided to controller logic 606 as indicated by block 627. The memory endurance for non-linear polar material based memory is enhanced by the endurance mechanisms of various examples. This allows more read and writes to memory before any memory block, bank, or word becomes unreliable. In at least one example, the capacitors for each bit-cell in memory array 601 are MLCs.

Figure 7A:
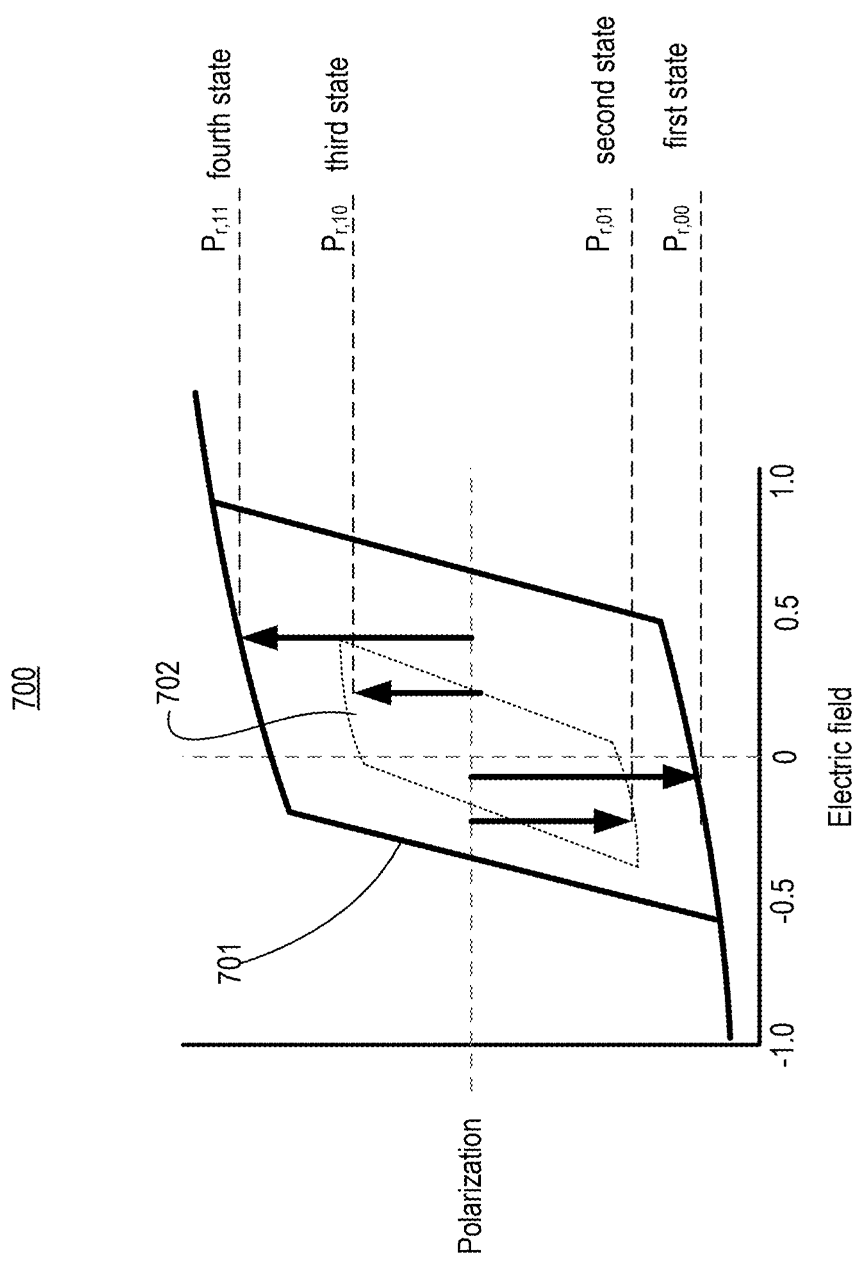
FIG. 7A illustrates a plot showing dual polarization loops for an MLC, in accordance with at least one example.

FIG. 7A illustrates a plot 700 showing dual polarization loops for an MLC (e.g., capacitor structure 400), in accordance with at least one example. Plot 700 shows a first polarization loop 701 and a second polarization loop 702 inside first polarization loop 701. First polarization loop 701 provides a first state Pr,00 and a fourth state Pr,11. Second polarization loop 702 provides a second state Pr,01 and a third state Pr,10. These states are remnant polarization states that can be achieved by a single film of non-linear polar material. Here, second polarization loop 702 does not have saturation tails because the non-linear polar material is a single film where saturation tails are indicated by first polarization loop 701. In at least one example, the polarization levels or states are equally spaced from one another (e.g., the first state Pr,00, the second state Pr,01, the third state Pr,10, and the fourth state Pr,11 are equally spaced). In at least one example, the polarization levels or states are not equally spaced from one another.

In this case, the MLC is a single capacitor with non-linear polar material configured to store multiple stable states in the high and low remnant or saturation levels of first polarization loop 701 and second polarization loop 702. In at least one example, capacitor structure 400 is an MLC. These multiple stable states can be probed by reading the MLC using the pulsing scheme(s) discussed herein which include pulse width modulation scheme and amplitude modulation scheme. In at least one example, first polarization loop 701 and second polarization loop 702 are symmetric around zero electric field point as shown. In at least one example, first polarization loop 701 and/or second polarization loop 702 are offset (positively to the right or negatively to the left) relative to the zero electric field point.

Table 3 summarizes the writing scheme for the MLC based 1T1C memory bit-cell.

TABLE 3

| State | Polarization | PL-BL voltage polarity for option 1 and option 2 | Option 1: Program with pulse width (PW) modulation with same voltage | Option 2: program with amplitude modulation with same pulse widths |
|---|---|---|---|---|
| State 0, 00 | −pr (e.g., bottom of first polarization loop) | Positive | Large pulse width (e.g., maximum PW) with +Vdd or +Vmax for PL-BL | Amplitude of PL-BL is +Vdd or +Vmax |
| State 1, 01 | −pr/3 (e.g., bottom of second polarization loop) | positive | small pulse width (e.g., minimum PW) with +Vdd or +Vmax for PL-BL | Amplitude of PL-BL is positive intermediate voltage +Vint |
| State 2, 10 | +pr/3 (top of second polarization loop) | negative | Small pulse width (e.g., minimum PW) with −Vdd or −Vmax for PL-BL | Amplitude of PL-BL is negative intermediate voltage −Vint |
| State 3, 11 | +pr (e.g., top of first polarization loop) | negative | large pulse width (e.g., minimum PW) with −Vdd or −Vmax for PL-BL | Amplitude of PL-BL is −Vdd or −Vmax |

While the pulsing scheme is described for 1T1C memory bit-cell, the scheme is applicable to other memory bit cells such as 1TnC, 2T1C, and 2TnC, and resistive memories.

Figure 7B:
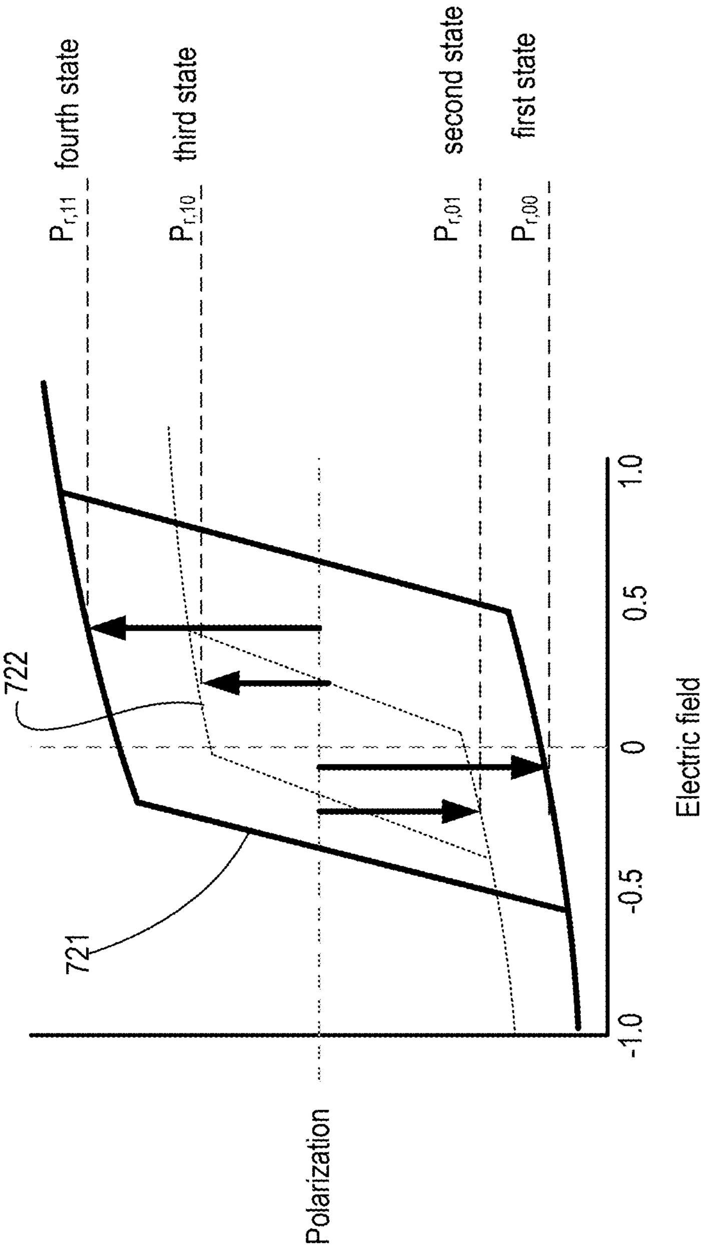
FIG. 7B illustrates a plot showing dual polarization loops for an MLC comprising two parallel capacitors, in accordance with at least one example.

FIG. 7B illustrates a plot 720 showing dual polarization loops for an MLC comprising at least two parallel capacitors, in accordance with at least one example. Plot 720 shows a first polarization loop 721 and a second polarization loop 722 inside first polarization loop 721. First polarization loop 721 provides first state Pr,00 and the fourth state Pr,11. Second polarization loop 722 provides second state Pr,01 and third state Pr,10. These states are remnant polarization states that can be achieved by two parallel films of non-linear polar material as discussed with reference to FIGS. 7C-E. Table 3 is also appliable to an MLC comprising at least two parallel capacitors. Compared to plot 700, second polarization loop 722 shows saturation tails. In at least one example, first polarization loop 721 and second polarization loop 722 are symmetric around zero electric field point as shown. In at least one example, first polarization loop 721 and/or second polarization loop 722 are offset (positively to the right or negatively to the left) relative to the zero electric field point.

In at least one example, with reference to FIGS. 7A-B, different pulse widths for the BLs can generate the minor states (e.g., state 01 and state 10) in the MLC. In at least one example, by applying different maximum and minimum pulse widths, while the electric field across the terminals of the MLC or the amplitude of the electric field across the terminals of the MLC is the same, minor states can be generated in the MLC.

Figure 7C:
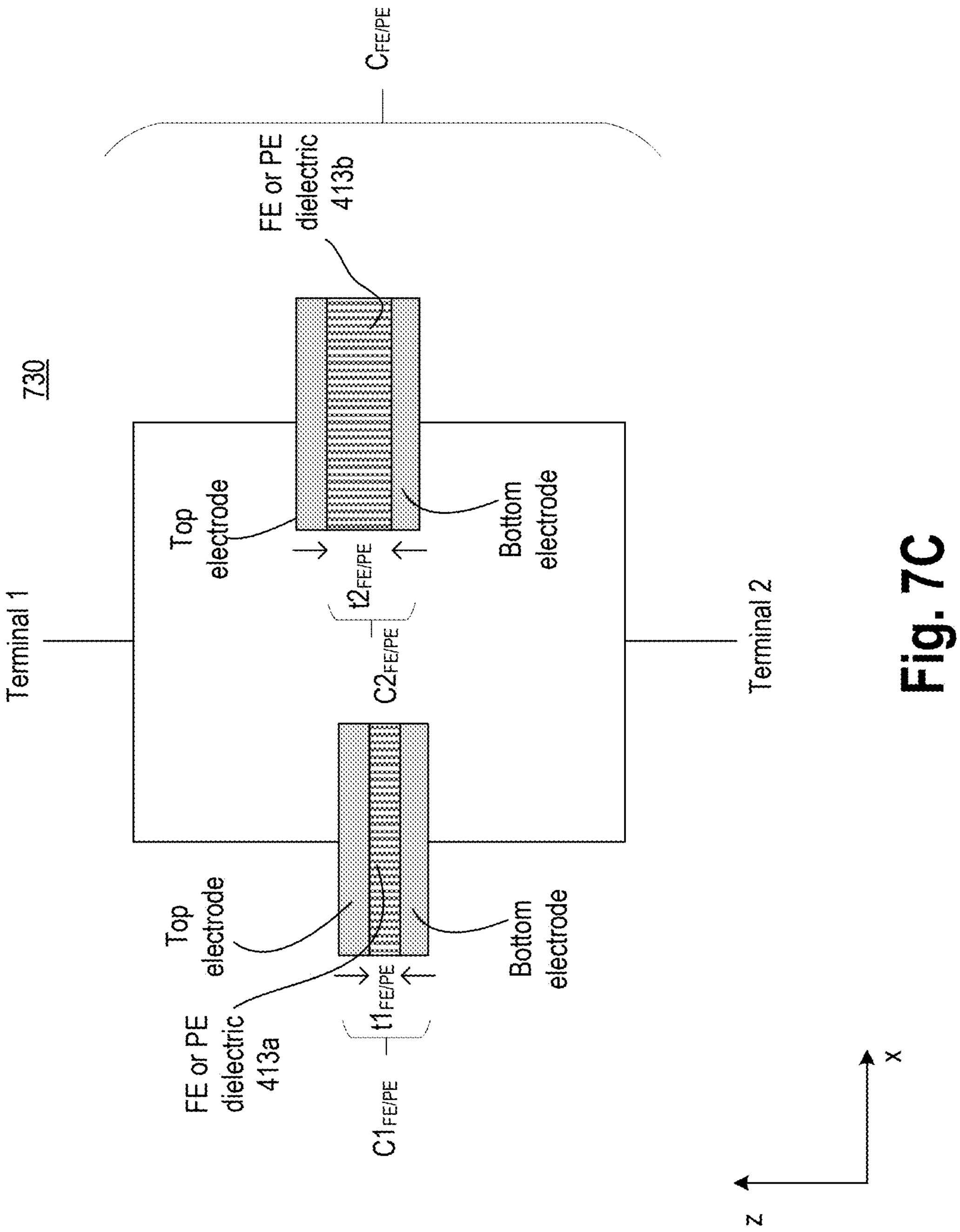
FIGS. 7C-E are schematics of an MLC, in accordance with some examples.
Figure 7D:
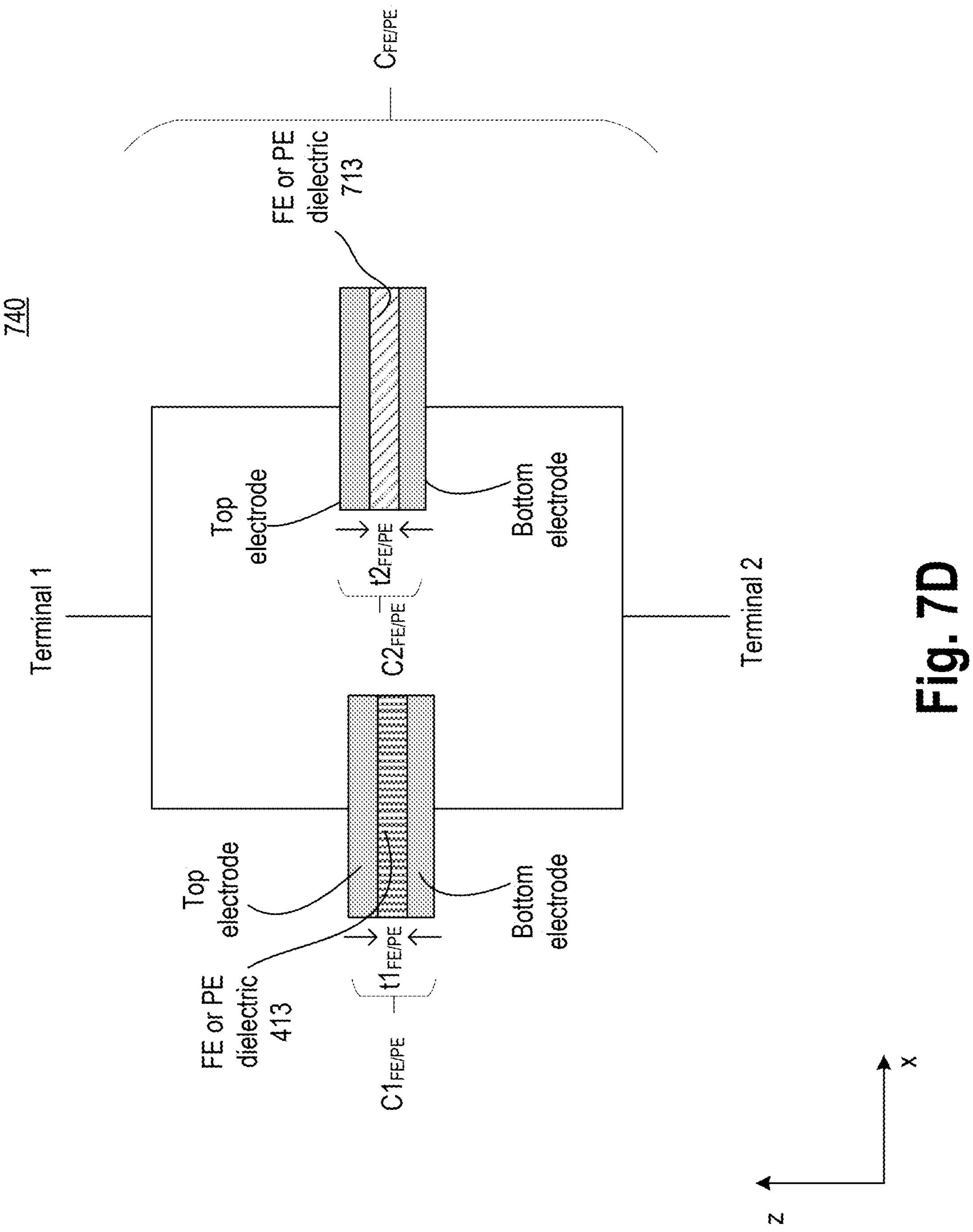
Figure 7E:
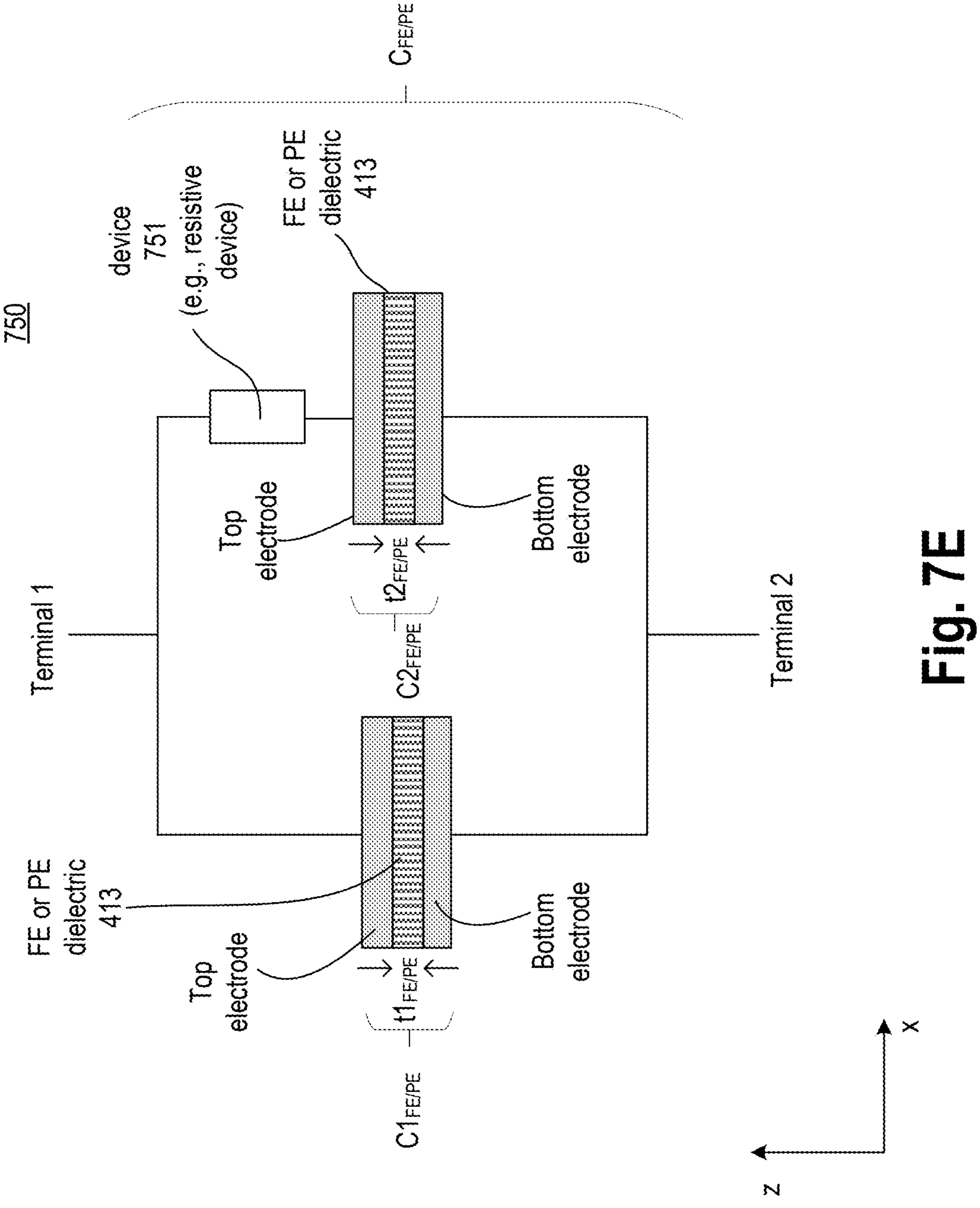

FIGS. 7C-E are schematics of MLCs, in accordance with some examples. In at least one example, MLC 730 comprises a first capacitor $C\mathbf{1}_{FE/PE}$ having a first non-linear polar material (e.g., FE or PE dielectric 413*a*) and a second capacitor $C\mathbf{2}_{FE/PE}$ having a second non-linear polar material (e.g., FE or PE dielectric 413*b*). The first capacitor $C\mathbf{1}_{FE/PE}$ is parallel to the second capacitor $C\mathbf{2}_{FE/PE}$ such that the top electrodes of the two capacitors are coupled to terminal 1 of MLC 730 while the bottom electrodes of the two capacitors are coupled to terminal 2 of MLC 730. In at least one example, thickness $t1_{FE/FE}$ of the first non-linear polar material is different from thickness of $t2_{FE/FE}$ of the second non-linear polar material. In at least one example, thickness $t1_{FE/FE}$ of the first non-linear polar material is greater than the thickness of $t2_{FF/FE}$ of the second non-linear polar material. In at least one example, thickness $t1_{FE/FE}$ of the first non-linear polar material is smaller than the thickness of $t2_{FE/FE}$ of the second non-linear polar material. In at least one example, the first non-linear polar material and the second non-linear polar material have the same doping but different thicknesses that result in the two polarization loops as discussed with reference to FIG. 7B providing four distinct stable states. Materials for the first non-linear polar material and the second non-linear polar material can be the materials for non-polar material discussed herein.

In at least one example, MLC 740 has two different parallel capacitors like MLC 730 providing same function as MLC 730. In at least one example, the first capacitor $C\mathbf{1}_{FE/PE}$ and the second capacitor $C\mathbf{2}_{FE/PE}$ have same thickness (e.g., thickness $t1_{FE/FE}$ of the first non-linear polar material (e.g., FE or PE dielectric 413) is equal to (or substantially equal to) the thickness of $t2_{FE/FE}$ of the second non-linear polar (e.g., FE or PE dielectric 713)). In at least one example, doping material for the two non-linear polar materials of the capacitors of MLC 740 are different resulting in the two polarization loops as discussed with reference to FIG. 7B providing four distinct stable states. Materials for the first non-linear polar material and the second non-linear polar material can be the materials for non-polar material discussed herein.

In at least one example MLC 750 has two different parallel capacitors like MLC 730 providing same function as MLC 730. In at least one example, the first capacitor $C\mathbf{1}_{FE/PE}$ and the second capacitor $C\mathbf{2}_{FE/PE}$ have same thickness and same materials for their respective non-linear polar materials (e.g., FE or PE dielectric 413) and with a device 751 in series with one of the capacitors. In at least one example, device 751 is in series with the second capacitor $C\mathbf{2}_{FE/PE}$ such that the series combination of device 751 and the second capacitor $C\mathbf{2}_{FE/PE}$ is in parallel with the first capacitor $C\mathbf{1}_{FE/PE}$. In at least one example, device 751 is a resistive device (e.g., a resistor). The first capacitor $C\mathbf{1}_{FE}/P_E$, the second capacitor $C\mathbf{2}_{FE/PE}$, and device 751 result in the two polarization loops as discussed with reference to FIG. 7B providing four distinct stable states. Materials for the first non-linear polar material and the second non-linear polar material can be the materials for non-linear polar material discussed herein.

In at least one example, first capacitor $C\mathbf{1}_{FE/PE}$ and the second capacitor $C\mathbf{2}_{FE/PE}$ have same thickness but different materials for their respective non-linear polar material. For example, first capacitor $C\mathbf{1}_{FE/PE}$ comprises BFO while the second capacitor $C\mathbf{2}_{FE/PE}$ has LBFO. In at least one example, materials for the first non-linear polar material and the second non-linear polar material are different materials and selected from the list of material discussed for non-linear polar material discussed herein. In at least one example, first capacitor $C\mathbf{1}_{FE/PE}$ and the second capacitor $C\mathbf{2}_{FE/PE}$ have same thickness and same non-linear polar material, but their electrodes may comprise different materials. For example, the top electrode of first capacitor $C\mathbf{1}_{FE/PE}$ may have a different work function than the top electrode of the second capacitor $C\mathbf{2}_{FE/PE}$. The work function of bottom electrodes of the two capacitors can also be different in addition to or alternative to work functions of the top electrode. In at least one example, the material configurations of first capacitor $C\mathbf{1}_{FE/PE}$ and the second capacitor $C\mathbf{2}_{FE/PE}$ can be mixed in any manner.

In at least one example, the multiple stable states in the MLCs discussed herein (e.g., single capacitor based MLC or multiple capacitors based MLC) can be probed by reading the MLC using the pulsing scheme(s) discussed herein which include pulse width modulation scheme and amplitude modulation scheme.

Figure 8A:
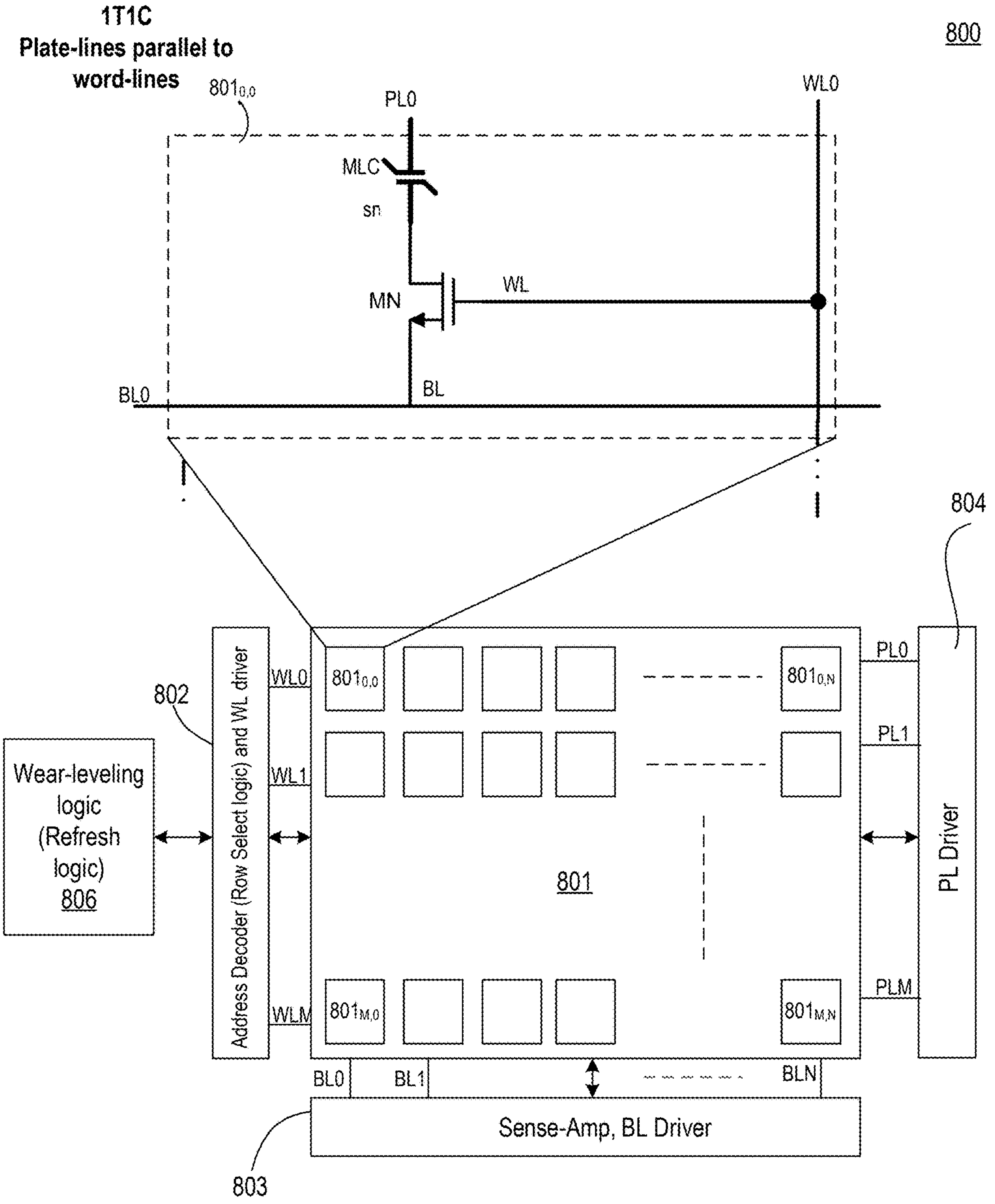
FIG. 8A is a schematic of an apparatus comprising memory and corresponding logic, wherein the memory comprises FE or PE memory bit-cells, where an individual memory bit-cell includes one transistor and one capacitor (1T1C) with PLs parallel to word-lines (WL), wherein the capacitors are configured to store multiple states, in accordance with at least one example.

FIG. 8A is a schematic of an apparatus 800 comprising memory and corresponding logic, wherein the memory comprises FE or PE memory bit-cells, where an individual memory bit-cell includes one transistor and one capacitor (1T1C) with PLs parallel to word-lines (WL), wherein the capacitors are configured to store multiple states, in accordance with at least one example.

Apparatus 800 comprises MxN memory array 801 of bit-cells, logic circuitry 802 for address decoding and WL driver, and logic circuitry 803 for sense amplifier and BL driver, and logic circuitry 804 for plate-line (PL) drivers. Plate-lines PL0, PL1 through PLM are parallel to word-lines WL0, WL1 through WLM, while bit-lines BL0, BL1, through BLN are orthogonal to the plate-lines and the word-lines, where 'N' is a number greater than 1. In at least one example, when the PL is parallel to WL, the disturb during read/write is limited to selected cells. In one such example, the memory array has a lower energy consumption associated with toggling the PL line, as the cost of PL parasitic gets amortized with multiple number of cells that get written together. In at least one example, the write phase in the case when PL is parallel to WL becomes longer due to time separation required for write0 and write1 operations, arising out of having a shared PL for selected row. In at least one example, memory array 801 with PL parallel to WL has lower array level efficiency and lower speed relative to a memory array having PL parallel to BL.

Each memory bit-cell in memory array 801 is organized in rows and columns. For example, memory bit-cells $\mathbf{801}_{0,0}$ through $\mathbf{801}_{M,N}$ are organized in an array. In at least one example, memory bit-cell 801 (e.g., $\mathbf{801}_{0,0}$) comprises one select or access transistor MN and MLC comprising non-linear polar material (e.g., ferroelectric, paraelectric, or non-linear dielectric). The MLC can be a planar or non-planar capacitor as described with reference to various examples discussed herein.

The gate terminal of transistors MN is controllable by WL. The BL is coupled to a source or drain terminal of transistor MN. The PL is coupled to the MLC. For example, capacitor MLC of bit-cell $\mathbf{801}_{0,0}$ through bit-cell $\mathbf{801}_{0,N}$ are coupled to plate-line PL0, while capacitor MLC of bit-cell $\mathbf{801}_{M,0}$ through bit-cell $\mathbf{801}_{M,N}$ are coupled to plate-line PLM. The MLC is coupled to storage node sn, which is coupled to a drain or source terminal of transistor MN. The first terminal of capacitor MLC is coupled to a PL (e.g., PL0 for bit-cell $\mathbf{801}_{0,0}$) and the second terminal of MLC is coupled to storage node sn of the bit-cell.

While the various examples are illustrated with reference to an n-type transistor, the examples are also applicable to a p-type transistor or a combination of n-type or p-type transistors. A person skilled in the art would appreciate that when a transistor of a different conductivity type is used, than what is shown in FIG. 8A, then driving logic for BLs, PLs, and/or WLs may also change for proper read and/or write operations. In at least one example, transistor MN is fabricated on the frontend of the die and MLCs is over the transistor. The capacitors can be planar or non-planar capacitors. As such, a taller bit-cell is formed with a footprint comparable to the footprint of the transistor MN. In at least one example, the x-y footprint is determined by the size of transistor MNi and its connections to BL, WL, and storage node sn.

In at least one example, for pulse width modulation based write operation, the difference in voltages between the pulses of PL and BL controls the values or states being written to the MLC. In at least one example, to avoid memory effect caused by writing the same states repeatedly to the MLC, opposite states are written to the MLC prior to writing the desired or target states. In at least one example, the voltage of the BL pulse is modulated relative to the plate-line voltage to write various states to the MLC. Like in pulse width modulation based write operation, in amplitude modulation based write operation, memory effect may be caused by writing the same states repeatedly to the MLC. To avoid writing a wrong state to the MLC, opposite states are written to the MLC prior to writing the desired or target states, in accordance with at least one example.

In at least one example, for read operation, BL acts as a sense-line to sense the multiple states in the MLC. The voltage on BL (e.g., sense voltage) can create disturbance on other bit-lines during read operation. In at least one example, the values read from the MLC are written back to the MLC as part of the read operation. In at least one example, the 1T1C bit-cell is periodically refreshed (e.g., every 1 second). In at least one example, periodic refresh is minimized by refreshing in active mode of operation. In at least one example, in standby mode (e.g., low power mode), the 1T1C bit-cell is not refreshed as there is no disturb mechanism during standby. In at least one example, wear-leveling logic 806 provides one or more endurance mechanisms for the 1T1C memory bit-cells. One of the endurance mechanisms involves refreshing of the data content in the capacitor(s).

Figure 8B:
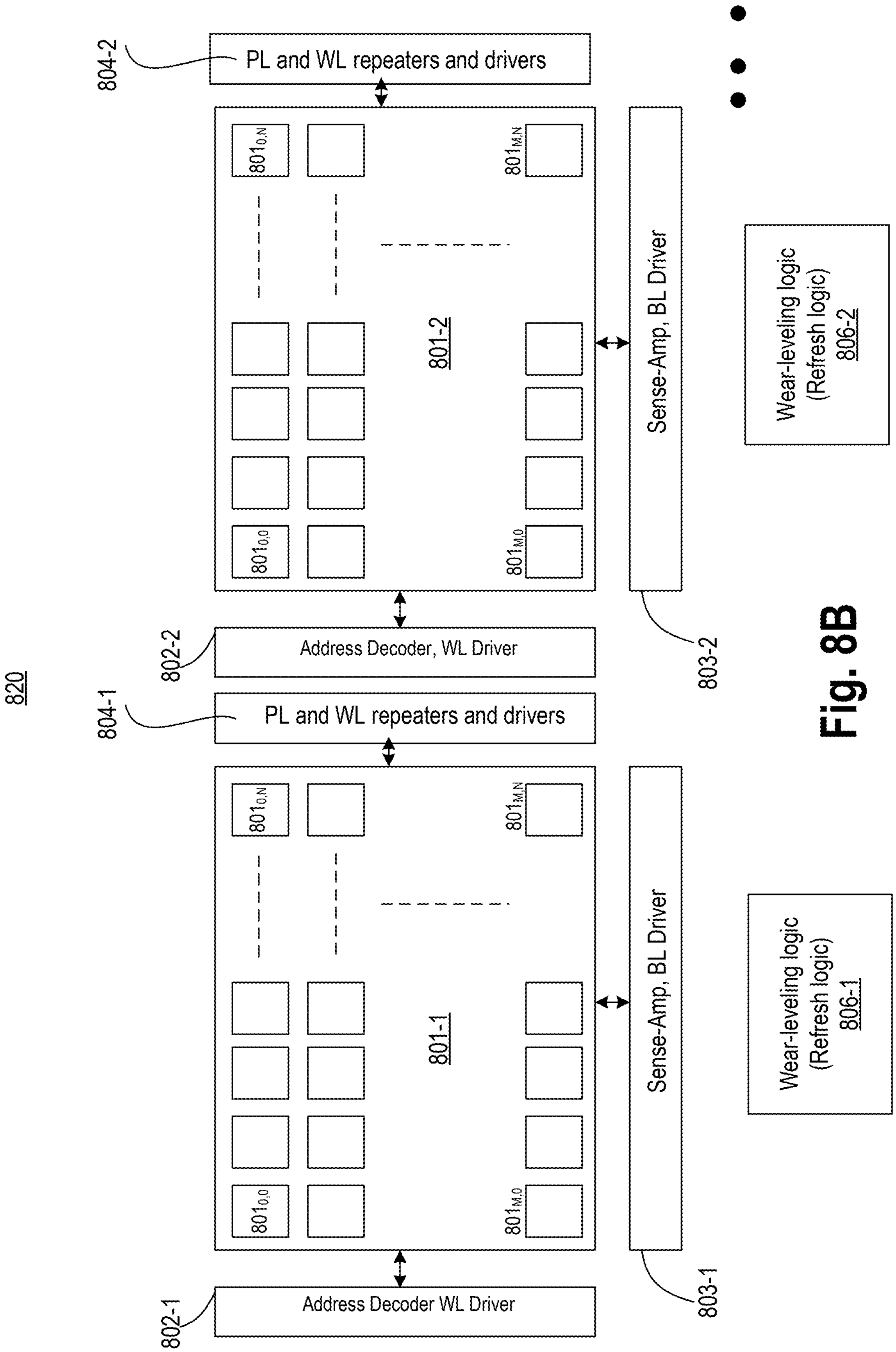
FIG. 8B is a schematic of an FE or PE memory with word-line repeaters, wherein memory arrays of the FE or PE memory have 1T1C bit-cells with the PLs parallel to the WLs, in accordance with at least one example.

FIG. 8B is a schematic of an FE or PE memory with word-line repeaters, wherein memory arrays of the FE or PE memory have 1T1C bit-cells having MLCs and with the PLs parallel to the WLs, in accordance with at least one example. Apparatus 820 illustrates two instances of apparatus 800. The first instance includes first memory array 801-1, logic circuitry 802-1 having first address decoder and/or WL driver, logic circuitry 803-1 having first sense amplifier and BL driver, logic circuitry 804-1 having PL driver and WL repeaters. The second instance includes second memory array 801-2, logic circuitry 802-2 having address decoder and/or WL driver, logic circuitry 803-2 having first sense amplifier and BL driver, and logic circuitry 804-2 having PL driver and WL repeaters.

In at least one example, an individual instance of apparatus 800 includes a corresponding wear-leveling logic 806 (e.g., wear-leveling logic 806-1 and wear-leveling logic 806-2). In at least one example, wear-leveling logic 806 is shared by multiple instances of apparatus 800. In at least one example, when the pulsing scheme described herein is combined with the refresh function by wear-leveling logic 806-1 and wear-leveling logic 806-2, disturb issues on unselected bit-cells are mitigated. While two memory arrays are shown (e.g., array 801-1 and 801-2), any number of arrays may be part of apparatus 820. With PL parallel to the WL and orthogonal to the BL, WL repeaters (e.g., of logic circuitries 804-1, 804-2, etc.) are added to improve the driving strength of the word-line signals. In at least one example, the WL repeaters operate on a higher power supply level (e.g., Vdd+Vboost) to implement WL boosting.

Timing diagrams of various examples here show time-points t1, t2, t3, t4, and onwards. These time points are shown as equally spaced. However, the time points can be separated by any time gap. The timing diagrams or pulsing schemes discussed herein are applicable to a single capacitor based MLC (e.g., capacitor structure 400 and FIG. 7A) or multiple capacitors based MLC (e.g., FIGS. 7B-E).

Figure 9:
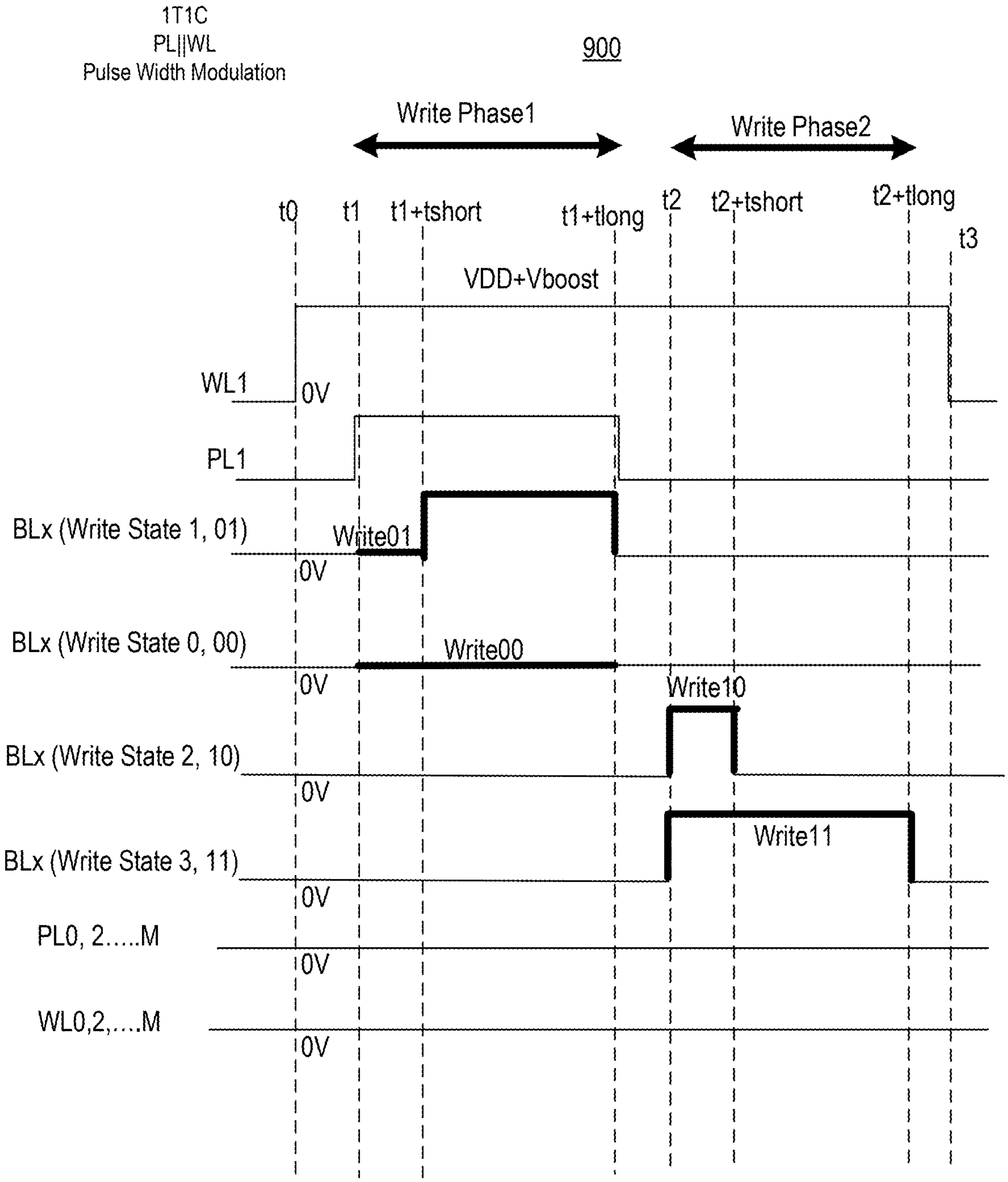
FIG. 9 illustrates a timing diagram for pulse width modulation based multi-level write operation for 1T1C FE or PE memory bit-cells with plate-lines parallel to the word-line, where the write operation involves word-line boosting, in accordance with at least one example.

FIG. 9 illustrates a timing diagram 900 for pulse width modulation based multi-level write operation for 1T1C FE or PE memory bit-cells with plate-lines parallel to the word-line, where the write operation involves word-line boosting, in accordance with at least one example. Depending on whether state0 00, state1 01, state2 10, or state3 11 is being written to the selected capacitor, pulse widths of BL or PL associated with that capacitor of the bit-cell are modulated. Other column multiplexed PLs and WLs that are inactive are forced to 0V, in accordance with at least one example. In this example, column 1 is activated by WL1 and PL1, and one of the bit-cells in that column is selected by a bit-line (e.g., BLx, where x is between 0 and N).

In at least one example, write operation begins when WL is asserted and boosted above Vdd. The boost level is Vboost which may be 10-50% of the nominal supply voltage Vdd. In at least one example, Vboost is about equal to a threshold voltage of transistor MN of the 1T1C bit-cell. WL boosting ensures that the full voltage swing is seen by the MLC of the 1T1C bit-cell, negating the threshold (Vth) drop on the n-type transistor MN. WL boosting enables an overall lower voltage operation on the BL and PL drivers. WL boosting may use higher signal conditioning on the WL drivers.

Since the select transistor MN in these configurations is an n-channel device, it is good at passing the 0V and signals closer to 0V. The signal applied through the BL however, when it is at Vdd, may not pass through transistor MN in full. As such, there is a Vt drop across the transistor MN if the WL is driven to Vdd. In at least one example, to help get the full range of signaling (e.g., 0 to Vdd) across the MLC, WL-boosting helps negate the Vt drop across the transistor such that BL when driven to Vdd, the internal node sn may also see Vdd, as opposed to Vdd-Vt.

In this example, the asserted WL1 is boosted for write operation (e.g., to Vdd+Vboost), and then the selected PL (e.g., PL1) is pulsed to Vdd or set to 0V depending on the states written to the MLC. In at least one example, WL is boosted between time points t0 through t3, and PL is pulsed in the first write phase (write phase 1) between time point t1 and t1+tlong for writing state0 00 and/or state1 01. To write state0 00, the selected BLx is set to 0V or ground for the duration of the PL pulse. To write state1 01, the selected BLx is first set to 0V between time points t1 and t1+ tshort and then to Vdd between time points t1+ tshort and t1+tlong. In at least one example, BLx is de-asserted to 0V prior to de-asserting the selected PL to avoid any glitching in writing state1 01. During write phase 2, state2 10 and/or state3 11 are written. During write phase 2, plate-line is de-asserted and selected BL is toggled to generate a negative PL-BL voltage polarity. In at least one example, to write state2 10, selected bit-line is asserted between time t2 and t2+ tshort while PL is de-asserted resulting in negative PL-BL voltage polarity. After t2+ tshort, the selected bit-line is de-asserted. In at least one example, to write state3 11, selected bit-line is asserted between time t2 and t2+tlong while PL is de-asserted resulting in negative PL-BL voltage polarity. After t2+tlong, the selected bit-line is de-asserted. In various examples, after writing operation is complete, word-line boosting may end as indicated by time point t3.

Table 4 summarizes the write operations for 1T1C bit-cell using pulse width modulation and when PL is parallel to WL.

TABLE 4

| State | Polarization | PL-BL voltage polarity for option 1 and option 2 | Program with pulse width (PW) modulation with same voltage | Write Phase |
|---|---|---|---|---|
| State0, 00 | −pr (e.g., bottom of first polarization loop) | Positive | Large pulse width (e.g., maximum PW) with +Vdd or +Vmax for PL-BL | Write Phase 1 |
| State1, 01 | −pr/3 (e.g., bottom of second polarization loop) | positive | small pulse width (e.g., minimum PW) with +Vdd or +Vmax for PL-BL | Write Phase 1 |
| State2, 10 | +pr/3 (top of second polarization loop) | negative | Small pulse width (e.g., minimum PW) with −Vdd or −Vmax for PL-BL | Write Phase 2 |
| State3, 11 | +pr (e.g., top of first polarization loop) | negative | large pulse width (e.g., minimum PW) with −Vdd or −Vmax for PL-BL | Write Phase 2 |

In at least one example, PLs (e.g., PL0, 2, through M) and WLs (e.g., WL0, 2, through M) for unselected cells are discharged to ground. When a particular bit-cell is being written to, the WL for unselected bit-cells (e.g., WL1 through WLm) remains at 0. Same is done for unselected BLs and PLs (e.g., BLx and PLx) by column multiplexers. In at least one example, the BL or PL are asserted and de-asserted within a pulse width of the boosted WL. In at least one example, the voltage swing for the selected BL and PL is 0 to Vdd. In at least one example, the BL or PL pulse is generated after a predetermined or programmable time from when WL boost starts, and the BL or PL pulse ends within the WL pulse.

Figure 10:
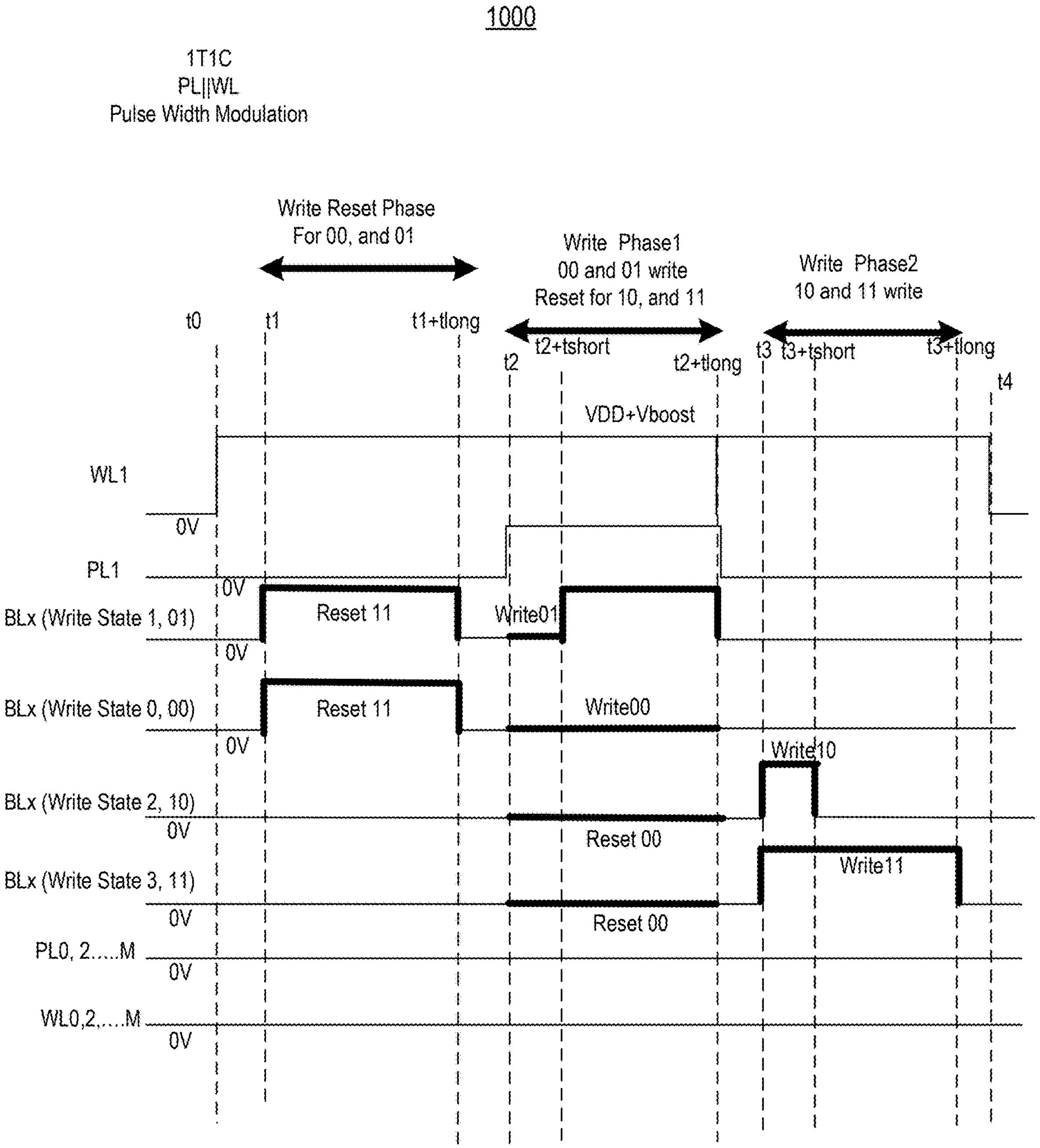
FIG. 10 illustrates a timing diagram for pulse width modulation based multi-level write operation with reset for 1T1C FE or PE memory bit-cells with plate-lines parallel to the word-line, where the write operation involves word-line boosting, in accordance with at least one example.

FIG. 10 illustrates a timing diagram 1000 for pulse width modulation based multi-level write operation with reset for 1T1C FE or PE memory bit-cells with plate-lines parallel to the word-line, where the write operation involves word-line boosting, in accordance with at least one example. When states0, 1, 2, and 3 are repeatedly written to MLC, unintentional memory may be created in the MLC resulting in possible incorrect data programming in some cases. To mitigate the possible programming issue, opposite states may be written to the MLC prior to writing the actual desired or targeted state to the MLC, in accordance with at least one example. In at least one example, state3 11 is written prior to writing state0 00 or state1 01. In at least one example, state0 00 is written prior to writing state2 10 or state3 11.

In this example, the asserted WL1 is boosted for write operation (e.g., to Vdd+Vboost), and then the selected PL (e.g., PL1) is pulsed to Vdd or set to 0V depending on the states written to the MLC. Here, WL is boosted between time points t0 through t4. In at least one example, prior writing state0 00 and/or state1 01, the selected bit-line BLx is asserted from time point t1 to t1+tlong to write state3 11 to the MLC. This phase is referred to as the write reset phase as the state of the MLC is reset to an opposite state prior to writing a state. In the first write phase (write phase 1), at time point t1+tlong, BLx is de-asserted and then the selected PL (e.g., PL1) is pulsed to Vdd between time point t2 and t2+tlong prior writing state0 00 and/or state1 01. In at least one example, to write state0 00, the selected BLx is set to 0V or ground for the duration of the PL pulse. To write state1 01, the selected BLx is first set to 0V between time points t2 and t2+ tshort and then to Vdd between time points t2+ tshort and t2+tlong. In at least one example, BLx is de-asserted to 0V prior to de-asserting the selected PL to avoid any glitching in writing state1 01.

During write phase 2, state2 10 and/or state3 11 are written. Prior to writing these states, the MLC is reset with an opposite state. In at least one example, the opposite state for write phase 2 is written during write phase 1 (e.g., between time point t2 and t2+tlong). In at least one example, state0 00 is written prior to writing state2 10 and/or state3 11 by de-asserting or placing the selected bit-line Blx to ground between time point t2 and t2+tlong. In at least one example, write phase 2 begins between time point t3 and t3+tlong. During write phase 2, plate-line is de-asserted and selected BL is toggled to generate a negative PL-BL voltage polarity. In at least one example, to write state2 10, selected bit-line is asserted between time t3 and t3+ tshort while PL is de-asserted resulting in negative PL-BL voltage polarity. After t3+ tshort, the selected bit-line is de-asserted. In at least one example, to write state3 11, selected bit-line is asserted between time t3 and t3+tlong while PL is de-asserted resulting in negative PL-BL voltage polarity. After t3+tlong, the selected bit-line is de-asserted. In various examples, after writing operation is complete, word-line boosting may end as indicated by time point t4.

In at least one example, PLs (e.g., PL0, 2, through M) and WLs (e.g., WL0, 2, through M) for unselected cells are discharged to ground. When a particular bit-cell is being written to, the WL for unselected bit-cells (e.g., WL1 through WLm) remains at 0. Same is done for unselected BLs and PLs (e.g., BLx and PLx) by column multiplexers.

In at least one example, the BL or PL are asserted and de-asserted within a pulse width of the boosted WL. In at least one example, the voltage swing for the selected BL and PL is 0 to Vdd. In at least one example, the BL or PL pulse is generated after a predetermined or programmable time from when WL boost starts, and the BL or PL pulse ends within the WL pulse.

Figure 11:
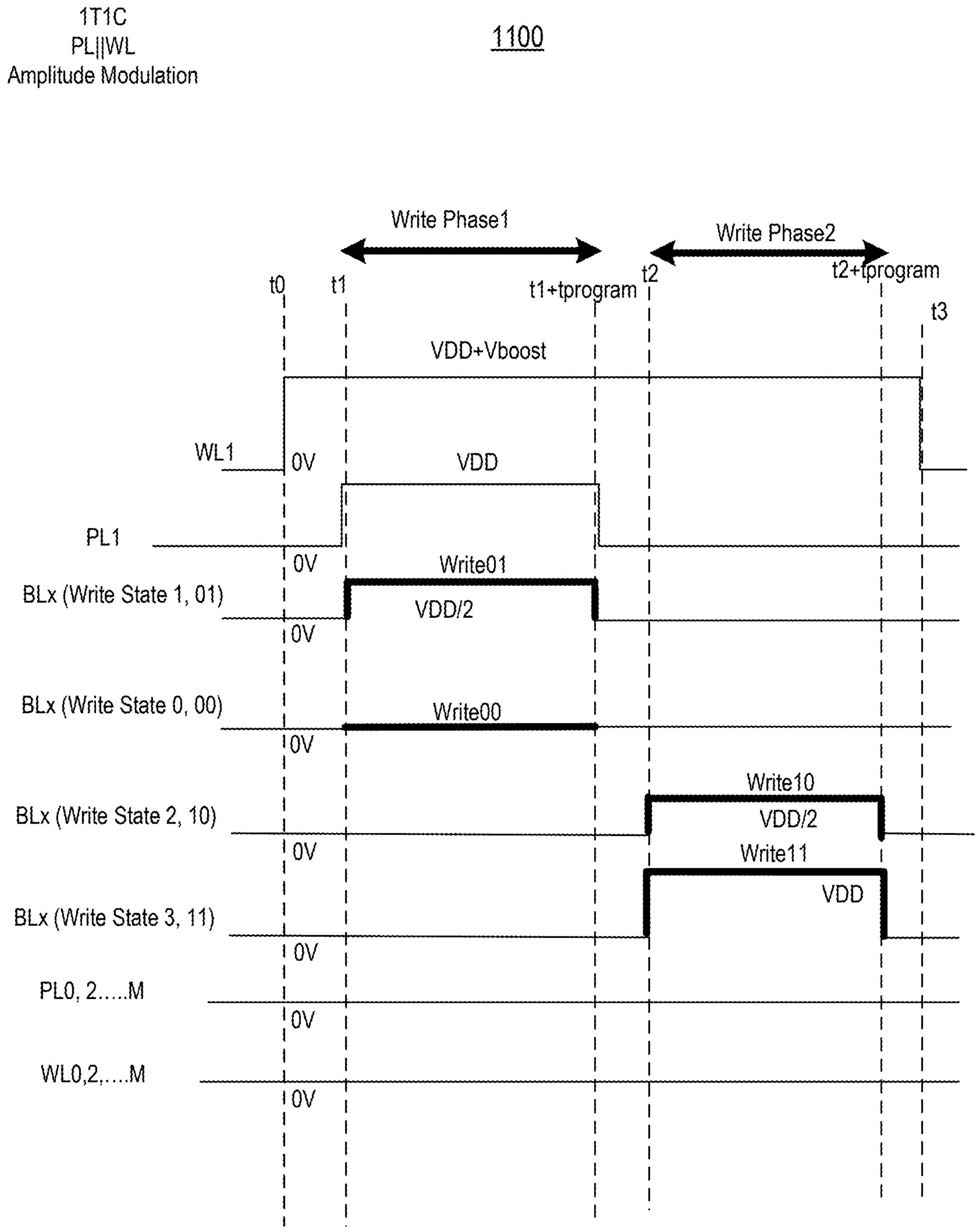
FIG. 11 illustrates a timing diagram for amplitude modulation based multi-level write operation for 1T1C FE or PE memory bit-cells with plate-lines parallel to the word-line, where the write operation involves word-line boosting, in accordance with at least one example.

FIG. 11 illustrates a timing diagram 1100 for amplitude modulation based multi-level write operation for 1T1C FE or PE memory bit-cells with plate-lines parallel to the word-line, where the write operation involves word-line boosting, in accordance with at least one example. Here, instead of pulse width modulation, the pulses for selected PL and BL are kept unchanged while amplitude of BL is modulated to generate the positive and negative polarities for PL-BL. In this example, the asserted WL1 is boosted for write operation (e.g., to Vdd+Vboost), and then the selected PL (e.g., PL1) is pulsed to Vdd or set to 0V depending on the states written to the MLC. Here, WL is boosted between time points t0 through t3.

In at least one example, selected PL (e.g., PL1) is asserted between time point t1 and t1+tprogram prior to writing state0 and state1 to the MLC in the first write phase. To write state0, the selected bit-line BLx is set to 0V like in the pulse modulated scheme of FIGS. 9-10. To write state1 01, the selected bit-line is asserted with a voltage level between Vdd (nominal supply voltage) and ground resulting in positive PL-BL voltage polarity. In this example, the voltage level is Vdd/2. In the second write phase, state2 10 and state3 11 are written. In this phase, selected PL is kept to 0V and BLx amplitude is modulated. In at least one example, to write state2 10, the selected BLx is modulated to Vdd/2 between time point t2 and t2+tprogram resulting in negative PL-BL voltage polarity. In at least one example, to write state3 11, the selected BLx is modulated to Vdd between time point t2 and t2+tprogram resulting in negative PL-BL voltage polarity.

Table 5 summarizes the writing scheme for the MLC based 1T1C memory bit-cell using amplitude modulation.

TABLE 5

| State | Polarization | PL-BL voltage polarity for option 1 and option 2 | Option 2: program with amplitude modulation with same pulse widths | Write Phase |
|---|---|---|---|---|
| State0, 00 | −pr (e.g., bottom of first polarization loop) | Positive | Amplitude of PL-BL is +Vdd or +Vmax | Write Phase 1 |
| State1, 01 | −pr/3 (e.g., bottom of second polarization loop) | positive | Amplitude of PL-BL is positive intermediate voltage +Vint | Write Phase 1 |
| State2, 10 | +pr/3 (top of second polarization loop) | negative | Amplitude of PL-BL is negative intermediate voltage −Vint | Write Phase 2 |
| State3, 11 | +pr (e.g., top of first polarization loop) | negative | Amplitude of PL-BL is −Vdd or −Vmax | Write Phase 2 |

In at least one example, PLs (e.g., PL0, 2, through M) and WLs (e.g., WL0, 2 through M) for unselected cells are discharged to ground. When a particular bit-cell is being written to, the WL for unselected bit-cells (e.g., WL1 through WLM) remains at 0. Same is done for unselected BLs and PLs (e.g., BLx and PLx) by column multiplexers. In at least one example, the BL or PL are asserted and de-asserted within a pulse width of the boosted WL. In at least one example, the voltage swing for the selected BL and PL is 0 to Vdd. In at least one example, the BL or PL pulse is generated after a predetermined or programmable time from when WL boost starts, and the BL or PL pulse ends within the WL pulse.

Figure 12:
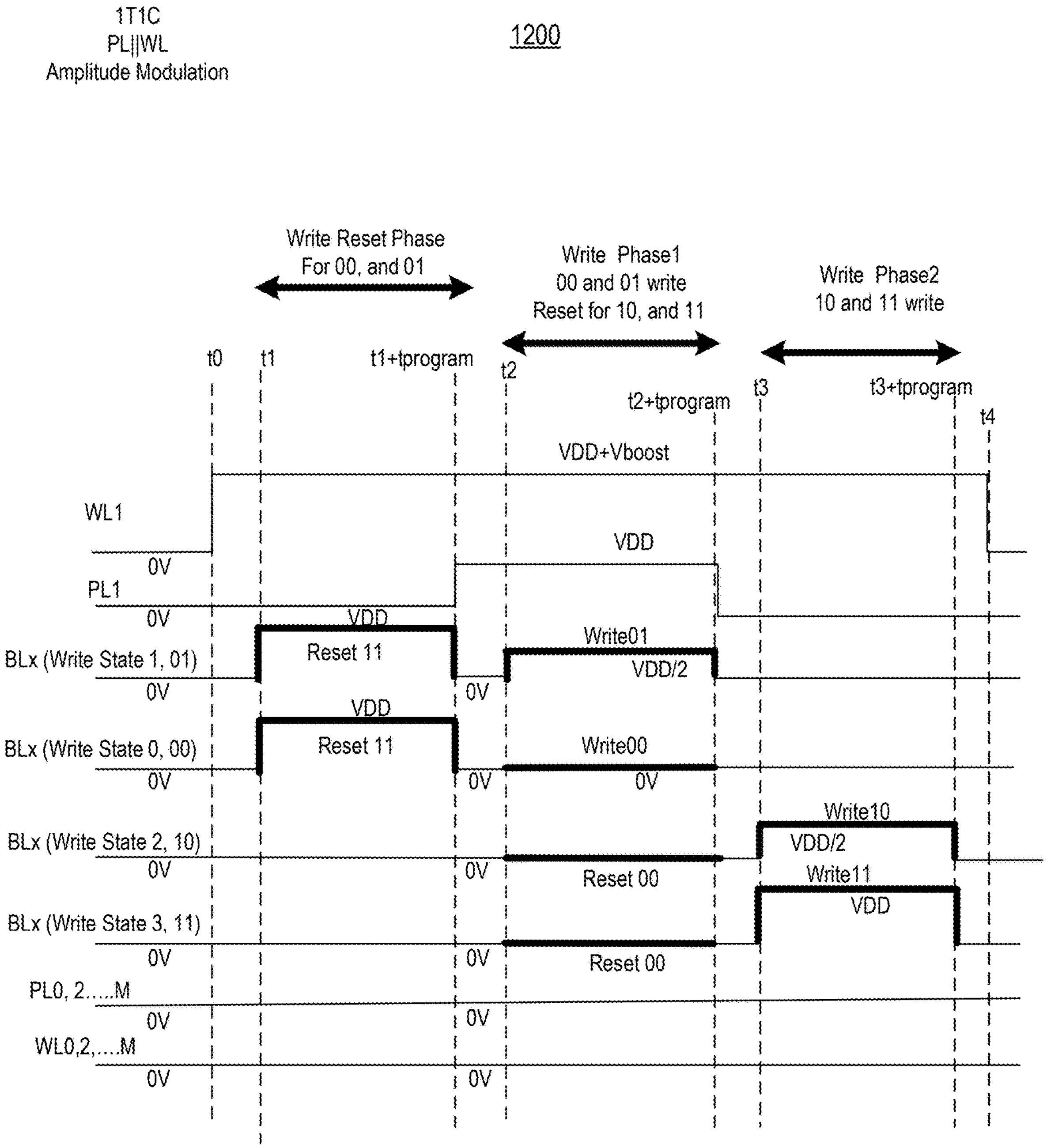
FIG. 12 illustrates a timing diagram for amplitude modulation based multi-level write operation with reset for 1T1C FE or PE memory bit-cells with plate-lines parallel to the word-line, where the write operation involves word-line boosting, in accordance with at least one example.

FIG. 12 illustrates a timing diagram 1200 for amplitude modulation based multi-level write operation with reset for 1T1C FE or PE memory bit-cells with plate-lines parallel to the word-line, where the write operation involves word-line boosting, in accordance with at least one example. When states0, 1, 2, and 3 are repeatedly written to MLC, unintentional memory may be created in the MLC resulting in possible incorrect data programming in some cases. To mitigate the possible programming issue, opposite states may be written to the MLC prior to writing the actual desired or targeted state to the MLC, in accordance with at least one example. In at least one example, state3 11 is written prior to writing state0 00 or state1 01. In at least one example, state0 00 is written prior to writing state2 10 or state3 11.

In this example, the asserted WL1 is boosted for write operation (e.g., to Vdd+Vboost), and then the selected PL (e.g., PL1) is pulsed to Vdd or set to 0V followed by BL amplitude modulation depending on the states written to the MLC. Here, WL is boosted between time points t0 through t4. In at least one example, prior writing state0 00 and/or state1 01, the selected bit-line BLx is asserted from time point t1 to t1+tprogram to write state3 11 to the MLC. This phase is referred to as the write reset phase as the state of the MLC is reset to an opposite state prior to writing a state. In the first write phase (write phase 1), at time point t1+tprogram, BLx is de-asserted and then the selected PL (e.g., PL1) is pulsed to Vdd between time point t2 and t2+tprogram prior writing state0 00 and/or state1 01. In at least one example, to write state0 00, the selected BLx is set to 0V or ground for the duration of the PL pulse. To write state1 01, the selected BLx is set to an intermediate voltage (e.g., Vdd/2) between time points t2 and t2+tprogram. In at least one example, BLx is de-asserted to 0V prior to de-asserting the selected PL to avoid any glitching in writing state1 01.

During write phase 2, state2 10 and/or state3 11 are written. Prior to writing these states, the MLC is reset with an opposite state. In at least one example, the opposite state for write phase 2 is written during write phase 1 (e.g., between time point t3 and t3+tprogram). In at least one example, state0 00 is written prior to writing state2 10 and/or state3 11 by de-asserting or placing the selected bit-line Blx to ground between time point t2 and t2+tlong. In at least one example, write phase 2 begins between time point t3 and t3+tlong. During write phase 2, plate-line is de-asserted and selected BL is amplitude modulated to generate a negative PL-BL voltage polarity. In at least one example, to write state2 10, selected bit-line is modulated to an intermediate voltage (e.g., Vdd/2) between time t3 and t3+tprogram while PL is de-asserted resulting in negative PL-BL voltage polarity. After t3+tprogram, the selected bit-line is de-asserted. In at least one example, to write state3 11, selected bit-line is amplitude modulated to Vdd between time t3 and t3+tprogram while PL is de-asserted resulting in negative PL-BL voltage polarity. After t3+tprogram, the selected bit-line is de-asserted. In various examples, after writing operation is complete, word-line boosting may end as indicated by time point t4.

In at least one example, PLs (e.g., PL0, 2, through M) and WLs (e.g., WL0, 2, through M) for unselected cells are discharged to ground. When a particular bit-cell is being written to, the WL for unselected bit-cells (e.g., WL1 through WLm) remains at 0. Same is done for unselected BLs and PLs (e.g., BLx and PLx) by column multiplexers. In at least one example, the BL or PL are asserted and de-asserted within a pulse width of the boosted WL. In at least one example, the voltage swing for the selected BL and PL is 0 to Vdd. In at least one example, the BL or PL pulse is generated after a predetermined or programmable time from when WL boost starts, and the BL or PL pulse ends within the WL pulse.

Figure 13A:
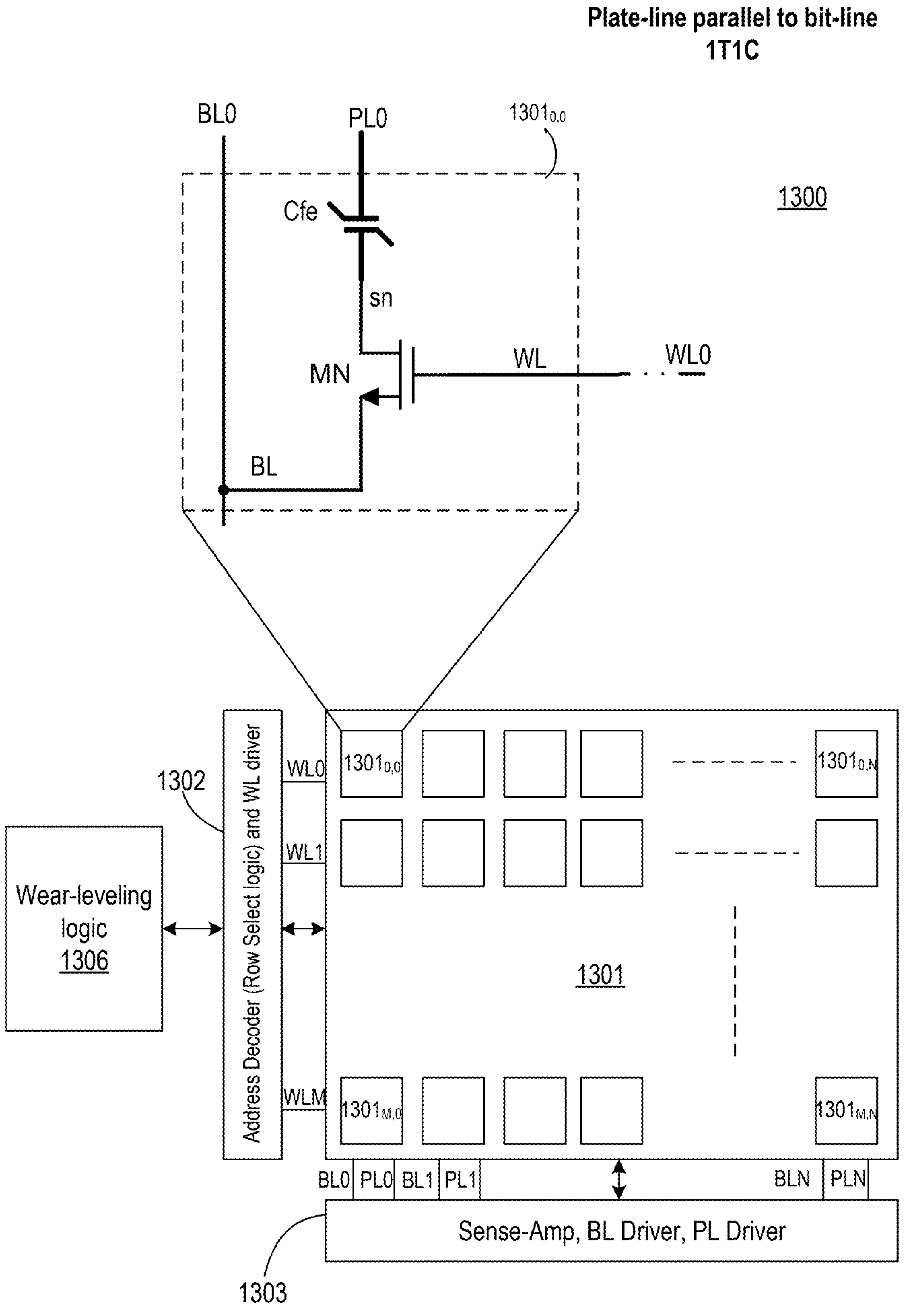
FIG. 13A illustrates an apparatus comprising memory and corresponding logic, wherein the memory comprises FE or PE memory bit-cells, where an individual memory bit-cell includes one transistor and one capacitor (1T1C) with PLs parallel to bit-lines (BLs), wherein the capacitors are configured to store multiple states, in accordance with at least one example.

FIG. 13A is a schematic of an apparatus 1300 comprising memory and corresponding logic, wherein the memory comprises FE or PE memory bit-cells, where an individual memory bit-cell includes one transistor and one capacitor (1T1C) with PLs parallel to bit-lines (BLs), wherein the capacitors are configured to store multiple states, in accordance with at least one example.

In the 1T1C bit-cell case (e.g., bit-cell $\mathbf{1301}_{0,0}$) with PL parallel to BL, the activities seen on an unselected or un-intended bit-cell while performing read/write operations on the same column as that of the selected bit-cell can have large disturb effects on the unselected or unintended bit-cells. This may be true if the PL within the same column toggles (during read or write) a particular value to the desired bit-cell. This signal on the PL of that column, which is shared with other unselected cells, can create a field across the non-linear polar material based capacitors or devices of the unselected cells. The field across the unselected non-linear polar material based MLC or devices is a function of the dielectric component of individual non-linear polar material based capacitors or devices and the total capacitance on the storage node sn of those bit-cells. In at least one example, since in the 1T1C bit-cells the storage capacitor may have much larger capacitance load when parallel capacitors are used to form the MLC, the activity seen on the unselected bit-line can result into almost all voltage getting dropped across the ferroelectric capacitors (e.g., Vfe=Vpl*(Cp/(Cfed+Cp), which creates a disturb effect, which in turn causes unintentional modification of the polarization stage of the ferroelectric capacitor. The pulsing scheme of various examples and the endurance mechanisms can mitigate disturbances on unselected bit-cells, in accordance with at least one example.

Apparatus 1300 comprises M×N memory array 1301 of bit-cells, logic circuitry 1302 for address decoding and write driver, and logic circuitry 1303 for sense amplifier, plate-line (PL) drivers and BL drivers. Plate-lines PL0, PL1 through PLN are parallel to bit-lines BL0, BL1 through BLM, while word-lines WL0, WL1, through WLM are orthogonal to the plate-lines and the bits-lines, where 'N' and 'M' are numbers greater than 1. In at least one example, PL parallel to BL scheme (as shown for memory array 1301) enables easier column multiplexing at a sense-side resulting into better array efficiency, faster read, and faster write at the cost of increased energy as PL parasitics toggling energy cost is on a per-cell basis. In at least one example, a PL parallel to BL scheme may have a higher disturb on unselected lines, as opposed to the PL parallel to WL scheme, and may use sharper ferroelectric transition loops. In at least one example, a PL parallel to BL scheme may use periodic refresh when a memory bank is active.

Each memory bit-cell in memory array 1301 is organized in rows and columns. For example, memory bit-cells $\mathbf{1301}_{0,0}$ through $\mathbf{1301}_{M,N}$ are organized in an array. In at least one example, memory bit-cell 1301 (e.g., $\mathbf{1301}_{0,0}$) comprises one select or access transistor MN and MLC comprising non-linear polar material (e.g., ferroelectric, paraelectric, or non-linear dielectric). The MLC can be a planar or non-planar capacitor as described with reference to various examples discussed herein.

In at least one example, for pulse width modulation based write operation, the difference in voltages between the pulses of PL and BL controls the values or states being written to the MLC. In at least one example, to avoid memory effect caused by writing the same states repeatedly to the MLC, opposite states are written to the MLC prior to writing the desired or target states. In at least one example, the voltage of the BL pulse is modulated relative to the plate-line voltage to write various states to the MLC. Like in pulse width modulation based write operation, in amplitude modulation based write operation, memory effect may be caused by writing the same states repeatedly to the MLC. To avoid writing a wrong state to the MLC, opposite states are written to the MLC prior to writing the desired or target states, in accordance with at least one example.

In at least one example, for read operation, BL acts as a sense-line to sense the multiple states in the MLC. The voltage on BL (e.g., sense voltage) can create disturbance on other bit-lines during read operation. In at least one example, the values read from the MLC are written back to the MLC as part of the read operation. In at least one example, the 1T1C bit-cell is periodically refreshed (e.g., every 1 second). In at least one example, periodic refresh is minimized by refreshing in active mode of operation. In at least one example, in standby mode (e.g., low power mode), the 1T1C bit-cell is not refreshed as there is no disturb mechanism during standby. In at least one example, wear-leveling logic 1306 provides one or more endurance mechanisms for the 1T1C memory bit-cells. One of the endurance mechanisms involves refreshing of the data content in the capacitor(s).

Figure 13B:
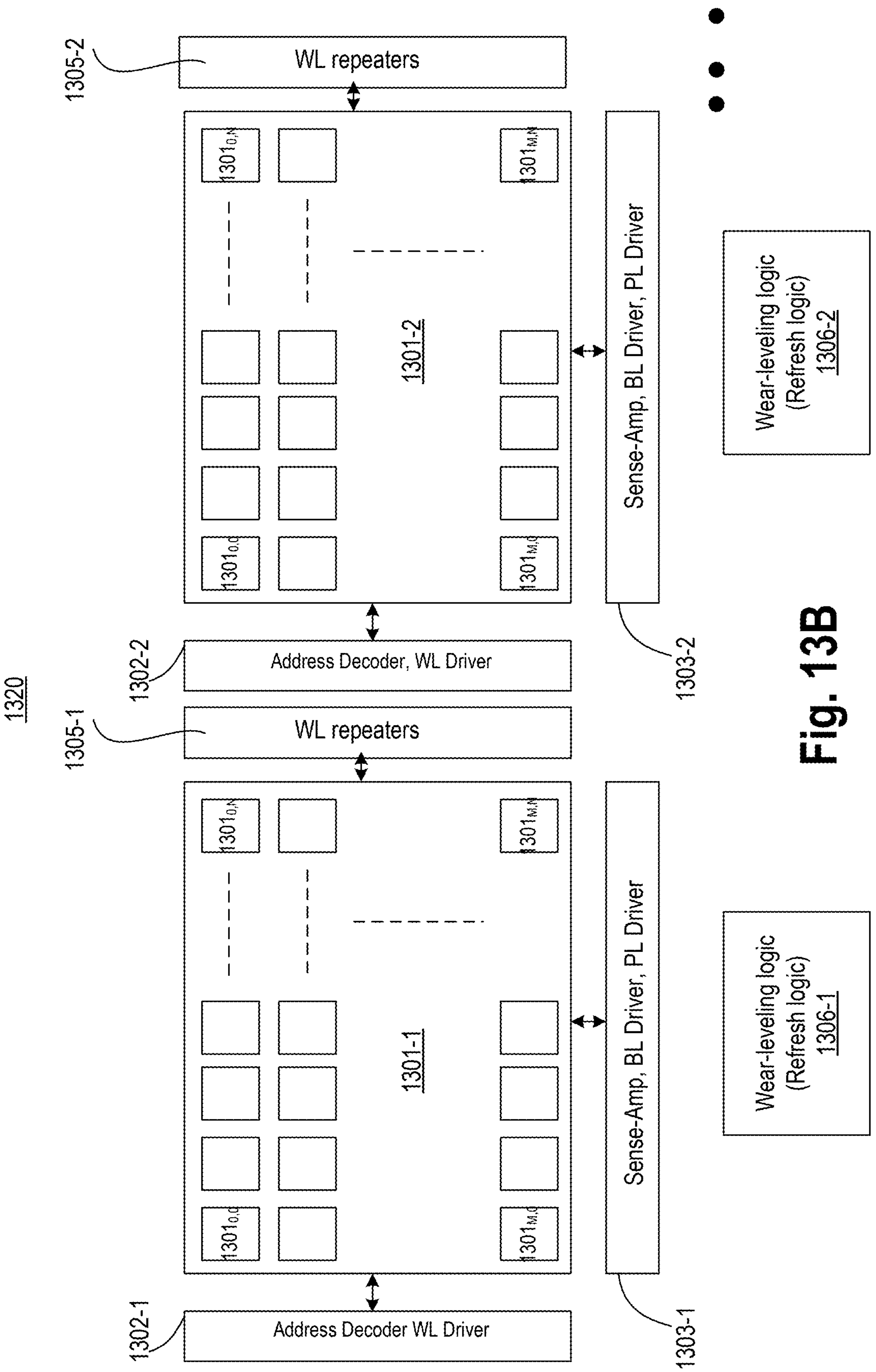
FIG. 13B illustrates an FE or PE memory with word-line repeaters, wherein memory arrays of the FE or PE memory have 1T1C bit-cells with the PLs parallel to the BLs, in accordance with at least one example.

FIG. 13B is a schematic of an apparatus 1320 having an FE or PE memory with word-line repeaters, wherein memory arrays of the FE or PE memory have 1T1C bit-cells with the PLs parallel to the BLs, in accordance with at least one example. Apparatus 1320 illustrates two instances of apparatus 1300. The first instance includes first memory array 1301-1, logic circuitry 1302-1 having first address decoder and/or WL driver, logic circuitry 1303-1 having first sense amplifier and BL driver and PL driver, and logic circuitry 1305-1 having WL repeaters and/or WL drivers. The second instance includes second memory array 1301-2, logic circuitry 1302-2 having address decoder and/or WL driver, logic circuitry 1303-2 having first sense amplifier and BL driver and PL driver, and logic circuitry 1305-2 having WL repeaters and/or WL drivers.

In at least one example, an individual instance of apparatus 1300 includes a corresponding wear-leveling logic 1306 (e.g., wear-leveling logic 1306-1 and wear-leveling logic 1306-2). In at least one example, wear-leveling logic 1306 is shared by multiple instances of apparatus 1300. In at least one example, when the pulsing scheme described herein is combined with the refresh function by wear-leveling logic 1306-1 and wear-leveling logic 1306-2, disturb issues on unselected bit-cells are mitigated. While two memory arrays are shown (e.g., array 1301-1 and 1301-2), any number of arrays may be part of apparatus 1320. With PL parallel to the WL and orthogonal to the BL, WL repeaters (e.g., of logic circuitries 1305-1, 1305-2, etc.) are added to improve the driving strength of the word-line signals. In at least one example, the WL repeaters operate on a higher power supply level (e.g., Vdd+Vboost) to implement WL boosting.

Figure 14:
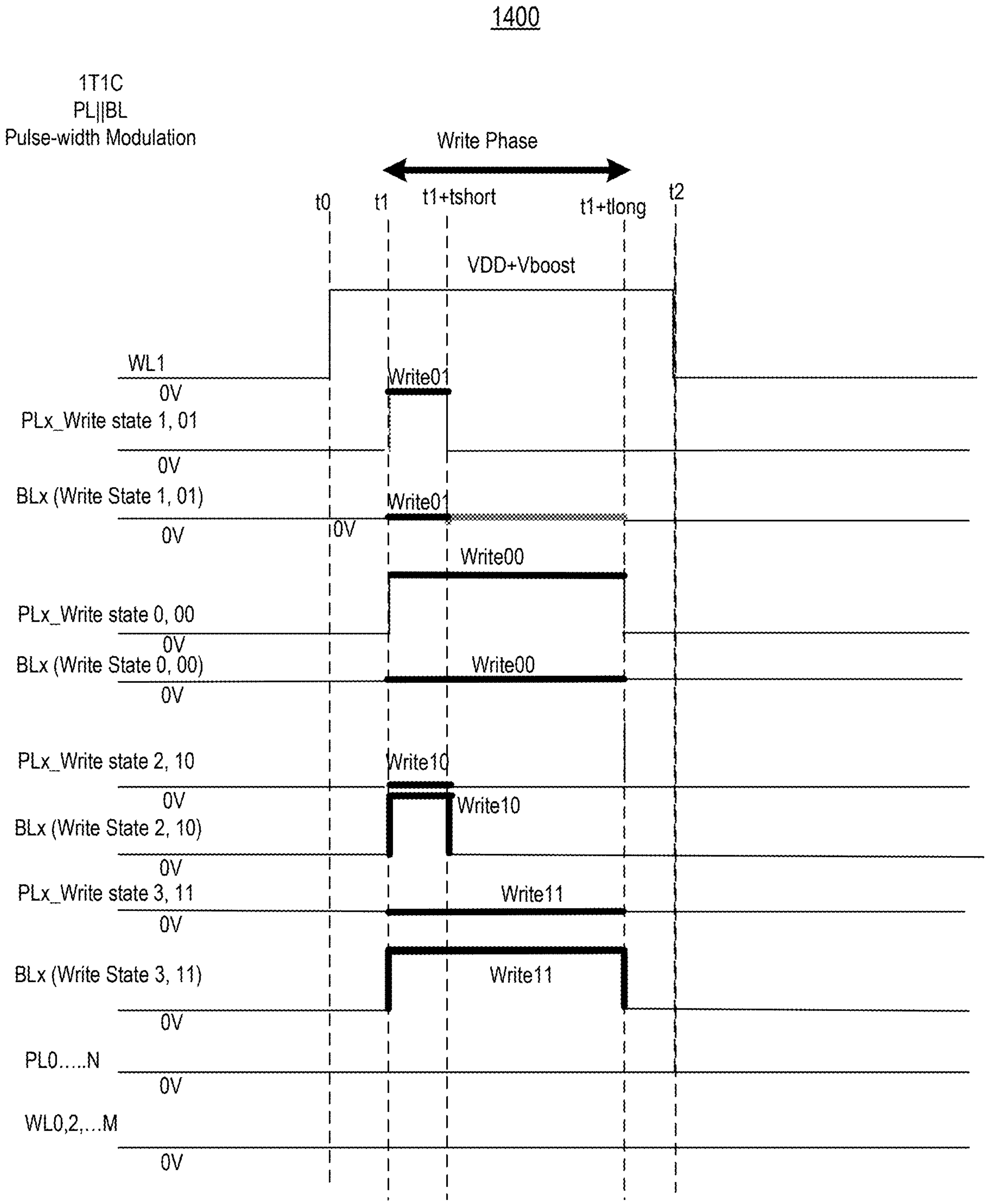
FIG. 14 illustrates a timing diagram for pulse width modulation based multi-level write operation for 1T1C FE or PE memory bit-cells with PLs parallel to BLs, where the write operation involves word-line boosting, in accordance with at least one example.

FIG. 14 illustrates a timing diagram 1400 for pulse width modulation based multi-level write operation for 1T1C FE or PE memory bit-cells with PLs parallel to BLs, where the write operation involves word-line boosting, in accordance with at least one example. In at least one example, while the PL parallel to BL scheme and the PL parallel to WL scheme invoke the same concept with respect to device level properties, the pulsing schemes are different, since the PL parallel to WL scheme has a shared PL along all the bit-cell(s) that are active for a selected WL. In at least one example, a time separation of different write phases is implemented in the PL parallel to WL scheme (See, for example, FIG. 11), which may make it a longer and slower operation. The array efficiency may also be lower with the PL parallel to WL scheme due to complexity in the sensing architecture. As discussed herein, the PL parallel to WL scheme results in lower energy and lower disturbance. In at least one example, in the PL parallel to BL scheme, the array efficiency is better compared to the PL parallel to WL case as the design for the PL parallel to BL case lends itself to better column-multiplexing. In at least one example, for the PL parallel to BL case, the write and read operations faster, as each active PL and BL lines and drivers are on a per bit-cell basis. This faster operation may result in higher energy cost from the toggling of PL, and may have higher disturbance due to unselected bit-cells seeing the toggling of the PL. Toggling of the PL may cause small electric field buildup across the unselected bit-cells within the design. In the PL parallel to BL case, sharper ferroelectric properties may be desired, and may use periodic refresh while the memory bank is active, in accordance with at least one example.

In at least one example, depending on whether state0 00, state1 01, state2 10, or state3 11 is being written to the selected capacitor, pulse widths of BL or PL associated with the selected capacitor of the bit-cell are modulated. Other column multiplexed PLs and WLs that are inactive are forced to 0V, in accordance with at least one example. In this example, column 1 is activated by WL1, and one of the bit-cells in that column is selected by a bit-line (e.g., BLx, where x is between 0 and N) and a plate-line (e.g., PLx where x is between 0 and N).

In at least one example, write operation begins when WL is asserted and boosted above Vdd. The boost level is Vboost which may be 10-50% of the nominal supply voltage Vdd. In at least one example, Vboost is about equal to a threshold voltage of transistor MN of the 1T1C bit-cell. WL boosting ensures that the full voltage swing is seen by the MLC of the 1T1C bit-cell, negating the threshold (Vth) drop on the n-type transistor MN. WL boosting enables an overall lower voltage operation on the BL and PL drivers. WL boosting may use higher signal conditioning on the WL drivers.

Since the select transistor MN in these configurations is an n-channel device, it is good at passing the 0V and signals closer to 0V. The signal applied through the BL however, when it is at Vdd, may not pass through transistor MN in full. As such, there is a Vt drop across the transistor MN if the WL is driven to Vdd. In at least one example, to help get the full range of signaling (e.g., 0 to Vdd) across the MLC, WL-boosting helps negate the Vt drop across the transistor such that BL when driven to Vdd, the internal node sn may also see Vdd, as opposed to Vdd-Vt.

In this example, the asserted WL1 is boosted for write operation (e.g., to Vdd+Vboost), and then the selected PL (e.g., PL1) and BL are pulsed to Vdd or set to 0V depending on the states written to the MLC. In at least one example, WL is boosted between time points t0 through t2, and PL is pulsed between time point t1 and t1+tlong for writing state0 00. To write state0 00, the selected BLx is set to 0V or ground for the duration of the PL pulse to generate a negative PL-BL voltage polarity. To write state1 01, the selected PLx is pulsed to Vdd between time points t1 and t1+tshort while BLx is set to 0V between time points t1 and t1+tshort.

To write state2 10 and state3 11, plate-line is de-asserted to ground and selected BL is toggled to generate a negative PL-BL voltage polarity. In at least one example, to write state2 10, selected bit-line is asserted between time t2 and t2+ tshort while PL is de-asserted resulting in negative PL-BL voltage polarity. In at least one example, to write state3 11, selected bit-line is asserted between time t1 and t1+tlong while PL remains de-asserted resulting in negative PL-BL voltage polarity. After t1+tlong, the selected bit-line is de-asserted. In various examples, after writing operation is complete, word-line boosting may end as indicated by time point t2.

In at least one example, PLs and WLs (e.g., WL0, 2, through M) for unselected cells are discharged to ground. When a particular bit-cell is being written to, the WL for unselected bit-cells (e.g., WL1 through WLM) remains at 0. Same is done for unselected BLs and PLs (e.g., BLx and PLx) by column multiplexers. In at least one example, the BL or PL are asserted and de-asserted within a pulse width of the boosted WL. In at least one example, the voltage swing for the selected BL and PL is 0 to Vdd. In at least one example, the BL or PL pulse is generated after a predetermined or programmable time from when WL boost starts, and the BL or PL pulse ends within the WL pulse.

Figure 15:
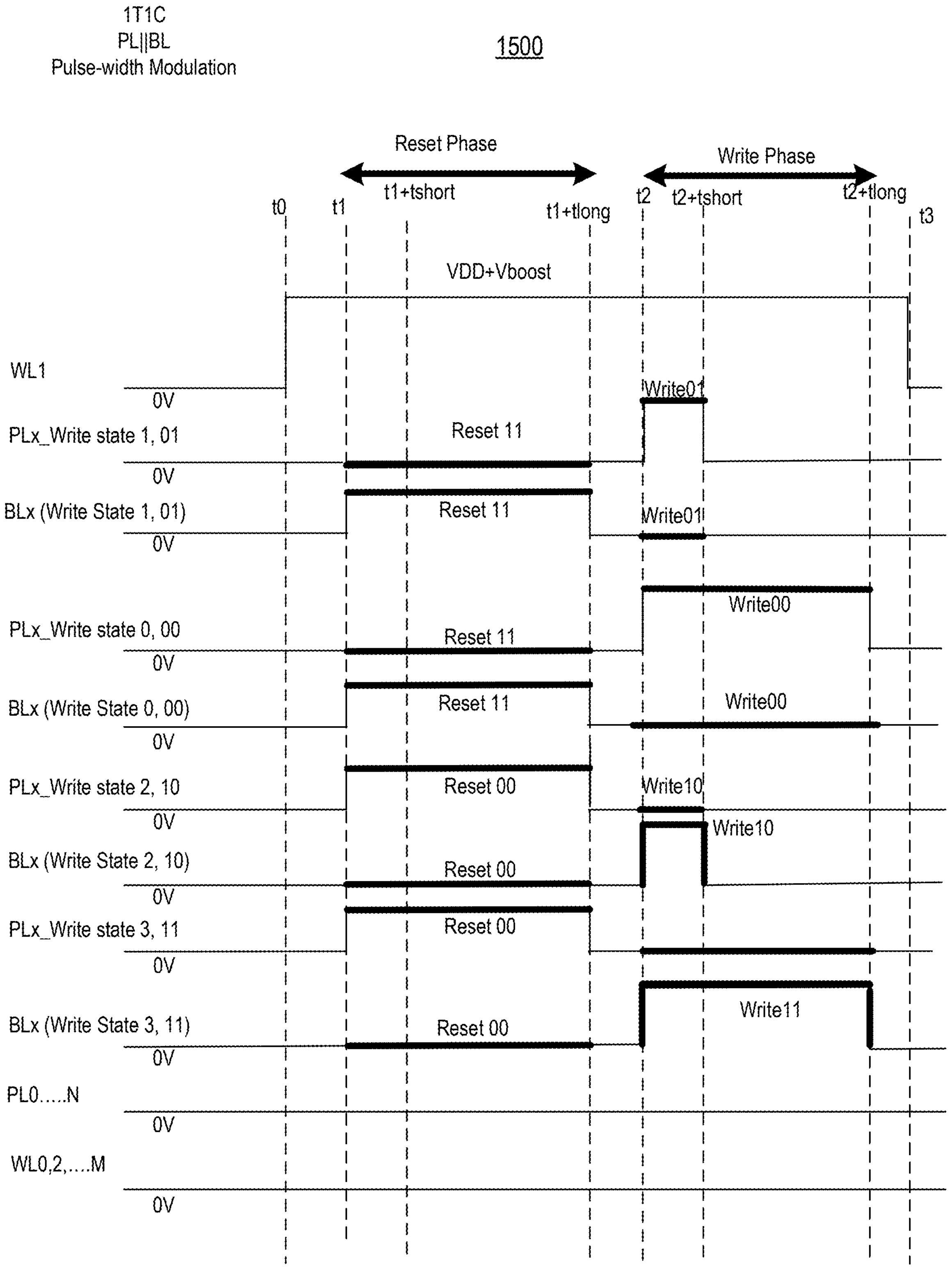
FIG. 15 illustrates a timing diagram for pulse width modulation based multi-level write operation with reset for 1T1C FE or PE memory bit-cells with PLs parallel to BLs, where the write operation involves word-line boosting, in accordance with at least one example.

FIG. 15 illustrates a timing diagram 1500 for pulse width modulation based multi-level write operation with reset for 1T1C FE or PE memory bit-cells with PLs parallel to BLs, where the write operation involves word-line boosting, in accordance with at least one example. When states0, 1, 2, and 3 are repeatedly written to MLC, unintentional memory may be created in the MLC resulting in possible incorrect data programming in some cases. To mitigate the possible programming issue, opposite states may be written to the MLC prior to writing the actual desired or targeted state to the MLC, in accordance with at least one example. In at least one example, state3 11 is written prior to writing state0 00 or state1 01. In at least one example, state0 00 is written prior to writing state2 10 or state3 11.

In this example, the asserted WL1 is boosted for write operation (e.g., to Vdd+Vboost), and then the selected PL and BL are pulsed to Vdd or set to 0V depending on the states written to the MLC. Here, WL is boosted between time points t0 through t3. In at least one example, prior to writing state0 00 and/or state1 01, the selected bit-line BLx is asserted to Vdd from time point t1 to t1+tlong to write state3 11 to the MLC while selected PLx is set to 0V. This phase is referred to as the write reset phase as the state of the MLC is reset to an opposite state prior to writing a state. At time point t2, BLx is de-asserted to 0V and then the selected PLx is pulsed to Vdd between time point t2 and t2+tlong to write state0 00. In at least one example, to write state0 00, the selected BLx is set to 0V or ground for the duration of the PL pulse to generate a positive PL-BL voltage polarity.

To write state1 01, the selected BLx is first pulsed to Vdd while selected PLx is set to 0V between time points t1 and t1+tlong. These conditions for selected BLx and PLx allow to write state3 11 to the MLC. Thereafter, state1 01 is written by setting the selected BLx to 0V and pulsing the selected PLx to Vdd between time points t2 and t2+ tshort to generate a positive PL-BL voltage polarity.

To write state2 10, the MLC is reset with an opposite state of state0 00, in accordance with at least one example. In at least one example, state0 00 is written during the reset write phase by pulsing or asserting the selected plate-line PLx to Vdd between time points t1 and t1+tlong and keeping the selected bit-line to 0V. Thereafter, state2 10 is written by de-asserting the selected PLx to 0V and pulsing the selected BLx to Vdd between time point t2 and t2+ tshort to generate a negative PL-BL voltage polarity.

To write state2 11, the MLC is reset with an opposite state of state0 00, in accordance with at least one example. In at least one example, state0 00 is written during the reset write phase by pulsing or asserting the selected plate-line PLx to Vdd between time points t1 and t1+tlong and keeping the selected bit-line to 0V. Thereafter, state3 11 is written by de-asserting the selected PLx to 0V and pulsing the selected BLx to Vdd between time point t2 and t2+tlong to generate a negative PL-BL voltage polarity. In various examples, after writing operation is complete, word-line boosting may end as indicated by time point t3.

In at least one example, PLs and WLs for unselected cells are discharged to ground. When a particular bit-cell is being written to, the WL for unselected bit-cells (e.g., WL1 through WLm) remains at 0. Same is done for unselected PLs by column multiplexers. In at least one example, the BL or PL are asserted and de-asserted within a pulse width of the boosted WL. In at least one example, the voltage swing for the selected BL and PL is 0 to Vdd. In at least one example, the BL or PL pulse is generated after a predetermined or programmable time from when WL boost starts, and the BL or PL pulse ends within the WL pulse.

Figure 16:
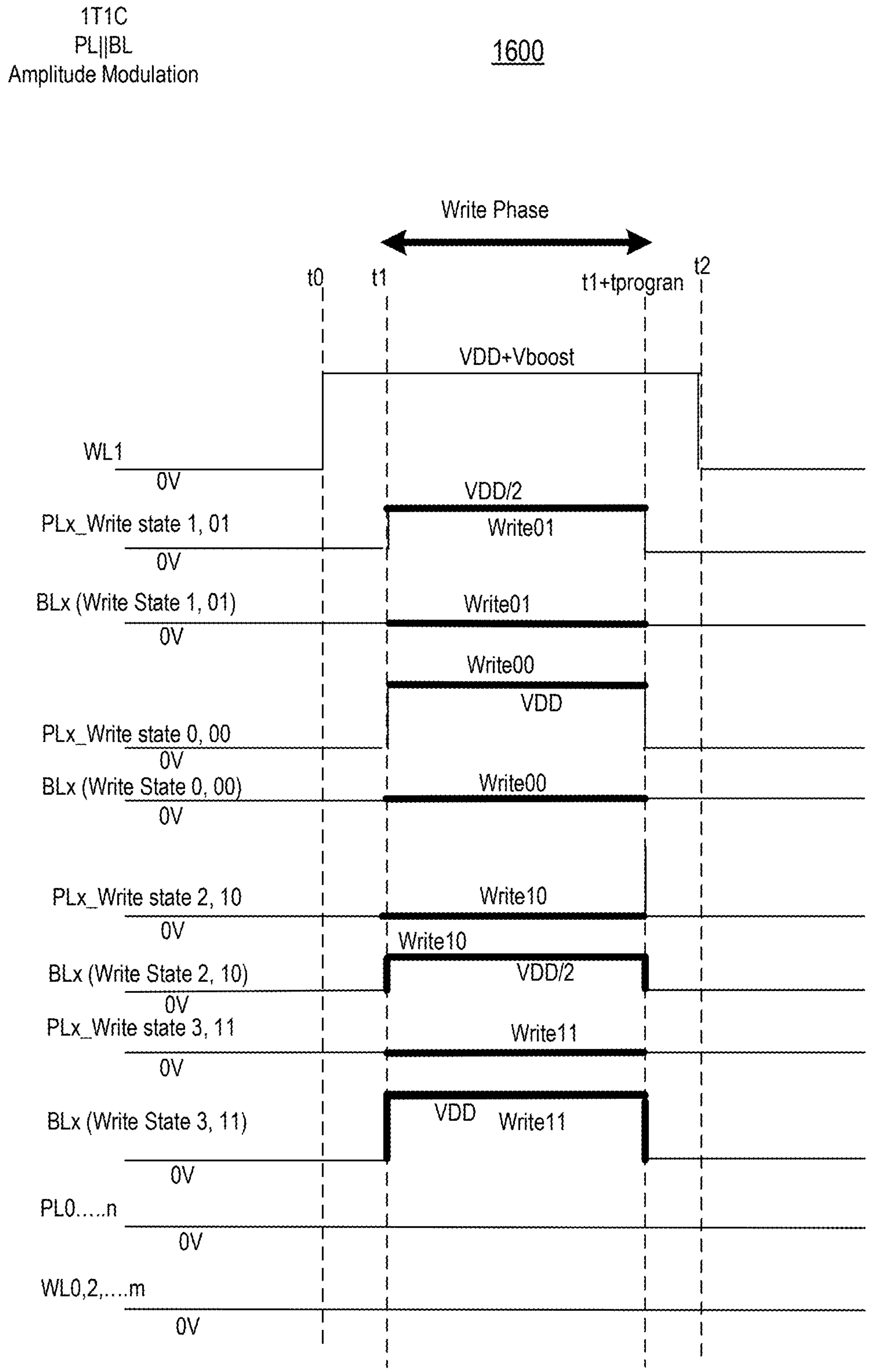
FIG. 16 illustrates a timing diagram for amplitude modulation based multi-level write operation for 1T1C FE or PE memory bit-cells with PLs parallel to BLs, where the write operation involves word-line boosting, in accordance with at least one example.

FIG. 16 illustrates a timing diagram 1600 for amplitude modulation based multi-level write operation for 1T1C FE or PE memory bit-cells with PLs parallel to BLs, where the write operation involves word-line boosting, in accordance with at least one example. Here, instead of pulse width modulation, the pulses for selected PL and BL are kept unchanged while amplitude of BL is modulated to generate the positive and negative polarities for PL-BL. In this example, the asserted WL1 is boosted for write operation (e.g., to Vdd+Vboost), and then the selected PL (e.g., PL1) and/or selected BL are amplitude modulated depending on the states written to the MLC. Here, WL is boosted between time points t0 through t2.

In at least one example, to write state0 00, the selected PLx is asserted to Vdd between time point t1 and t1+tprogram while selected bit-line (BLx) is de-asserted to 0V to generate a positive polarity for PL-BL. In at least one example, to write state1 01, the selected PLx is asserted to an intermediate voltage (e.g., Vdd/2) between time point t1 and t1+tprogram while selected bit-line (BLx) is de-asserted to 0V to generate a positive polarity for PL-BL.

In at least one example, to write state2 10, the selected PLx is asserted to an intermediate voltage (e.g., Vdd/2) between time point t1 and t1+tprogram while selected bit-line (BLx) is de-asserted to 0V to generate a negative polarity for PL-BL. In at least one example, to write state3 11, the selected PLx is de-asserted to 0V while selected bit-line (BLx) is asserted to Vdd between time point t1 and t1+tprogram to generate a negative polarity for PL-BL.

In at least one example, PLs and WLs for unselected cells are discharged to ground. When a particular bit-cell is being written to, the WL for unselected bit-cells (e.g., WL1 through WLm) remains at 0. Same is done for unselected PLs by column multiplexers. In at least one example, the BL or PL are asserted and de-asserted within a pulse width of the boosted WL. In at least one example, the BL or PL pulse is generated after a predetermined or programmable time from when WL boost starts, and the BL or PL pulse ends within the WL pulse.

Figure 17:
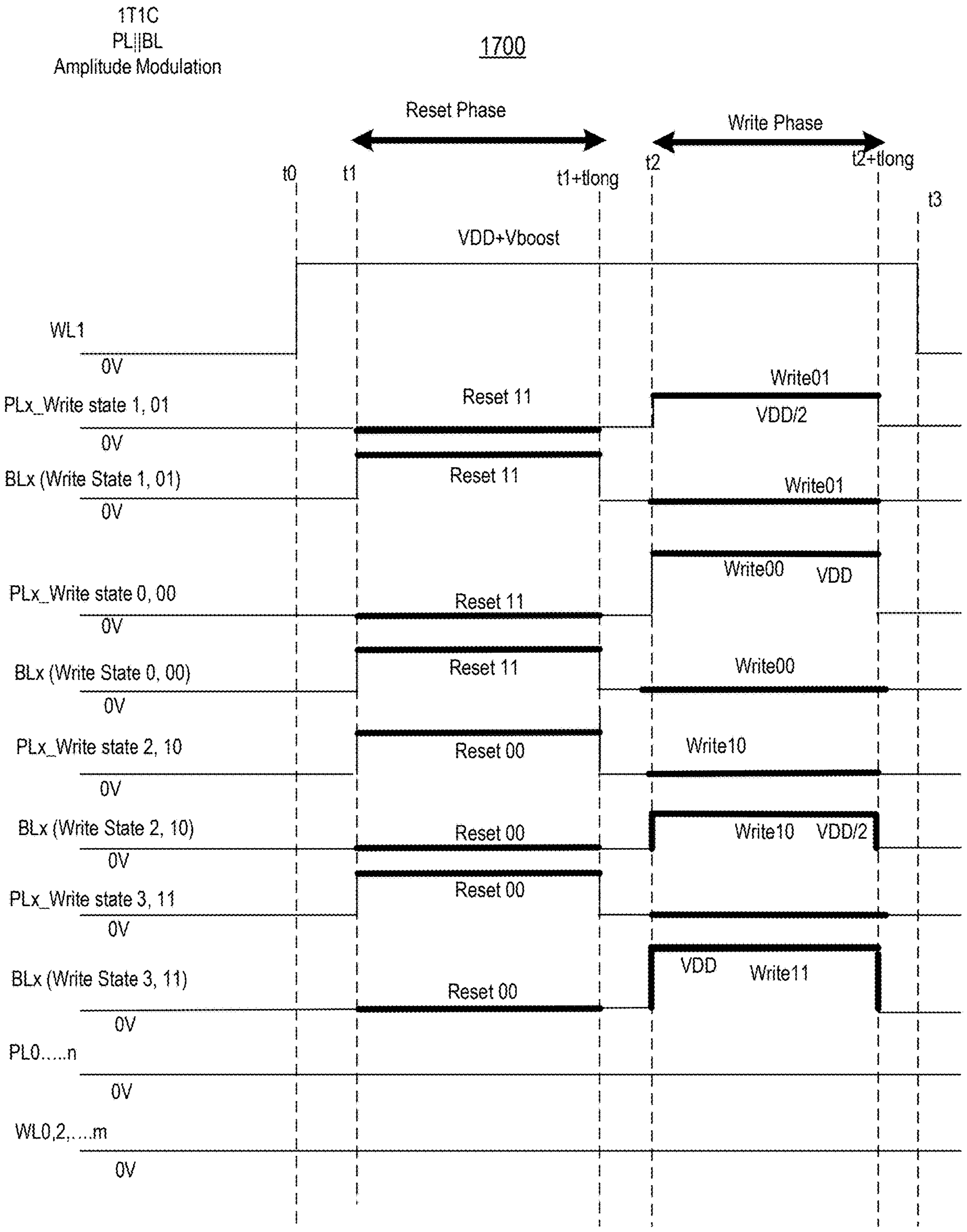
FIG. 17 illustrates a timing diagram for amplitude modulation based multi-level write operation with reset for 1T1C FE or PE memory bit-cells with PLs parallel to BLs, where the write operation involves word-line boosting, in accordance with at least one example.

FIG. 17 illustrates a timing diagram 1700 for amplitude modulation based multi-level write operation with reset for 1T1C FE or PE memory bit-cells with PLs parallel to BLs, where the write operation involves word-line boosting, in accordance with at least one example. When states0, 1, 2, and 3 are repeatedly written to MLC, unintentional memory may be created in the MLC resulting in possible incorrect data programming in some cases. To mitigate the possible programming issue, opposite states may be written to the MLC prior to writing the actual desired or targeted state to the MLC, in accordance with at least one example. In at least one example, state3 11 is written prior to writing state0 00 or state1 01. In at least one example, state0 00 is written prior to writing state2 10 or state3 11.

In this example, the asserted WL1 is boosted for write operation (e.g., to Vdd+Vboost), and then the selected PL and BL are pulsed to Vdd or set to 0V depending on the states written to the MLC. Here, WL is boosted between time points t0 through t3. In at least one example, prior to writing state0 00 and/or state1 01, the selected bit-line BLx is asserted to Vdd from time point t1 to t1+tlong to write state3 11 to the MLC while selected PLx is set to 0V. This phase is referred to as the write reset phase as the state of the MLC is reset to an opposite state prior to writing a state. At time point t2, BLx is de-asserted to 0V and then the selected PLx is pulsed to Vdd between time point t2 and t2+tlong to write state0 00. In at least one example, to write state0 00, the selected BLx is set to 0V or ground for the duration of the PL pulse to generate a psotive PL-BL voltage polarity. To write state1 01, after state3 11 is written to the MLC, the selected PLx is pulsed to an intermediate voltage (e.g., Vdd/2) while the selected BLx is set to 0V between time points t2 and t2+tlong to generate a positive PL-BL voltage polarity.

To write state2 10 or state3 11, the MLC is reset with an opposite state of state0 00, in accordance with at least one example. In at least one example, state0 00 is written during the reset write phase by pulsing or asserting the selected plate-line PLx to Vdd between time points t1 and t1+tlong and keeping the selected bit-line to 0V. Thereafter, state2 10 is written by de-asserting the selected PLx to 0V and pulsing the selected BLx to an intermediate voltage (e.g., Vdd/2) between time point t2 and t2+tlong to generate a negative PL-BL voltage polarity. After resetting the MLC with state0 00, state3 11 is written by de-asserting the selected PLx to 0V and pulsing the selected BLx to Vdd between time point t2 and t2+tlong to generate a negative PL-BL voltage polarity. In various examples, after writing operation is complete, word-line boosting may end as indicated by time point t3.

In at least one example, PLs and WLs for unselected cells are discharged to ground. When a particular bit-cell is being written to, the WL for unselected bit-cells (e.g., WL1 through WLM) remains at 0. Same is done for unselected PLs by column multiplexers. In at least one example, the BL or PL are asserted and de-asserted within a pulse width of the boosted WL. In at least one example, the BL or PL pulse is generated after a predetermined or programmable time from when WL boost starts, and the BL or PL pulse ends within the WL pulse.

Figure 18:
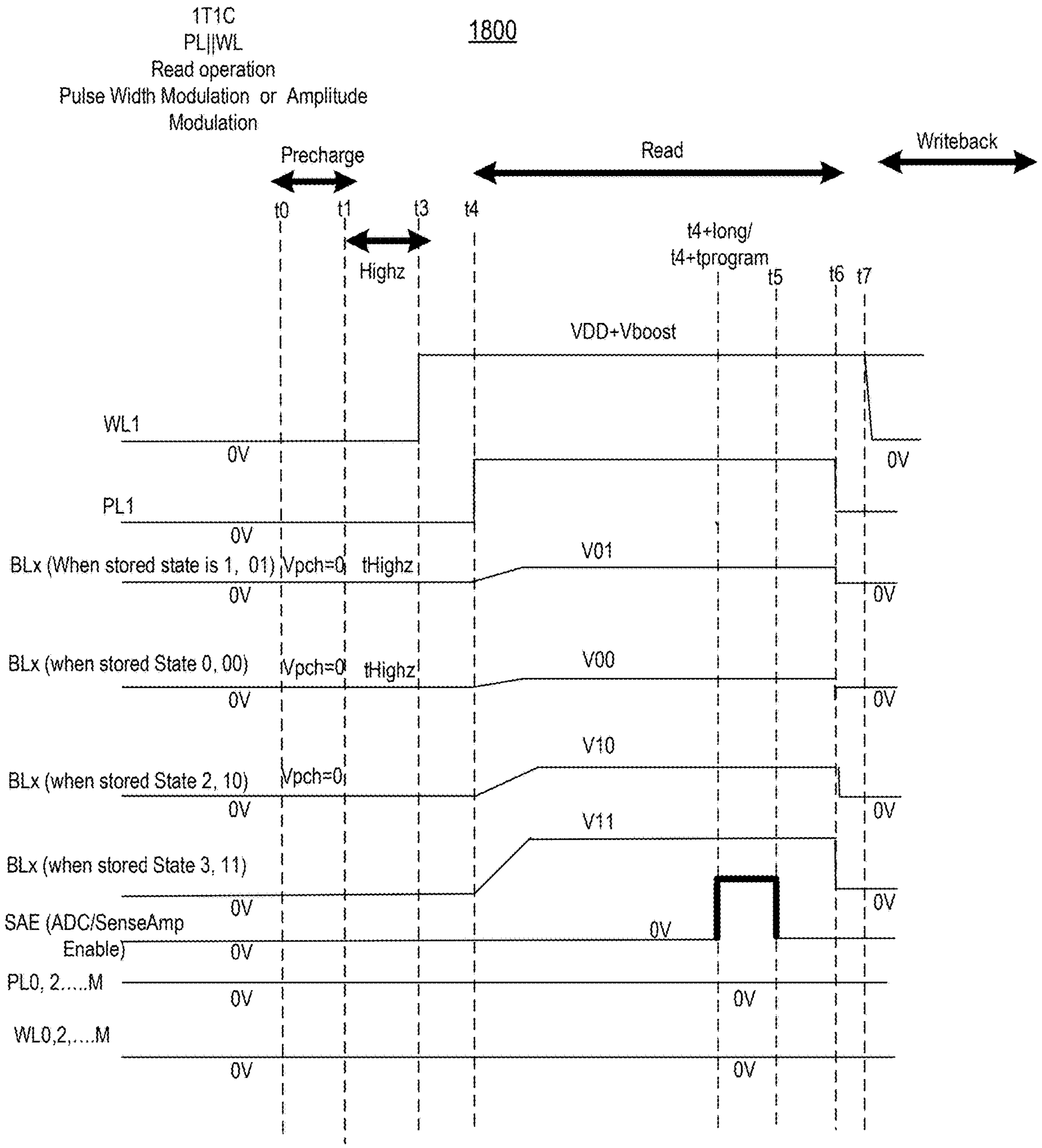
FIG. 18 illustrates a timing diagram with low voltage pre-charge for multi-level read operation for 1T1C FE or PE memory bit-cells with PLs parallel to WLs, in accordance with at least one example.

FIG. 18 illustrates a timing diagram 1800 with low voltage pre-charge for multi-level read operation for 1T1C FE or PE memory bit-cells with PLs parallel to WLs, in accordance with at least one example. In at least one example, the read operation is independent of whether the data stored in the MLC is stored using pulse width modulation or amplitude modulation. In at least one example, read operation begins by asserting the selected WL (e.g., WL1). In at least one example, the selected WL is boosted for read operation. In at least one example, the WL is boosted above Vdd to Vdd+Vboost level between time points t3 and t7. In at least one example, a writeback scheme is implemented after the read operation to restore the data value stored in the selected bit-cell due to the destructive nature of the read operation. In at least one example, the data which is read is also written back in the writeback time window after the read time window. The writeback may use pulse width modulation with or without pre-reset or may use amplitude modulation with or without pre-reset, in accordance with at least one example.

In at least one example, prior to boosting the selected WL, the selected BLx is set to 0V, pre-charged to a predetermined voltage (e.g., 0V) between time points t0 and t1, and then floated between time points t3 and t4. In at least one example, a selected PL (e.g., PL1) is asserted for the MLC of the bit-cell. In this example, PL1 is asserted for a time period (t4 to t6) long enough for the selected bit-line to develop the charge stored in the MLC and for a sense amplifier to sense the value stored on the storage node coupled to the MLC. In at least one example, a sense amplifier enable signal (SAE) is asserted (e.g., between t4+tlong or t4+tprogram) within the pulse width of the selected PL. In at least one example, to read data from the storage node, BL is first set or forced to zero volts and then allowed to float (e.g., BLx driver goes into high impedance state Z (HiZ)). In at least one example, BL is pre-charged to a certain voltage or a programmable voltage. So, when the selected word-line (e.g., WL1) is selected, in conjunction with the PL voltage, a field is created across the MLC.

In at least one example, since BLs are parallel to the PLs, several states from several selected BLs for bit-cells controlled by the same WL can be read. In at least one example, logic is added to allow the sense amplifier to be multiplexed with different selected bit-lines to read the different states from various MLCs.

With the BL driver configured in a high impedance stage, the selected BL is floated, which allows the sense amplifier to sense the voltage on the storage node via the BL. In at least one example, the sense amplifier is configured to sense the voltage on the BL by comparing it to different thresholds to read the various states (e.g., voltages V00, V01, V10, and V11). In at least one example, when BLx charges to a first voltage level V00, a state0 00 is read. In at least one example, when BLx charges to a second voltage level V01 (higher than the first voltage level), state1 01 is read. In at least one example, when BLx charges to a third voltage level V10 (higher than the second voltage level), a state2 10 is read. In at least one example, when BLx charges to a fourth voltage level V11 (higher than the third voltage level), a state3 11 is read.

In at least one example, after the sense amplifier is disabled (SAE is set to 0), the voltage on the selected BL is forced to zero volts. In at least one example, after the selected BL is forced to 0V, the write back process begins. In at least one example, the writeback process may not be needed if the read operation is not a destructive read. In at least one example, the unselected PLs and WLs are set to 0V during read and writeback operations.

Figure 19:
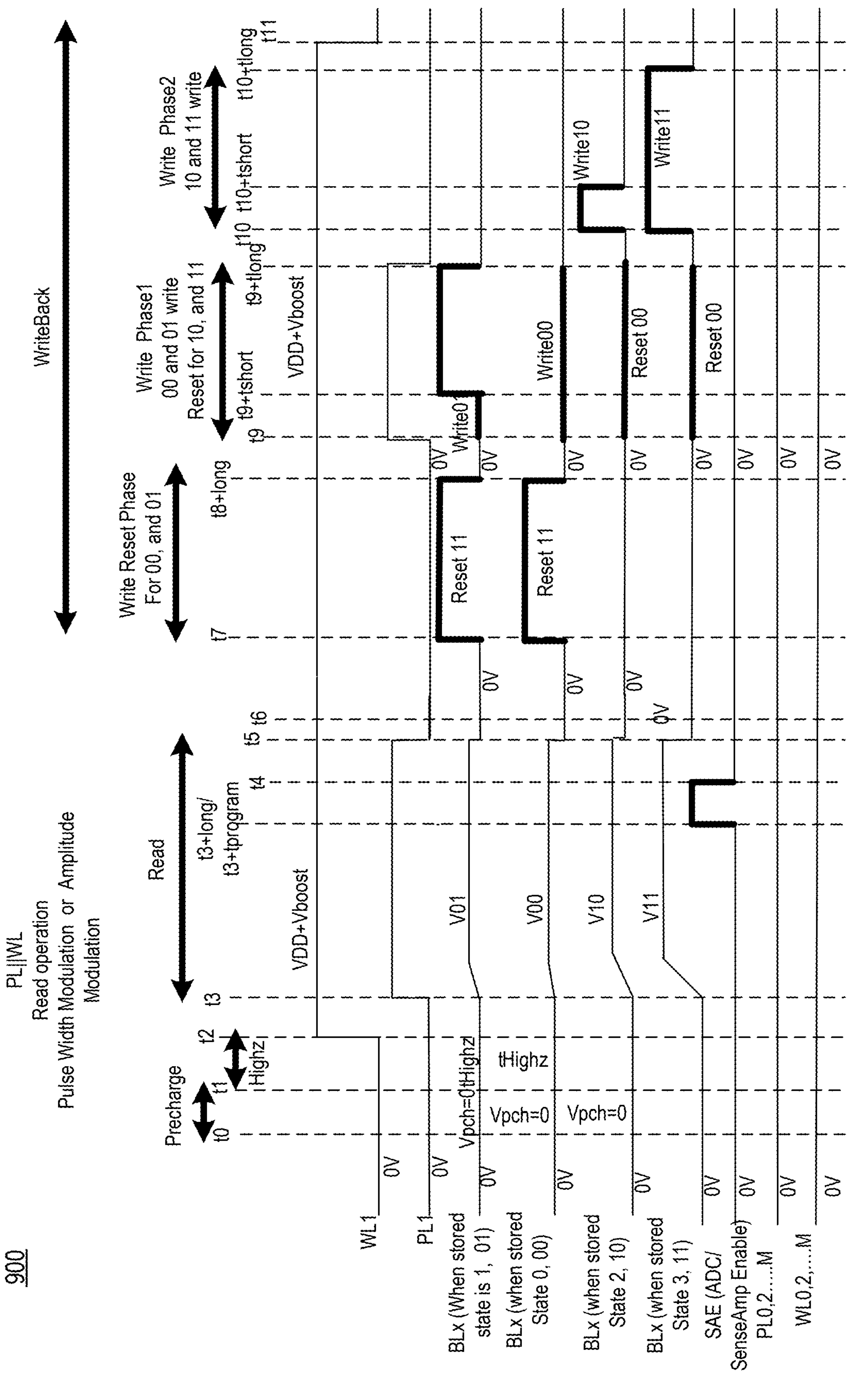
FIG. 19 illustrates a timing diagram with low voltage pre-charge for multi-level read operation for 1T1C FE or PE memory bit-cells with PLs parallel to WLs followed by reset based writeback operation, in accordance with at least one example.

FIG. 19 illustrates a timing diagram 1900 with low voltage pre-charge for multi-level read operation for 1T1C FE or PE memory bit-cells with PLs parallel to WLs followed by reset based writeback operation, in accordance with at least one example. In this example, selected WL (e.g., WL1) is boosted between time points t2 and t11. Timing diagram 1900 is like timing diagram 1800 with writeback that includes resetting the read state by first resetting the MLC as discussed with reference to FIG. 10.

Figure 20:
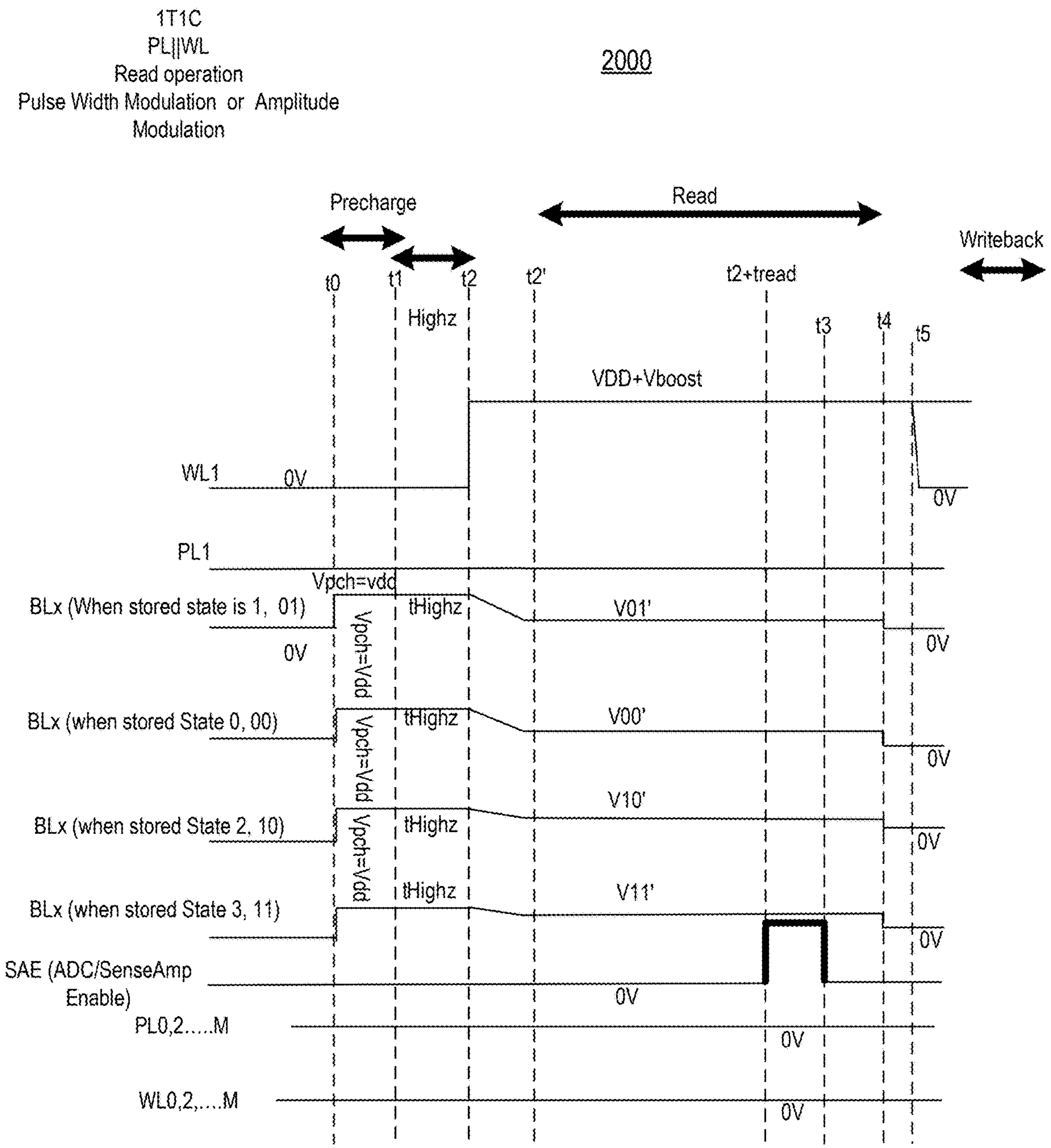
FIG. 20 illustrates a timing diagram with high voltage pre-charge for multi-level read operation for 1T1C FE or PE memory bit-cells with PLs parallel to WLs, in accordance with at least one example.

FIG. 20 illustrates a timing diagram 2000 with high voltage pre-charge for multi-level read operation for 1T1C FE or PE memory bit-cells with PLs parallel to WLs, in accordance with at least one example. Comparing to timing diagram 1800, here the selected bit-line BLx is pre-charged to Vdd instead of 0V between time points t0 and t1, and then floated between time points t3 and t4 (e.g., BLx driver goes into high impedance state Z (HiZ)). So, when the selected word-line (e.g., WL1) is selected, in conjunction with the PL voltage, a field is created across the MLC. In at least one example, a selected PL (e.g., PL1) is de-asserted for the MLC of the bit-cell. In at least one example, a sense amplifier enable signal (SAE) is asserted (e.g., between t2'+tread).

With the BL driver configured in a high impedance stage, the selected BL is floated, which allows the sense amplifier to sense the voltage on the storage node via the BL. In at least one example, the sense amplifier is configured to sense the voltage on the BL by comparing it to different thresholds to read the various states (e.g., voltages V00', V01', V10', and V11'). In at least one example, when BLx discharges to a first voltage level V00', a state0 00 is read. In at least one example, when BLx discharges to a second voltage level V01' (higher than the first voltage level), state1 01 is read. In at least one example, when BLx discharges to a third voltage level V10' (higher than the second voltage level), a state2 10 is read. In at least one example, when BLx discharges to a fourth voltage level V11' (higher than the third voltage level), a state3 11 is read.

In at least one example, after the sense amplifier is disabled (SAE is set to 0), the voltage on the selected BL is forced to zero volts. In at least one example, after the selected BL is forced to 0V, the write back process begins. In at least one example, the writeback process may not be needed if the read operation is not a destructive read. In at least one example, the unselected PLs and WLs are set to 0V during read and writeback operations. In at least one example, the read operation between time points t0 to t5 can be treated as a first phase of the reset for the writeback operation resulting in faster overall read operation. In one such example, the write operation is same as write operation discussed herein for the cases where PL is parallel to WL and where there is no pre-reset for the write operation.

Figure 21:
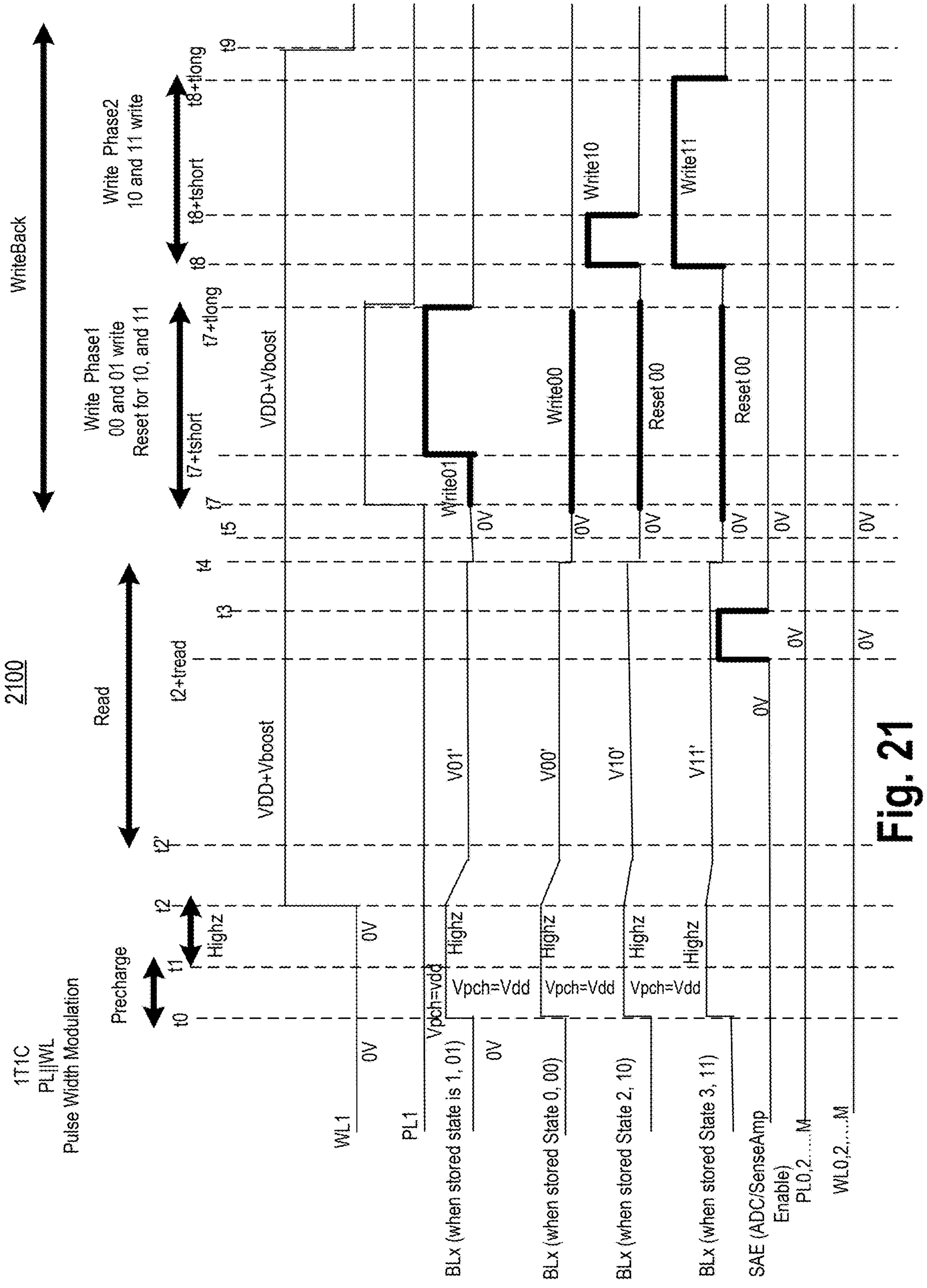
FIG. 21 illustrates a timing diagram with high voltage pre-charge for multi-level read operation for 1T1C FE or PE memory bit-cells with PLs parallel to WLs followed by reset based writeback operation, in accordance with at least one example.

FIG. 21 illustrates a timing diagram 2100 with high voltage pre-charge for multi-level read operation for 1T1C FE or PE memory bit-cells with PLs parallel to WLs followed by reset based writeback operation, in accordance with at least one example. Timing diagram 2100 illustrates the read operation of FIG. 20 followed by a pulse width modulation based writeback operation with pre-reset as described with reference to FIG. 10. In at least one example, the writeback operation is an amplitude modulation based writeback operation with pre-reset as described with reference to FIG. 12 or writeback operation as described with reference to FIG. 11. As discussed herein, the read operation between time points t0 to t5 can be treated as a first phase of the reset for the writeback operation resulting in faster overall read operation.

Figure 22:
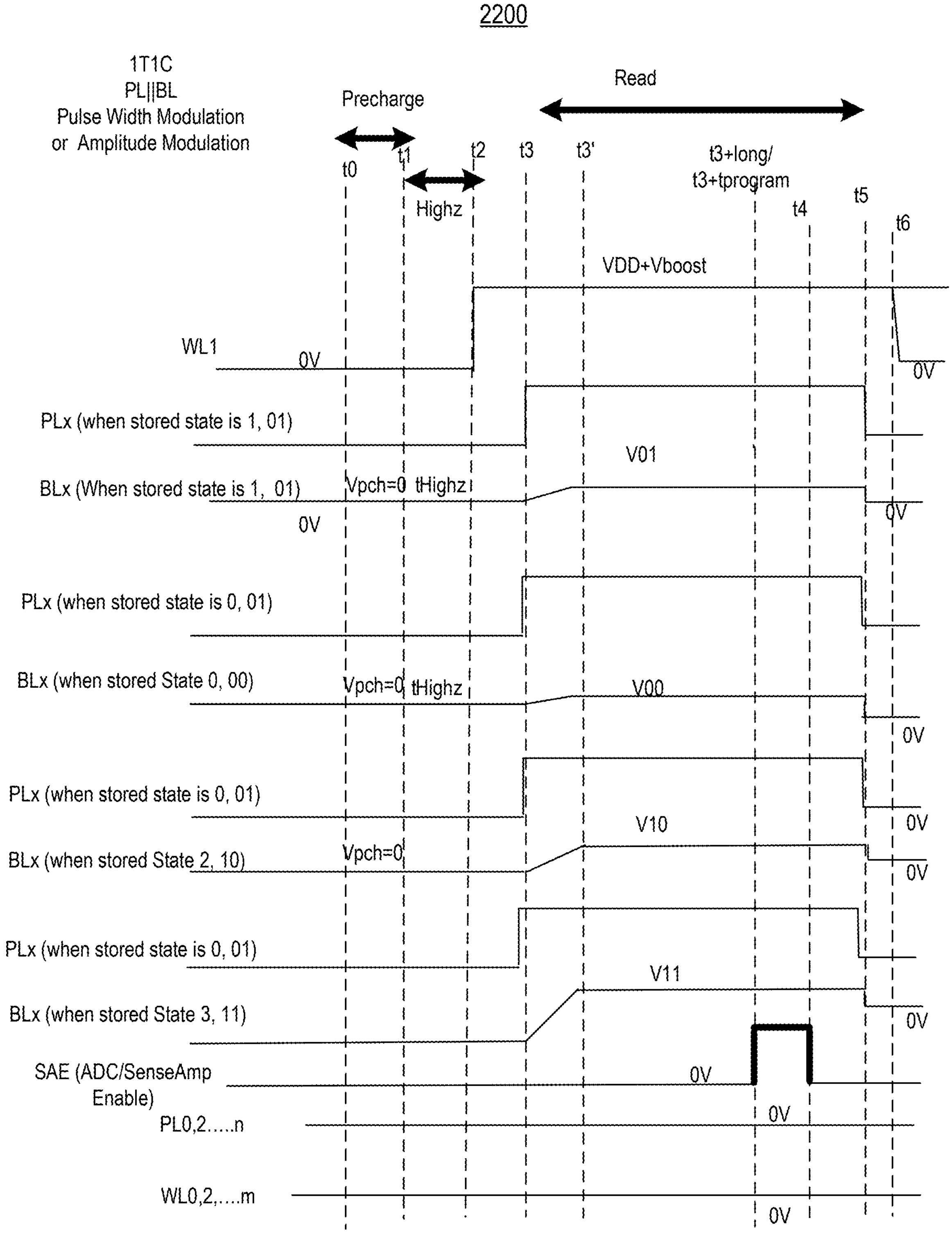
FIG. 22 illustrates a timing diagram with low voltage pre-charge for multi-level read operation for 1T1C FE or PE memory bit-cells with PLs parallel to BLs, in accordance with at least one example.

FIG. 22 illustrates a timing diagram 2200 with low voltage pre-charge for multi-level read operation for 1T1C ferroelectric (FE) or paraelectric (PE) memory bit-cells with PLs parallel to BLs, in accordance with at least one example. In at least one example, the read operation is independent of whether the data stored in the MLC is stored using pulse width modulation or amplitude modulation. In at least one example, read operation begins by asserting the selected WL (e.g., WL1). In at least one example, the selected WL is boosted for read operation. In at least one example, the WL is boosted above Vdd to Vdd+Vboost level. In at least one example, a writeback scheme is implemented after the read operation to restore the data value stored in the selected bit-cell due to the destructive nature of the read operation. In at least one example, the data which is read is also written back in the writeback time window after the read time window. The writeback may use pulse width modulation with or without pre-reset or may use amplitude modulation with or without pre-reset, in accordance with at least one example.

In at least one example, prior to boosting the selected WL, the selected BLx is set to 0V, precharged to a predetermined voltage (e.g., 0V) between times t0 and t1, and then floated between times t2 and t3. In at least one example, a selected PLx (e.g., PL1) is asserted for the MLC of the bit-cell. In this example, PL1 is asserted for a time period (t3 to t5) long enough for the selected bit-line to develop the charge stored in the MLC and for a sense amplifier to sense the value stored on the storage node coupled to the MLC. In at least one example, a sense amplifier enable signal (SAE) is asserted (e.g., between t3+tlong or t3+tprogram and t4) within the pulse width of the selected PLx. In at least one example, to read data from the storage node, the selected BLx (e.g., BL1) is first set or forced to zero volts and then allowed to float (e.g., BLx driver goes into high impedance state Z (HiZ)). In at least one example, selected BLx is pre-charged to a certain voltage or a programmable voltage. So, when the selected word-line (e.g., WL1) is selected, in conjunction with the selected PLx voltage, a field is created across the MLC.

In at least one example, since PLs are parallel to the BLs, different or same states from different MLCs that share the same word-line are read by asserting the respective selected PL and then pre-charging the selected BL followed by placing the selected BL in high impedance state to allow the charge on the BL to develop. This allows for reading several states from different bit-cells that are controlled by the same word-line.

With the BL driver configured in a high impedance stage, the selected BLx is floated, which allows the sense amplifier to sense the voltage on the storage node via the selected BLs. In at least one example, the sense amplifier is configured to sense the voltage on the selected BLx by comparing it to different thresholds to read the various states (e.g., voltages V00, V01, V10, and V11). In at least one example, when the selected BLx charges to a first voltage level V00, a state0 00 is read. In at least one example, when the selected BLx charges to a second voltage level V01 (higher than the first voltage level), state1 01 is read. In at least one example, when the selected BLx charges to a third voltage level V10 (higher than the second voltage level), a state2 10 is read. In at least one example, when the selected BLx charges to a fourth voltage level VII (higher than the third voltage level), a state3 11 is read.

In at least one example, after the sense amplifier is disabled (SAE is set to 0), the voltage on the selected BL is forced to zero volts. In at least one example, after the selected BL is forced to 0V, the write back process begins. In at least one example, the writeback process may not be needed if the read operation is not a destructive read. In at least one example, the unselected PLs and WLs are set to 0V during read and writeback operations.

While the various examples are illustrated for MLCs made from non-linear polar material, the pulsing schemes to write and read from the MLCs are appliable to any MLC. For instance, an MLC may comprise a memory element (ME) such as a resistive memory (ReRAM), magnetic tunnel junction (MTJ), a phase change memory (PCM), etc., and this MLC can be written to and read using the pulsing scheme of various examples.

An MTJ may comprise a bottom electrode, a free ferromagnetic layer on the bottom electrode, an insulative material (e.g., tunnel barrier materials such as MgO, Al2O3, SrTiO3) on the free ferromagnetic layer, a fixed ferromagnetic layer on the insulative material, and a top electrode on the fixed ferromagnetic layer. The free ferromagnetic layer comprises one or more CrO2, Heusler alloys, Fe, or CoFeB. The insulative material (also referred to as tunnel barrier) includes one of: MgO, AlOx (where x is a number or fraction), or SrTiO3. The fixed ferromagnetic layer includes one of CrO2, Heusler alloys, FeCo(001), CoFeB. In at least one example, an anti-ferromagnetic layer (not shown) is formed over a fixed ferromagnetic layer. In at least one example, the anti-ferromagnetic (AFM) layer comprises Ru or Ir. In at least one example, the AFM layer comprises a super lattice of Co and Pt coupled with Ru or Ir. In at least one example, the bottom electrode and the top electrode includes one or ore more: Al, Ti, Cu, Ag, Pt, TiN, TaN, Al doped ZnO, Ga-doped ZnO, or indium tin oxide (ITO). In at least one example, the bottom electrode and the top electrode are symmetric. In at least one example, the bottom electrode and top electrode are asymmetric. In at least one example, the bottom electrode and the top electrode may have the same materials as those discussed with reference to electrodes in FIG. 4B.

In at least one example, a resistive memory (ReRAM) comprises a bottom electrode, an insulative material on the bottom electrode, and a top electrode on the insulative material. In at least one example, the insulative material includes HfOx, TiOx, TaOx, NiO, ZnOx, Zn2TiO4, KnOx, MgO, AlOx, ZrOx, CuxOy, SnOz, GeOx, LaOx, YOx, MoOx, or CoOx (where x and y are a number or a fraction). In at least one example, the insulative material for the ReRAM includes oxides of Mg, Ce, Y, La, Ti, Zr, Hf, V, Nb, Tn, Cr, Mo, W, Mn, Fe, Gd, Co, Ni, Cu, Zn, Al, Ga, Si, Ge, Sn, Yb, or Lu. In at least one example, the bottom electrode and the top electrode includes one or ore more: Al, Ti, Cu, Ag, Pt, TiN, TaN, Al doped ZnO, Ga-doped ZnO, or indium tin oxide (ITO). In at least one example, the bottom electrode and the top electrode are symmetric. In at least one example, the bottom electrode and the top electrode are asymmetric. In at least one example, bottom electrode and the top electrode may have the same materials as those discussed with reference to electrodes in FIG. 4B.

In ReRAM systems that use forming of filaments, an initial operation may begin by applying a voltage pulse with an increasing magnitude, between the top electrode and the bottom electrode. The magnitude of the voltage pulse may be substantially greater than the voltage level utilized to cycle the ReRAM device during regular course of programming. A high voltage pulse may be utilized to perform an intentional one-time breakdown process, known as forming. The forming process creates one or more conductive filaments that provide pathways for electron transport during device operation.

In at least one example, the resistive memory is a phase-change memory (PC-RAM). In at least one example, the PCM comprises a bottom electrode, an insulative material on the bottom electrode, and a top electrode on the insulative material. In this case, the insulative material is a phase-change material. In at least one example, the phase-change material comprises phase-change chalcogenides. In at least one example, the phase-change material includes one of: (GeTe)m(Sb2Te3)n, Ge2Sb2Te5, Ge2Sb2Te4, AgInSbTe, super lattices of GeTe, Sb2Te3, super lattices of TiTe2 and Sb2Te3, WSe2, WS2, or PtSe2 (where m and n are numbers or fractions). Other examples of the phase-change material include binary transition metal oxides such as NiO or TiO2, perovskites such as Sr(Zr)TiO3 or PCMO, solid-state electrolytes such as GeS, GeSe, SiOx, or Cu2S, organic materials such as AlDCN, or layered materials such as hexagonal boron nitride.

In at least one example, when the ME structures are not capacitors (as those described with reference to various examples herein), current based pulsing scheme(s) are used to drive (e.g., write) and for sensing (e.g., read). For example, plate-lines flow current to configure or read the ME structures. In at least one example, the ME structures may be a mix of various types of ME structures (e.g., ferroelectric based capacitors, paraelectric based capacitors, MTJ, ReRAM, or PC-RAM). In at least one example, all ME structures for an array are of the same type.

Figure 23:
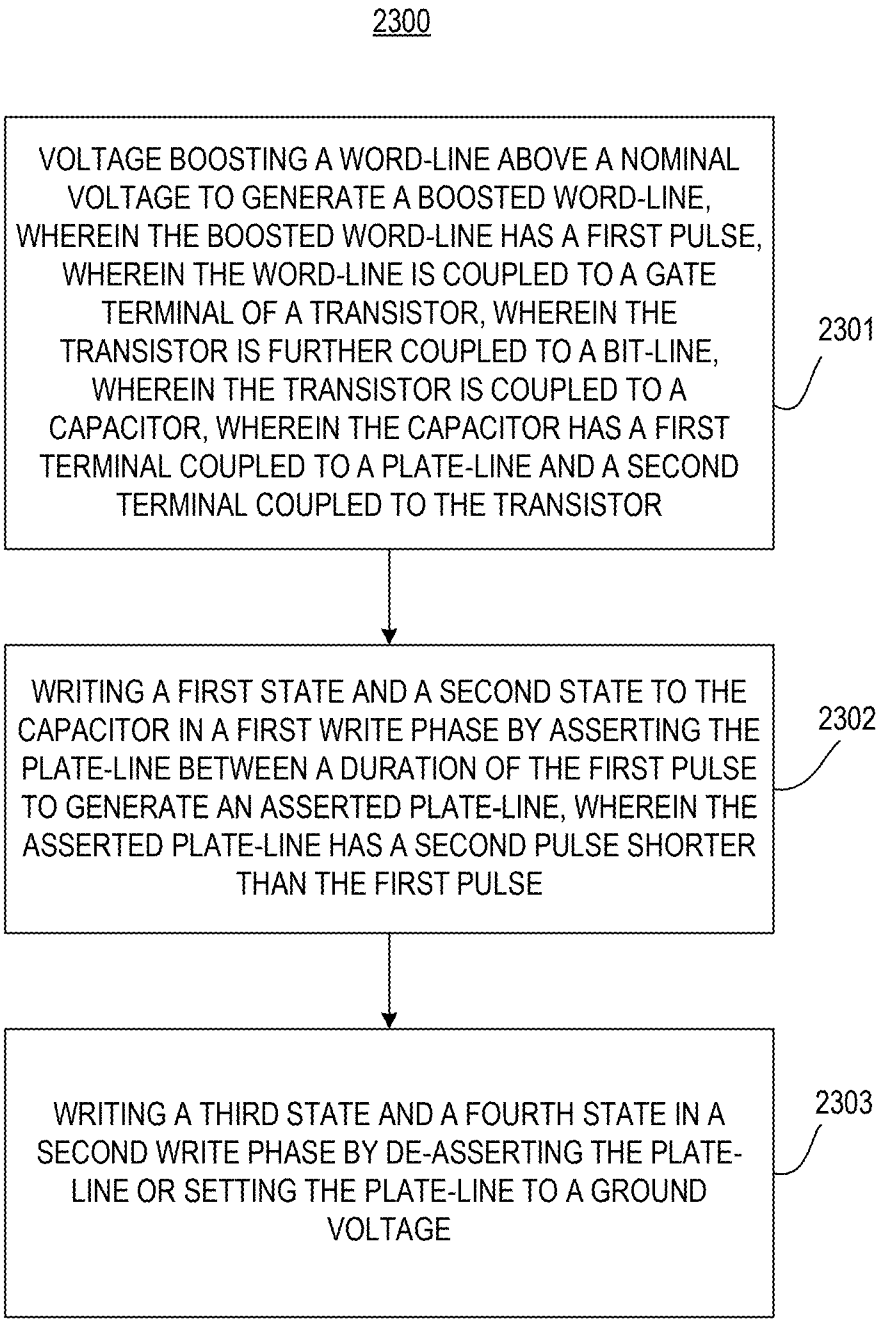
FIG. 23 illustrates a flowchart of a method of writing to an MLC by pulse width modulation, in accordance with at least one example.

FIG. 23 illustrates a flowchart 2300 of a method of writing to an MLC (herein capacitor) by pulse width modulation, in accordance with at least one example. While various blocks are shown in a particular order, the order can be modified. For example, some blocks may be performed before others, and some may be performed simultaneously. The blocks of flowchart 2300 can be performed by hardware, software, or a combination of them.

At block 2301, a word-line is voltage boosted above a nominal voltage to generate a boosted word-line. In at least one example, the boosted word-line has a first pulse, wherein the word-line is coupled to a gate terminal of a transistor. In at least one example, the transistor is further coupled to a bit-line. In at least one example, the transistor is coupled to a capacitor. In at least one example, the capacitor has a first terminal coupled to a plate-line and a second terminal coupled to the transistor.

At block 2302, a first state and a second state is written to the capacitor in a first write phase by asserting the plate-line between a duration of the first pulse to generate an asserted plate-line. In at least one example, the asserted plate-line has a second pulse shorter than the first pulse. In at least one example, the plate-line is parallel to the word-line and orthogonal to the bit-line. In at least one example, the first state is written by setting, after the asserted plate-line is generated and between a duration of the second pulse, the bit-line to a ground voltage to write the first state to the capacitor. In at least one example, the second state is written by setting, after the asserted plate-line is generated, the bit-line to a ground voltage to write a second state to the capacitor. In at least one example, the second state is written by asserting the bit-line between the duration of the second pulse after setting the bit-line to the ground voltage.

At block 2303, a third state and a fourth state are written in a second write phase by de-asserting the plate-line or setting the plate-line to a ground voltage. In at least one example, the first write phase is before the second write phase, or wherein the second write phase is before the first write phase. In at least one example, the third state is written by asserting, after the plate-line is de-asserted or set to the ground voltage and between the duration of the first pulse, the bit-line for a duration of a third pulse to write the third state to the capacitor. In at least one example, the third pulse is shorter than the first pulse. In at least one example, the duration of the third pulse is within the duration of the first pulse. In at least one example, the fourth state is written by asserting, after the plate-line is de-asserted or set to the ground voltage and between the duration of the first pulse, the bit-line for a duration of a fourth pulse. In at least one example, the fourth pulse is de-asserted prior to de-asserting the first pulse.

In at least one example, the capacitor has a first polarization loop and a second polarization loop, wherein the second polarization loop is within the first polarization loop. In at least one example, the first state and the fourth state are part of the first polarization loop, wherein second state and the third state are part of the second polarization loop. In at least one example, the fourth state is written prior to writing the first state or the second state. In at least one example, the first state is written prior to writing the third state or the fourth state.

Figure 24:
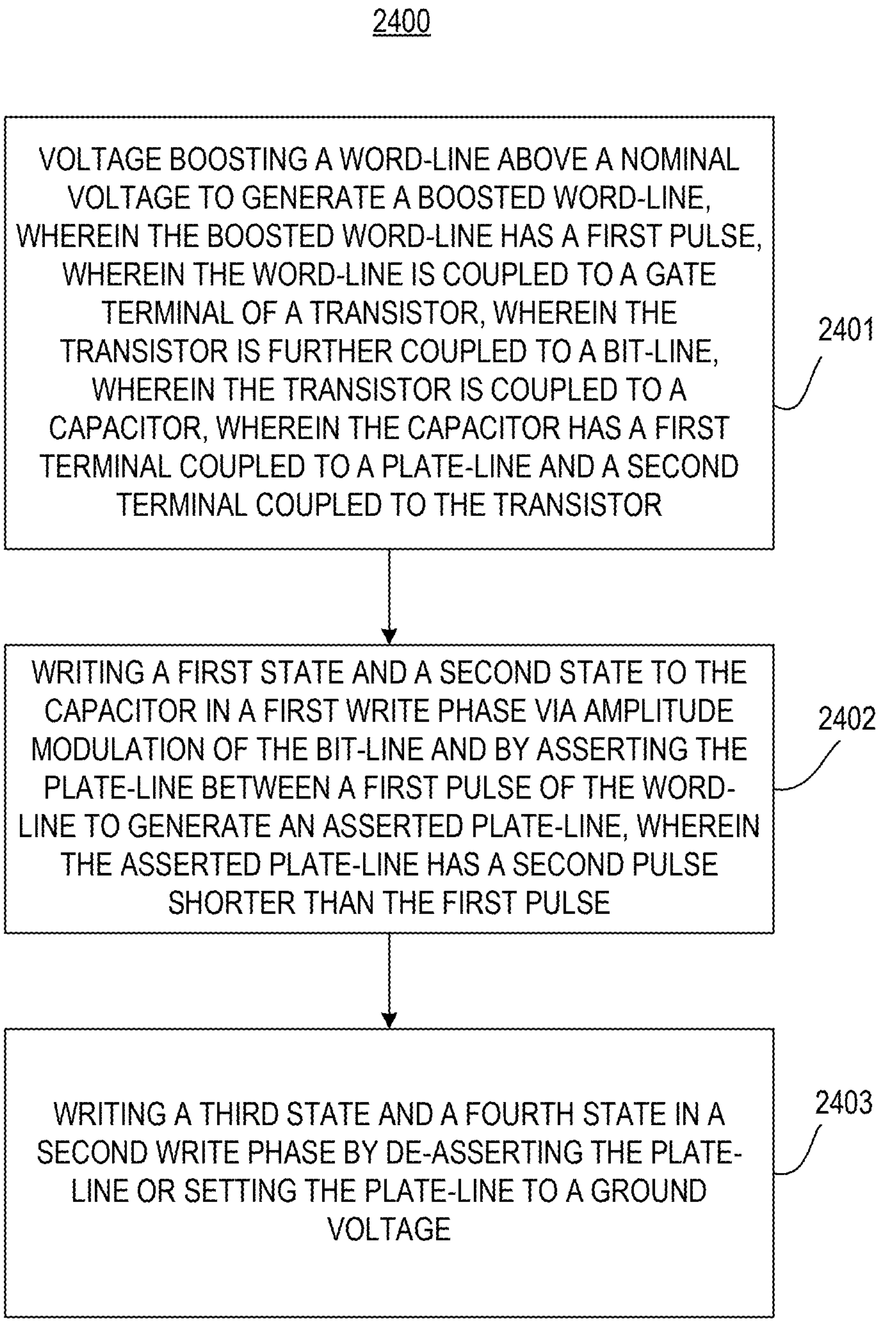
FIG. 24 illustrates a flowchart of a method of writing to an MLC by amplitude modulation, in accordance with at least one example.

FIG. 24 illustrates a flowchart 2400 of a method of writing to an MLC (herein capacitor) by amplitude modulation, in accordance with at least one example. While various blocks are shown in a particular order, the order can be modified. For example, some blocks may be performed before others, and some may be performed simultaneously. The blocks of flowchart 2400 can be performed by hardware, software, or a combination of them.

At block 2401, a word-line is voltage boosted above a nominal voltage to generate a boosted word-line. In at least one example, the boosted word-line has a first pulse, wherein the word-line is coupled to a gate terminal of a transistor. In at least one example, the transistor is further coupled to a bit-line. In at least one example, the transistor is coupled to a capacitor. In at least one example, the capacitor has a first terminal coupled to a plate-line and a second terminal coupled to the transistor.

At block 2402, a first state and a second state is written to the capacitor in a first write phase via amplitude modulation of the bit-line and by asserting the plate-line between a first pulse of the word-line to generate an asserted plate-line. In at least one example, the asserted plate-line has a second pulse shorter than the first pulse. In at least one example, the plate-line is parallel to the word-line and orthogonal to the bit-line. In at least one example, the first state is written by setting, after the asserted plate-line is generated and between the second pulse, the bit-line to a ground voltage to write the first state to the capacitor. In at least one example, the second state is written by setting, after the asserted plate-line is generated, the bit-line to a voltage level between a nominal voltage level and a ground voltage to write the second state to the capacitor. In at least one example, the second state is written by asserting the bit-line between a duration of the second pulse after setting the bit-line to the ground voltage.

At block 2403, a third state and a fourth state is written in a second write phase by de-asserting the plate-line or setting the plate-line to a ground voltage. In at least one example, the first write phase is before the second write phase, or wherein the second write phase is before the first write phase. In at least one example, the third state is written by asserting, after the plate-line is de-asserted or set to the ground voltage and between a duration of the first pulse, the bit-line to a voltage between a nominal voltage level and a ground voltage for a duration of a third pulse to write the third state to the capacitor. In at least one example, the third pulse is shorter than the first pulse, and wherein the duration of the third pulse is within a duration of the first pulse. In at least one example, the fourth state is written by asserting, after the plate-line is de-asserted or set to the ground voltage and between a duration of the first pulse, the bit-line to a nominal voltage level for a duration of a fourth pulse, wherein the fourth pulse is de-asserted prior to de-asserting the first pulse.

In at least one example, the capacitor has a first polarization loop and a second polarization loop, wherein the second polarization loop is within the first polarization loop. In at least one example, the first state and the fourth state are part of the first polarization loop, and the second state and the third state are part of the second polarization loop. In at least one example, the fourth state is written prior to writing the first state or the second state. In at least one example, the first state is written prior to writing the third state or the fourth state.

Figure 25:
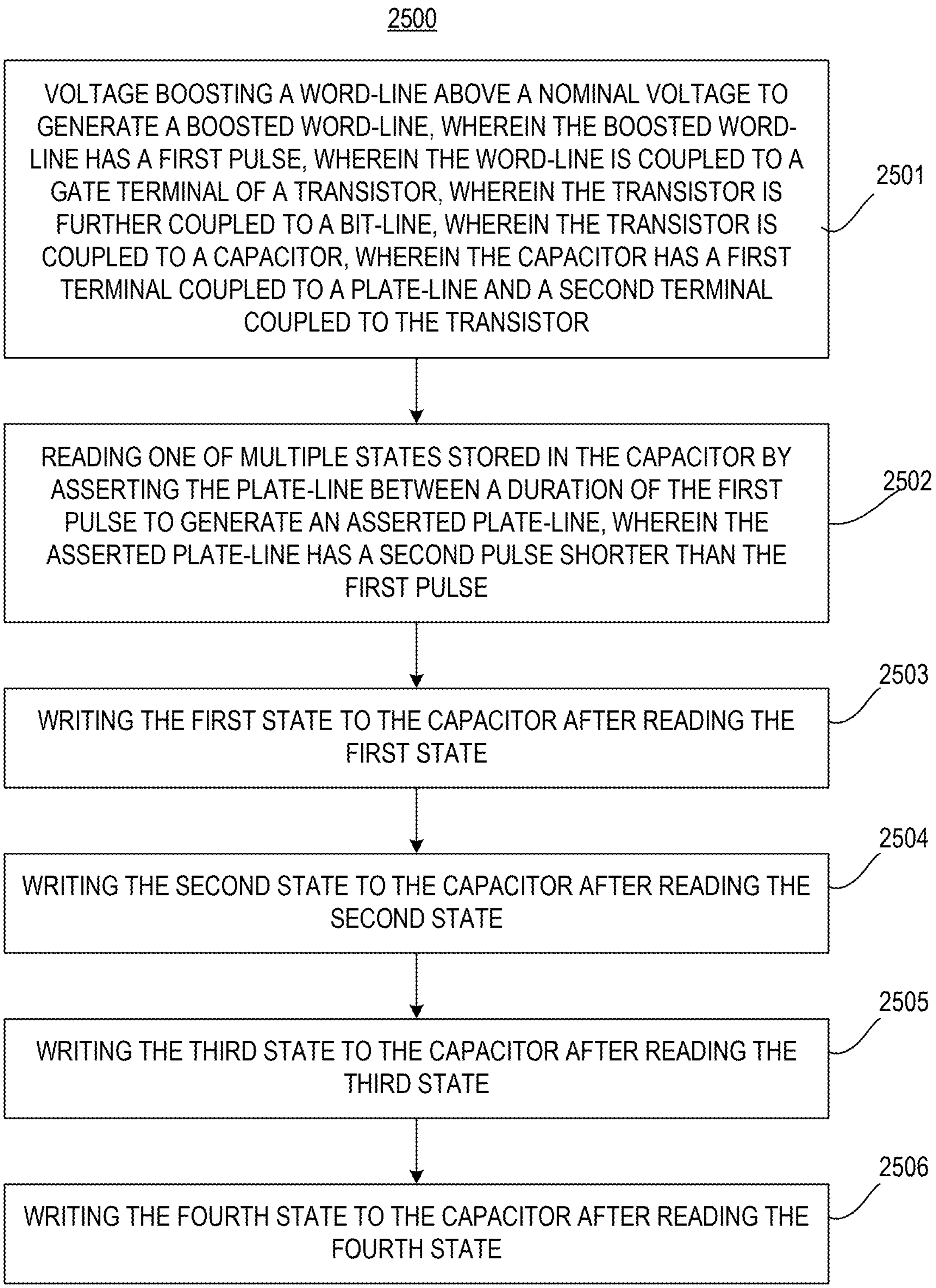
FIG. 25 illustrates a flowchart of a method of reading from an MLC, in accordance with at least one example.

FIG. 25 illustrates a flowchart 2500 of a method of reading from an MLC (herein capacitor), in accordance with at least one example. While various blocks are shown in a particular order, the order can be modified. For example, some blocks may be performed before others, and some may be performed simultaneously. The blocks of flowchart 2500 can be performed by hardware, software, or a combination of them.

At block 2501, a word-line is voltage boosted above a nominal voltage to generate a boosted word-line. In at least one example, the boosted word-line has a first pulse. In at least one example, the word-line is coupled to a gate terminal of a transistor. In at least one example, the transistor is further coupled to a bit-line. In at least one example, the transistor is coupled to a capacitor. In at least one example, the capacitor has a first terminal coupled to a plate-line and a second terminal coupled to the transistor.

At block 2502, one of multiple states stored in the capacitor are read by asserting the plate-line between a duration of the first pulse to generate an asserted plate-line, wherein the asserted plate-line has a second pulse shorter than the first pulse. In at least one example, the plate-line is parallel to the word-line and orthogonal to the bit-line. In at least one example, the multiple states include a first state which is read by pre-charging the bit-line to a ground voltage or a normal supply voltage before the word-line is boosted. Thereafter, the bit-line is placed in a high-impedance state after pre-charging the bit-line. In at least one example, a sense amplifier is enabled to read the first state according to a first voltage on the bit-line. Thereafter, the plate-line is de-asserted.

At block 2503, the first state is written to the capacitor after reading the first state. In at least one example, the first state is written by re-asserting the plate-line to generate a re-asserted plate-line with a third pulse shorter than the first pulse, and setting, after re-asserting the plate-line and between a duration of the third pulse, the bit-line to a ground voltage to write the first state to the capacitor.

At block 2504, the second state is written to the capacitor after reading the second state. In at least one example, the second state is written by re-asserting the plate-line to generate a re-asserted plate-line with a third pulse shorter than the first pulse. In at least one example, the second state is written by setting, after the asserted plate-line is generated, the bit-line to a ground voltage to write a second state to the capacitor. In at least one example, the second state is written by asserting the bit-line between the duration of the second pulse after setting the bit-line to the ground voltage.

In at least one example, the multiple states include a third state which is read by pre-charging the bit-line to a ground voltage or a normal supply voltage before the word-line is boosted. In at least one example, the third state is read by placing the bit-line in a high-impedance state after pre-charging the bit-line. In at least one example, the third state is read by enabling a sense amplifier to read the third state according to a third voltage on the bit-line, and by de-asserting the plate-line.

At block 2505, the third state is written to the capacitor after reading the third state. In at least one example, the third state is written by de-asserting the plate-line or setting the plate-line to a ground voltage. In at least one example, the third state is written by asserting, after the plate-line is de-asserted or set to the ground voltage and between the duration of the first pulse, the bit-line for a duration of a third pulse to write the third state to the capacitor. In at least one example, the third pulse is shorter than the first pulse. In at least one example, the duration of the third pulse is within the duration of the first pulse.

In at least one example, the multiple states include a fourth state which is read by pre-charging the bit-line to a ground voltage or a normal supply voltage before the word-line is boosted. In at least one example, the fourth state is read by placing the bit-line in a high-impedance state after pre-charging the bit-line. In at least one example, the fourth state is read by enabling a sense amplifier to read the fourth state according to a fourth voltage on the bit-line, and by de-asserting the plate-line after enabling the sense amplifier.

At block 2506, the fourth state is written to the capacitor after reading the fourth state. In at least one example, the fourth state is written by asserting, after the plate-line is de-asserted or set to a ground voltage and between the duration of the first pulse, the bit-line for a duration of a fourth pulse, wherein the fourth pulse is de-asserted prior to de-asserting the first pulse.

Figure 26:
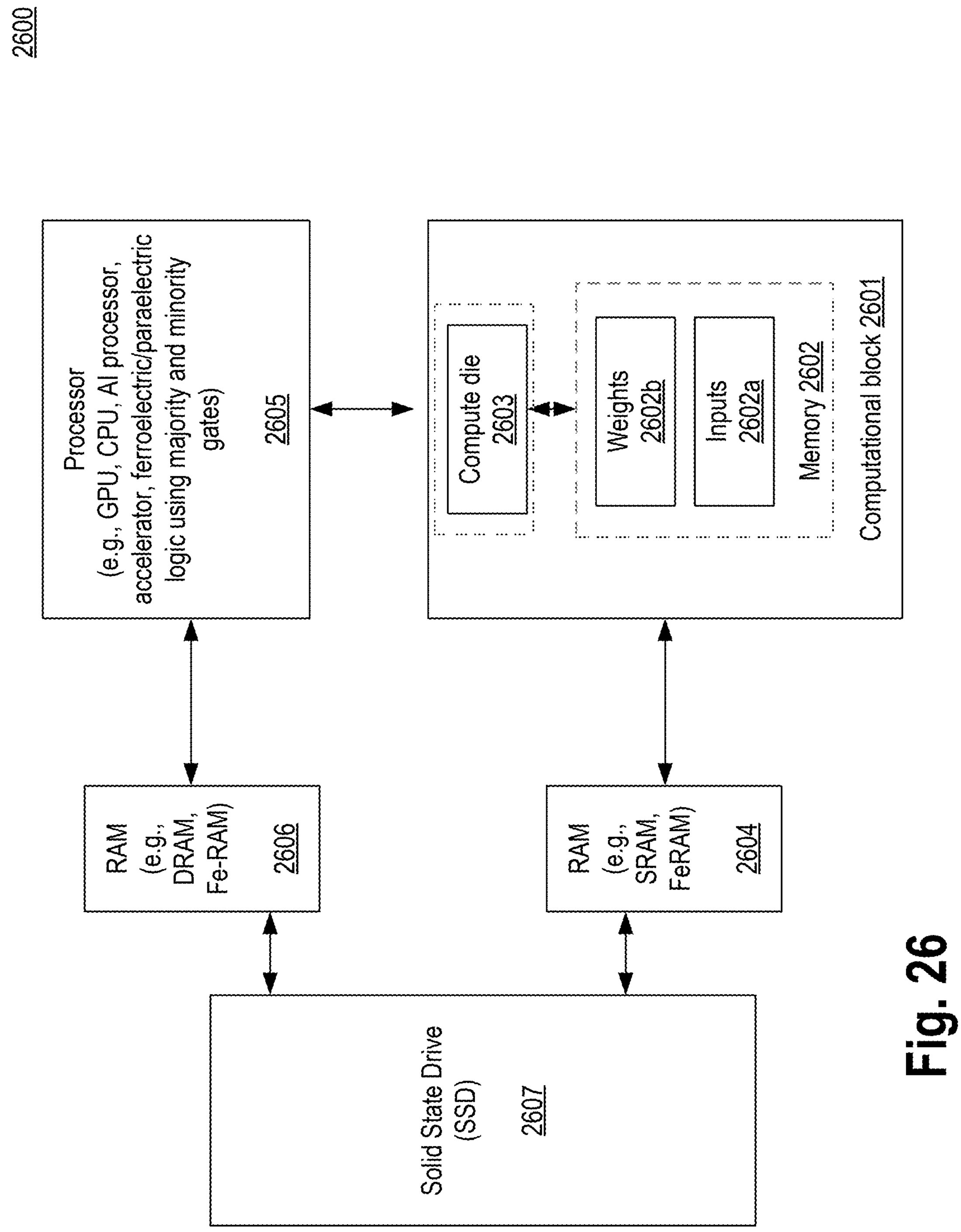
FIG. 26 is a schematic of a high-level architecture of an artificial intelligence (AI) machine comprising a compute die stacked with a memory die, wherein the memory die includes MLC based 1T1C bit-cells, in accordance with at least one example.

FIG. 26 is a schematic of a high-level architecture of an artificial intelligence (AI) machine 2600 comprising a compute die stacked with a memory die, wherein the memory die includes MLC based 1T1C bit-cells, in accordance with at least one example.

In at least one example, AI machine 2600 comprises computational block 2601 or processor having memory 2602 and compute die 2603 (including multiplier and buffers); random-access memory (RAM) 2604 (e.g., static RAM (SRAM), ferroelectric or paraelectric RAM (FeRAM), ferroelectric or paraelectric static random-access memory (FeSRAM)), processor 2605, random-access memory (RAM) 2606 (dynamic RAM (DRAM), FeRAM), and solid-state memory or drive (SSD) 2607. In at least example, some or all components of AI machine 2600 are packaged in a single package forming a system-on-chip (SoC). In at least one example, SoC can be configured as a logic-on-logic configuration, which can be in a 3D configuration or a 2.5D configuration. In at least one example, computational block 2601 includes the MLC as discussed herein.

In at least one example, computational block 2601 is packaged in a single package and then coupled to processor 2605, RAM 2604, 2606, and SSD 2607 on a printed circuit board (PCB). In at least one example, computational block 2601 is configured as a logic-on-logic configuration, which can be in a 3D configuration or a 2.5D configuration. In at least one example, computational block 2601 comprises a special purpose compute die 2603 or microprocessor. In at least one example, compute die 2603 is a compute chiplet that performs a function of an accelerator or inference. In at least one example, memory 2602 is DRAM which forms a special memory/cache for special purpose compute die 2603. In at least one example, DRAM can be embedded DRAM (eDRAM) such as 1T1C (one transistor and one capacitor) based memories. In at least one example, memory 2602 is ferroelectric or paraelectric RAM (Fe-RAM).

In at least one example, compute die 2603 is specialized for applications such as Artificial Intelligence, graph processing, and algorithms for data processing. In at least one example, compute die 2603 further has logic computational blocks, for multipliers and buffers, a special data memory block (e.g., buffers) comprising DRAM, FeRAM, or a combination of them. In at least one example, memory 2602 has weights and inputs stored to improve computational efficiency. In at least one example, interconnects between processor 2605 (also referred to as special purpose processor), RAM 2604, and compute die 2603 are optimized for high bandwidth and low latency. In at least one example, architecture of FIG. 26 allows efficient packaging to lower energy, power, or cost, and provides for ultra-high bandwidth between RAM 2604 and compute die 2603 of computational block 2601.

In at least one example, memory 2602 is partitioned to store inputs 2602*a* (data to be processed) and weights 2602*b*. In at least one example, inputs 2602*a* are stored in a separate memory (e.g., separate memory die) and weights 2602*b* are stored in a separate memory (e.g., separate memory die).

In at least one example, compute die 2603 (having computational logic) comprises matrix multiplier, adder, concatenation logic, buffers, and combinational logic. In at least one example, compute die 2603 performs multiplication operation on inputs 2602*a* and weights 2602*b*. In at least one example, weights 2602*b* are fixed weights. In at least one example, processor 2605 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes weights for a training model. Once weights are computed, they are stored in memory 2602. In at least one example, input data that is to be analyzed using a trained model is processed by computational block 2601 with computed weights 2602*b* to generate an output (e.g., a classification result).

In at least one example, RAM 2604 is ferroelectric or paraelectric based SRAM (FeRAM). For example, a six transistor (6T) SRAM bit-cell having ferroelectric or paraelectric transistors is used to implement a non-volatile FeSRAM. In at least one example, SSD 2607 comprises NAND flash cells. In at least one example, SSD 2607 comprises NOR flash cells. In at least one example, SSD 2607 comprises multi-threshold NAND flash cells.

In at least one example, non-volatility of FeRAM is used to introduce new features such as security, functional safety, and faster reboot time of AI machine 2600. In at least one example, non-volatile FeRAM is a low power RAM that provides fast access to data and weights. FeRAM can also serve as fast storage for computational block 2601 (which can be an inference die or an accelerator), which typically has low capacity and fast access requirements.

In at least one example, FeRAM (FeDRAM or FeSRAM) includes ferroelectric or paraelectric material. In at least one example, ferroelectric or paraelectric material may be in a transistor gate stack or in a capacitor of memory. In at least one example, ferroelectric material can be any suitable low voltage FE material discussed herein. While at least one example here is described with reference to ferroelectric material, at least one example is applicable to any of nonlinear polar materials described herein.

Figure 27:
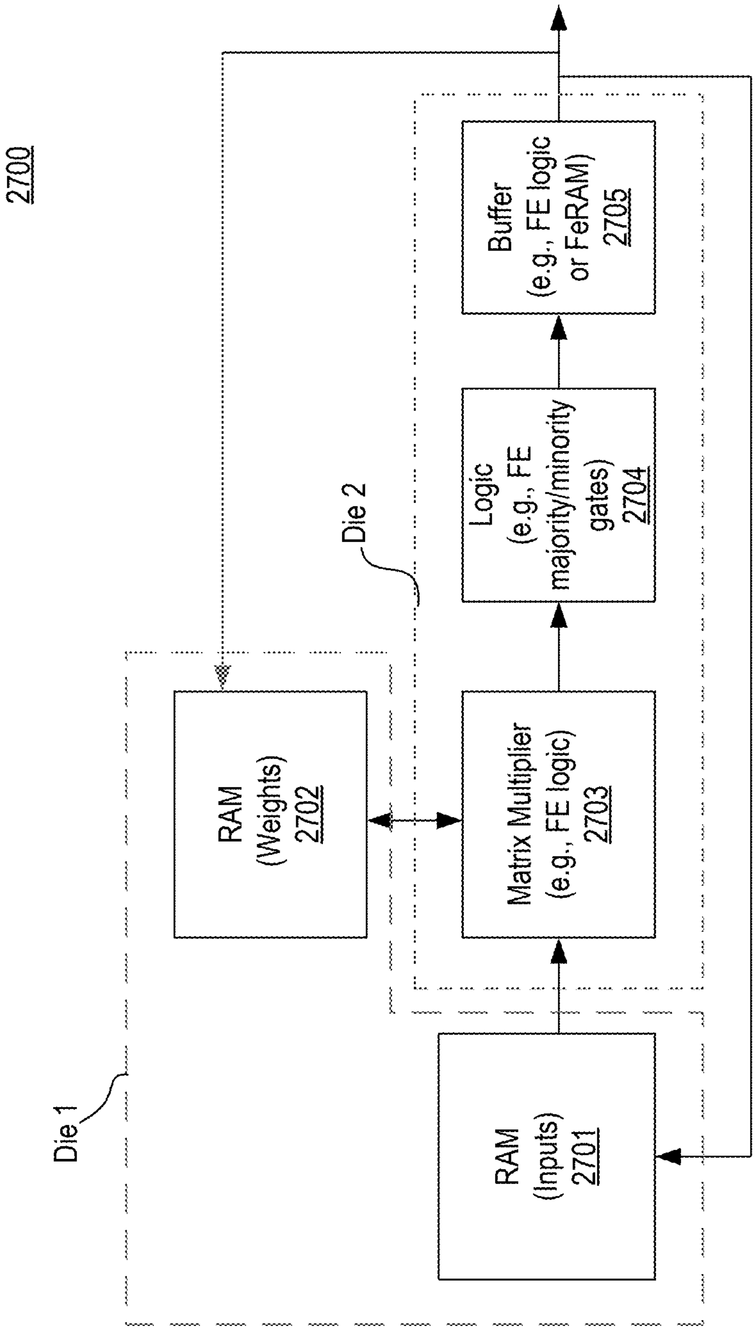
FIG. 27 is a schematic of an architecture of a computational block comprising a compute die stacked with a memory die, wherein the memory die includes MLC based 1T1C bit-cells, in accordance with at least one example.

FIG. 27 is a schematic of an architecture of a computational block 2700 comprising a compute die stacked with a memory die, wherein the memory die includes MLC based 1T1C bit-cells, in accordance with at least one example.

The architecture of FIG. 27 illustrates an architecture for a special purpose compute die where RAM memory buffers for inputs and weights are split on die-1 and logic and optional memory buffers are split on die-2.

In at least one example, a memory die (e.g., Die 1) is positioned below a compute die (e.g., Die 2) such that a heat sink or thermal solution is adjacent to the compute die. In at least one example, the memory die is embedded in an interposer. In at least one example, the memory die behaves as an interposer in addition to its basic memory function. In at least one example, the memory die is a high bandwidth memory (HBM) which comprises multiple dies of memories in a stack and a controller to control the read and write functions to the stack of memory dies. In at least one example, the memory die comprises a RAM 2701 to store input data and RAM 2702 to store weight factors. In at least one example, the memory die is a single die that is partitioned such that a first partition of the memory die is used to store input data (e.g., those stored in RAM 2701) and a second partition of the memory die is used to store weights (e.g., those stored in RAM 2702). In at least one example, the memory die comprises DRAM. In at least one example, the memory die comprises FE-SRAM or FE-DRAM. In at least one example, the memory die comprises MRAM. In at least one example, the memory die comprises SRAM. In at least one example, memory partitions or RAM 2701 and RAM 2702, respectively, include one or more of: DRAM, FE-SRAM, FE-DRAM, SRAM, and/or MRAM. In at least one example, the input data stored in memory partition or RAM 2701 is the data to be analyzed by a trained model with fixed weights stored in memory partition or RAM 2702.

In at least one example, the compute die comprises ferroelectric or paraelectric logic (e.g., majority, minority, and/or threshold gates) to implement matrix multiplier 2703, logic 2704, and buffer 2705. Matrix multiplier 2703 performs multiplication operation on input data 'X' and weights 'W' to generate an output 'Y'. This output may be further processed by logic 2704. In at least one example, logic 2704 performs a threshold operation, pooling and drop out operations, and/or concatenation operations to complete the AI logic primitive functions.

In at least one example, the output of logic 2704 (e.g., processed output 'Y') is temporarily stored in buffer 2705. In at least one example, buffer 2705 is memory such as one or more of: DRAM, Fe-SRAM, Fe-DRAM, MRAM, resistive RAM (Re-RAM), and/or SRAM. In at least one example, buffer 2705 is part of the memory die (e.g., Die 1). In at least one example, buffer 2705 performs the function of a re-timer. In at least one example, the output of buffer 2705 (e.g., processed output 'Y') is used to modify the weights in memory partition or die 2702. In at least one example, computational block 2700 not only operates as an inference circuitry, but also as a training circuitry to train a model. In at least one example, matrix multiplier 2703 includes an array of multiplier cells, wherein RAM 2701 and RAM 2702 include arrays of memory bit-cells, respectively, wherein each multiplier cell is coupled to a corresponding memory bit-cell of DRAM in RAM 2701 and/or DRAM in RAM 2702. In at least one example, computational block 2700 comprises an interconnect fabric coupled to the array of multiplier cells such that each multiplier cell is coupled to the interconnect fabric.

Computational block 2700 provides reduced memory access for the compute die (e.g., die 2) by providing data locality for weights, inputs, and outputs. In one example, data from and to the AI computational blocks (e.g., matrix multiplier 2703) is locally processed within the same packaging unit. Computational block 2700 also segregates the memory and logic operations onto a memory die (e.g., Die 1) and a logic die (e.g., Die 2), respectively, allowing for optimized AI processing. Desegregated dies allow for improved yield of the dies. A high-capacity memory process for Die 1 allows reduction of power of the external interconnects to memory, reduces cost of integration, and results in a smaller footprint.

In at least one example, any of the blocks described here may include the MLC as discussed herein.

Figure 28:
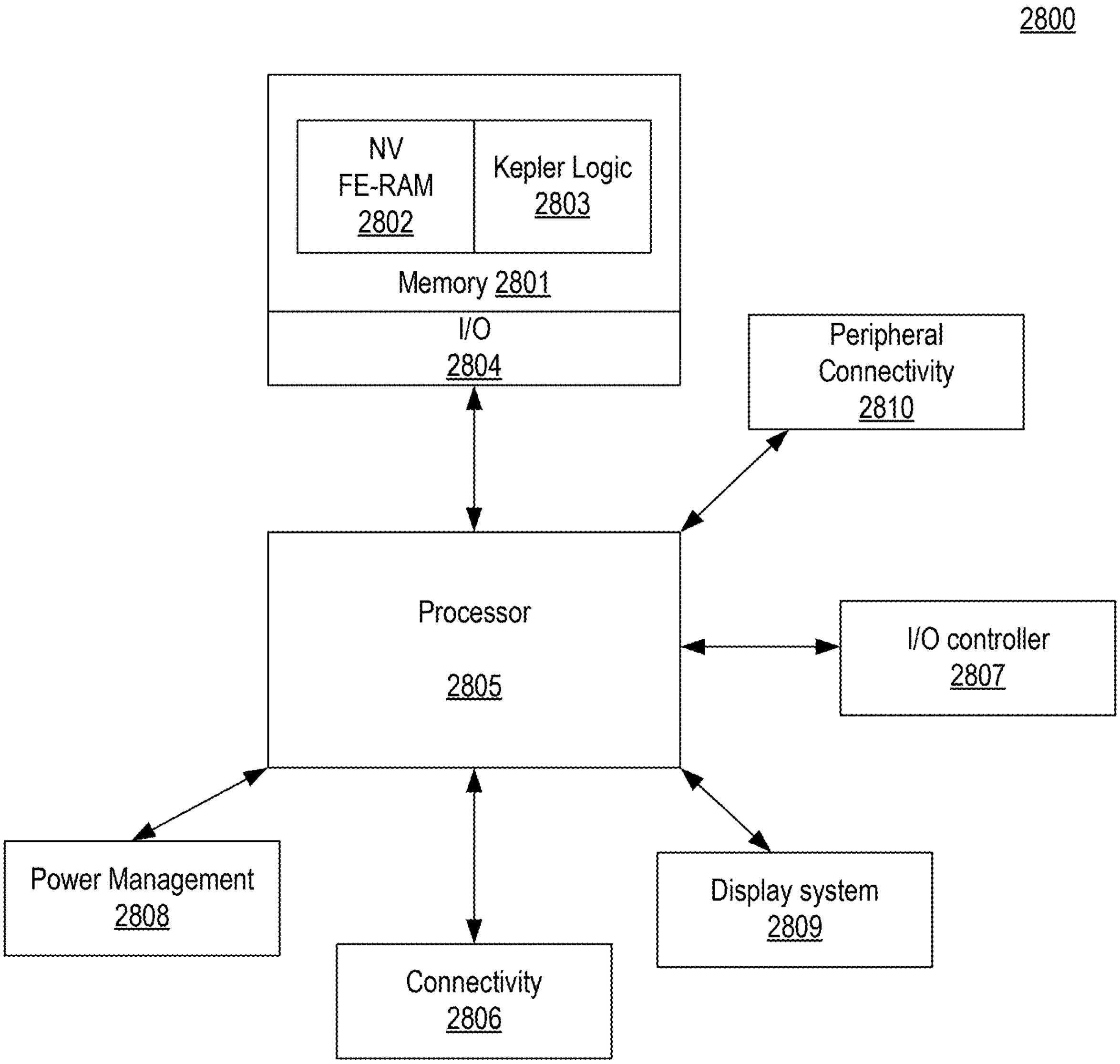
FIG. 28 is a schematic of a system-on-chip (SoC) that uses MLC based 1T1C bit-cells, in accordance with at least one example.

FIG. 28 is a schematic of a system-on-chip (SoC) 2800 that uses MLC based 1T1C bit-cells, in accordance with at least one example.

SoC 2800 comprises memory 2801 having static random-access memory (SRAM) or FE based random-access memory FE-RAM, or any other suitable memory. The memory can be non-volatile (NV) or volatile memory. Memory 2801 may also comprise logic 2803 to control memory 2802. For example, write and read drivers are part of logic 2803. In at least one example, the drivers and other logic are implemented using the majority or threshold gates. The logic can comprise majority or threshold gates and traditional logic (e.g., CMOS based NAND, NOR etc.).

SoC further comprises a memory I/O (input-output) interface 2804. The interface may be a double-data rate (DDR) compliant interface or any other suitable interface to communicate with a processor. Processor 2805 of SoC 2800 can be a single core or multiple core processor. Processor 2805 can be a general-purpose processor (CPU), a digital signal processor (DSP), or an Application Specific Integrated Circuit (ASIC) processor. In at least one example, processor 2805 is an artificial intelligence (AI) processor (e.g., a dedicated AI processor, or a graphics processor configured as an AI processor). In at least one example, processor 2805 executes instructions that are stored in memory 2801.

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is a hardware intensive activity. In at least one example, the AI processor has reduced latency of computing the training model and using the training model, which reduces the power consumption of such AI processor systems.

Processor 2805 may be coupled to a number of other chiplets that can be on the same die as SoC 2800 or on separate dies. These chiplets include connectivity 2806 (e.g., circuitry), I/O controller 2807, power management 2808, and display system 2809, and peripheral connectivity 2810.

Connectivity 2806 represents hardware devices and software components for communicating with other devices. Connectivity 2806 may support various connectivity circuitries and standards. For example, connectivity 2806 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In at least one example, connectivity 2806 may support non-cellular standards such as Wi-Fi.

I/O controller 2807 represents hardware devices and software components related to interaction with a user. I/O controller 2807 is operable to manage hardware that is part of an audio subsystem and/or display subsystem. For example, input through a microphone or other audio device can provide input or commands for one or more applications or functions of SoC 2800. In at least one example, I/O controller 2807 illustrates a connection point for additional devices that connect to SoC 2800 through which a user might interact with the system. For example, devices that can be attached to the SoC 2800 might include microphone devices, speaker or stereo systems, video systems or other display devices, keyboard or keypad devices, or other I/O devices for use with specific applications such as card readers or other devices.

Power management 2808 represents hardware or software that performs power management operations, e.g., based at least in part on receiving measurements from power measurement circuitries, temperature measurement circuitries, charge level of battery, and/or any other appropriate information that may be used for power management. By using majority and threshold gates, non-volatility is achieved at the output of these logic, in accordance with at least one example. Power management 2808 may accordingly put such logic into low power state without the worry of losing data. Power management may select a power state according to Advanced Configuration and Power Interface (ACPI) specification for one or all components of SoC 2800.

Display system 2809 represents hardware (e.g., display devices) and software (e.g., drivers) components that provide a visual and/or tactile display for a user to interact with the processor 2805. In at least one example, display system 2809 includes a touch screen (or touch pad) device that provides both output and input to a user. Display system 2809 may include a display interface, which includes the particular screen or hardware device used to provide a display to a user. In at least one example, the display interface includes logic separate from processor 2805 to perform at least some processing related to the display.

Peripheral connectivity 2810 may represent hardware devices and/or software devices for connecting to peripheral devices such as printers, chargers, cameras, etc. In at least one example, peripheral connectivity 2810 may support communication protocols, e.g., PCIe (Peripheral Component Interconnect Express), USB (Universal Serial Bus), Thunderbolt, High-Definition Multimedia Interface (HDMI), Firewire, etc.

In at least one example, SoC 2800 includes a coherent cache or memory-side buffer chiplet (not shown) which include ferroelectric or paraelectric memory. The coherent cache or memory-side buffer chiplet can be coupled to processor 2805 and/or memory 2801 according to the various examples described herein (e.g., via silicon bridge or vertical stacking). Any blocks herein can use the MLC discussed herein.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

Here, the term "analog signal" generally refers to any continuous signal for which the time varying feature (variable) of the signal is a representation of some other time varying quantity, i.e., analogous to another time varying signal.

Here, the term "digital signal" generally refers to a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e., scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis, or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

Reference in the specification to "an example," "one example," "some examples," or "other examples" means that a particular feature, structure, or characteristic described in connection with the examples is included in at least some examples, but not necessarily all examples. The various appearances of "an example," "one example," or "some examples" are not necessarily all referring to the same examples. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more examples. For example, a first example may be combined with a second example anywhere the particular features, structures, functions, or characteristics associated with the two examples are not mutually exclusive.

While the disclosure has been described in conjunction with specific examples thereof, many alternatives, modifications and variations of such examples will be apparent to those of ordinary skill in the art in light of the foregoing description. The examples of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth to describe examples of the disclosure, it should be apparent to one skilled in the art that the disclosure can be practiced without, or with variation of, these specific details. The description is thus to be regarded as illustrative instead of limiting.

The structures of various examples described herein can also be described as method(s) of forming those structures or apparatuses, and method(s) of operation of these structures or apparatuses. Following examples are provided that illustrate the various examples of the disclosure. The examples can be combined with other examples. As such, various examples can be combined with other examples without changing the scope of the invention.

Example 1 is an apparatus comprising: a transistor having a gate terminal coupled to a word-line, wherein the transistor is further coupled to a bit-line; and a capacitor having a first terminal coupled to a plate-line and a second terminal coupled to the transistor, wherein the capacitor includes a non-linear polar material, and wherein the capacitor includes at least four stable states.

Example 2 is an apparatus according to any example herein, in particular example 1, wherein the capacitor has a first polarization loop and a second polarization loop, wherein the second polarization loop is within the first polarization loop.

Example 3 is an apparatus according to any example herein, in particular example 2, wherein first two states of the at least four stable states are part of the first polarization loop, wherein second two states of the at least four stable states are part of the second polarization loop.

Example 4 is an apparatus according to any example herein, in particular example 3, wherein the at least four stable states include a first state, a second state, a third state, and a fourth state, wherein a difference in voltages on the plate-line and the bit-line indicates a polarity, wherein the polarity is positive for the first state and the second state, wherein the polarity is negative for the third state and the fourth state.

Example 5 is an apparatus according to any example herein, in particular example 1, further includes a circuitry to program the capacitor is by pulse width modulation or amplitude modulation of a voltage on the bit-line.

Example 6 is an apparatus according to any example herein, in particular example 1 further includes a circuitry to write a first state to the capacitor prior to a second state to the capacitor, wherein the first state is a different state than the second state, wherein the second state is a target state.

Example 7 is an apparatus according to any example herein, in particular example 1, wherein the capacitor includes: a first capacitor with a first non-linear polar material; and a second capacitor with a second non-linear polar material, wherein the first capacitor is coupled in parallel to the second capacitor.

Example 8 is an apparatus according to any example herein, in particular example 7, wherein the first non-linear polar material has a different thickness than the second non-linear polar material, and wherein first non-linear polar material has same doping as the second non-linear polar material.

Example 9 is an apparatus according to any example herein, in particular example 7, wherein the first non-linear polar material has a different doping than the second non-linear polar material, and wherein first non-linear polar material has a same thickness as the second non-linear polar material.

Example 10 is an apparatus according to any example herein, in particular example 7, wherein the capacitor further includes a resistive device coupled in series with the second capacitor, wherein the resistive device and the second capacitor in combination are parallel to the first capacitor.

Example 11 is an apparatus according to any example herein, in particular example 7, wherein the first capacitor has a first polarization loop, and wherein the second capacitor has a second polarization loop which is different from the first polarization loop.

Example 12 is an apparatus according to any example herein, in particular example 1, wherein the non-linear polar material includes: a form $ABB'O_3$, wherein "A" includes one of: Ba, K, Bi, Y, La, Sc, Ce, Pr, Nd, Pm, Sm, Eu, Gd, Tb, Dy, Ho, Er, T, Yb, Lu, Li, Bi, K, or Na, wherein "B" includes one of Mn, Fe, Ta, or Nb, and wherein "B'" includes one of: Sc, Ti, V, Cr, Mn, Fe, Co, Ni, Cu, or Zn; a form AA'$BO_3$, wherein "A" includes one of: Ba, K, Bi, Y, La, Sc, Ce, Pr, Nd, Pm, Sm, Eu, Gd, Tb, Dy, Ho, Er, T, Yb, Lu, Li, Bi, K, or Na, wherein "B" includes one of Mn, Fe, Ta, or Nb, wherein "A'" includes one of Y, La, Sc, Ce, Pr, Nd, Pm, Sm, Eu, Gd, Tb, Dy, Ho, Er, T, Yb, Lu, and wherein A' comprises a valency of site A, but different ferroelectric polarizability from A; a form $ABO_3$, wherein "A" includes one of: Ba, K, Bi, Y, La, Sc, Ce, Pr, Nd, Pm, Sm, Eu, Gd, Tb, Dy, Ho, Er, T, Yb, Lu, Li, Bi, K, or Na, and wherein "B" includes one of Mn, Fe, Ta, or Nb; bismuth ferrite (BFO), BFO with a first doping material, wherein the first doping material is one of lanthanum, elements from lanthanide series of a periodic table, or elements of 3d, 4d, 5d, 6d, 4f, or 5f series of periodic table; lead zirconium titanate (PZT) or PZT with a second doping material, wherein the second doping material is one of La or Nb; a perovskite material which includes one of: $BaTiO_3$, $PbTiO_3$, $KNbO_3$, $KNbO_3$, $NaTaO_3$, wherein the perovskite material is doped with La or lanthanides, chemically substituted lead titanate, and wherein Zr, La, or Nb is substituted in Ti site; a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a $BaTiO_3$ (BTO) based relaxor ferroelectric which includes one of: $BaTiO_3$—$Bi(Zn_{1/2}Ti_{1/2})O_3$ (BTO-BZT), $BaTiO_3$—$BiScO_3$ (BTO-BS): $BiScO_3$, $Ba_{(1-x)}Sr_xTiO_3$ (BST), $BaTiO_3$—$Pb(Mg_{1/3}Nb_{2/3})O_3$ (BTO-PMN), $BaTi_{(1-x)}Zr_xO_3$ (BTZ), $BaTiO_3$—$Pb(Zn_{1/3}Nb_{2/3})O_3$ (BTO-PZN), $BaTiO_3$—$Pb(Sc_{1/2}Nb_{1/2})O_3$ (BTO-PSN); a PZT based relaxor ferroelectric which includes one of: PZT-$Pb(Mg_{1/3}Nb_{2/3})O_3$ (PZT-PMN), PZT-$Pb(Ni_{1/3}Nb_{2/3})O_3$ (PZT-PNN), PZT-$Pb(Zn_{1/3}Nb_{2/3})O_3$ (PZT-PZN), PZT-$Pb(Sc_{1/2}Nb_{1/2})O_3$ (PZT-PSN), PZT-$Pb(Fe_{1/2}Nb_{1/2})O_3$ (PZT-PFN), PZT-$Pb(La,Zr,Ti)O_3$ (PZT-PLZT), or PZT-$Pb(Ti,Mn)O_3$ (PZT-PTM); a $SrBi_2Ta_2O_9$ (SBT) based relaxor which includes one of: paraelectric SBT-$SrBi_2(Nb,Ta)_2O_9$ (SBT-SBNT), or SBT doped with one of: Mn, Fe, Co, La, Ce or Nd, Ba, or Ca; a first hexagonal ferroelectric which includes one of: $YMnO_3$ or $LuFeO_3$; a second hexagonal ferroelectric of a type $RMnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); lithium niobate, lithium tantalate, lithium iron tantalum oxy fluoride, barium strontium niobate, sodium barium niobate, or potassium strontium niobate; an improper ferroelectric material which includes one of: [PTO/STO]n or [LAO/STO]n, wherein 'n' is between 1 and 100; hafnium (Hf), zirconium (Zr), aluminum (Al), silicon (Si), their oxides or their alloyed oxides; hafnium oxides of a form $Hf_{(1-x)}E_xO_y$, where E includes one of: Al, Ca, Ce, Dy, Er, Gd, Ge, La, Sc, Si, Sr, Sn, Zr, or Y, wherein 'x' and 'y' are first and second fractions, respectively; $HfO_2$ doped with one of: Al, Ca, Ce, Dy, Er, Gd, Ge, La, Sc, Si, Sr, Sn, or Y; $Al_{(1-x)}Sc_{(x)}N$, $Ga_{(1-x)}Sc_{(x)}N$, $Al_{(1-x)}Y_{(x)}N$or $Al_{(1-x-y)}Mg_{(x)}Nb_{(y)}N$, wherein 'x' and 'y' are third and fourth fractions, respectively; or $LiNbO_3$, $LiTaO_3$, $LiTaO_2F_2$, $Sr_{(X)}Ba_{(1-x)}Nb_2O_6$ where 0.32≤x≤0.8, or $KSr_2Nb_5O_{15}$; or a paraelectric material comprising $SrTiO_3$, $Ba_{(x)}Sr_{(y)}TiO_3$, $HfZrO_2$, Hf—Si—O, or La-substituted $PbTiO_3$.

Example 13 is a system comprising: a processor; a memory coupled to the processor; and a communication circuitry coupled to the processor, wherein the memory includes a bit-cell that includes: a transistor having a gate terminal coupled to a word-line, wherein the transistor is further coupled to a bit-line; and a capacitor having a first terminal coupled to a plate-line and a second terminal coupled to the transistor, wherein the capacitor includes a non-linear polar material, and wherein the capacitor includes at least four stable states.

Example 14 is a system according to any example herein, in particular example 13, wherein the capacitor has a first polarization loop and a second polarization loop, wherein the second polarization loop is within the first polarization loop.

Example 15 is a system according to any example herein, in particular example 14, wherein first two states of the at least four stable states are part of the first polarization loop, wherein second two states of the at least four stable states are part of the second polarization loop.

Example 16 is a system according to any example herein, in particular example 13, wherein the memory includes a circuitry to program the capacitor by pulse width modulation or amplitude modulation of a voltage on the bit-line.

Example 17 is a system according to any example herein, in particular example 13, wherein the memory includes a circuitry to write a first state to the capacitor prior to a second state to the capacitor, wherein the first state is a different state than the second state, wherein the second state is a target state.

Example 18 is a method comprising: forming a transistor having a gate terminal coupled to a word-line, wherein the transistor is further coupled to a bit-line; and forming a capacitor having a first terminal coupled to a plate-line and a second terminal coupled to the transistor, wherein the capacitor includes a non-linear polar material, and wherein the capacitor includes at least four stable states.

Example 19 is a method according to any example herein, in particular example 18, wherein the capacitor has a first polarization loop and a second polarization loop, wherein the second polarization loop is within the first polarization loop.

Example 20 is a method according to any example herein, in particular example 19, wherein first two states of the at least four stable states are part of the first polarization loop, wherein second two states of the at least four stable states are part of the second polarization loop.

Example 1a is a method comprising: voltage boosting a word-line above a nominal voltage to generate a boosted word-line, wherein the boosted word-line has a first pulse, wherein the word-line is coupled to a gate terminal of a transistor, wherein the transistor is further coupled to a bit-line, wherein the transistor is coupled to a capacitor, wherein the capacitor has a first terminal coupled to a plate-line and a second terminal coupled to the transistor; and writing a first state and a second state to the capacitor in a first write phase by asserting the plate-line between a duration of the first pulse to generate an asserted plate-line, wherein the asserted plate-line has a second pulse shorter than the first pulse.

Example 2a is a method according to any example herein, in particular example la, wherein the plate-line is parallel to the word-line and orthogonal to the bit-line.

Example 3a is a method according to any example herein, in particular example 1a, wherein writing the first state includes: setting, after the asserted plate-line is generated and between a duration of the second pulse, the bit-line to a ground voltage to write the first state to the capacitor.

Example 4a is a method according to any example herein, in particular example 1a, wherein writing the second state includes: setting, after the asserted plate-line is generated, the bit-line to a ground voltage to write a second state to the capacitor; and asserting the bit-line between the duration of the second pulse after setting the bit-line to the ground voltage.

Example 5a is a method according to any example herein, in particular example 1a further includes writing a third state and a fourth state in a second write phase by de-asserting the plate-line or setting the plate-line to a ground voltage.

Example 6a is a method according to any example herein, in particular example 5a, wherein the first write phase is before the second write phase, or wherein the second write phase is before the first write phase.

Example 7a is a method according to any example herein, in particular example 5a, wherein writing the third state includes: asserting, after the plate-line is de-asserted or set to the ground voltage and between the duration of the first pulse, the bit-line for a duration of a third pulse to write the third state to the capacitor, wherein the third pulse is shorter than the first pulse, and wherein the duration of the third pulse is within the duration of the first pulse.

Example 8a is a method according to any example herein, in particular example 5a, wherein writing the fourth state includes: asserting, after the plate-line is de-asserted or set to the ground voltage and between the duration of the first pulse, the bit-line for a duration of a fourth pulse, wherein the fourth pulse is de-asserted prior to de-asserting the first pulse.

Example 9a is a method according to any example herein, in particular example 5a, wherein the capacitor has a first polarization loop and a second polarization loop, wherein the second polarization loop is within the first polarization loop.

Example 10a is a method according to any example herein, in particular example 9a, wherein the first state and the fourth state are part of the first polarization loop, wherein second state and the third state are part of the second polarization loop.

Example 11a is a method according to any example herein, in particular example 5a further includes writing the fourth state prior to writing the first state or the second state.

Example 12a is a method according to any example herein, in particular example 5a further includes writing the first state prior to writing the third state or the fourth state.

Example 13a is a method according to any example herein, in particular example 1a, wherein the capacitor includes: a first capacitor with a first non-linear polar material; and a second capacitor with a second non-linear polar material, wherein the first capacitor is coupled in parallel to the second capacitor.

Example 14a is a method according to any example herein, in particular example 13a, wherein the first non-linear polar material has a different thickness than the second non-linear polar material, and wherein the first non-linear polar material has same doping as the second non-linear polar material.

Example 15a is a method according to any example herein, in particular example 13a, wherein the first non-linear polar material has a different doping than the second non-linear polar material, and wherein the first non-linear polar material has a same thickness as the second non-linear polar material.

Example 16a is a method according to any example herein, in particular example 13a, wherein the capacitor further includes a resistive device coupled in series with the second capacitor, wherein the resistive device and the second capacitor in combination are parallel to the first capacitor.

Example 17a is a method according to any example herein, in particular example 13a, wherein the first capacitor has a first polarization loop, and wherein the second capacitor has a second polarization loop which is different from the first polarization loop.

Example 18a is a method according to any example herein, in particular example 13a, wherein the first non-linear polar material or the second non-linear polar material includes non-linear polar material as discussed herein.

Example 19a is an apparatus comprising: a first circuitry to voltage boost a word-line above a nominal voltage to generate a boosted word-line, wherein the boosted word-line has a first pulse, wherein the word-line is coupled to a gate terminal of a transistor, wherein the transistor is further coupled to a bit-line, wherein the transistor is coupled to a capacitor, wherein the capacitor has a first terminal coupled to a plate-line and a second terminal coupled to the transistor; and a second circuitry to write a first state and a second state to the capacitor in a first write phase by asserting the plate-line between a duration of the first pulse to generate an asserted plate-line, wherein the asserted plate-line has a second pulse shorter than the first pulse.

Example 20a is an apparatus according to any example herein, in particular example 19a, wherein second circuitry is to set, after the asserted plate-line is generated and between a duration of the second pulse, the bit-line to a ground voltage to write the first state to the capacitor, and wherein the second circuitry is to: set, after the asserted plate-line is generated, the bit-line to a ground voltage to write a second state to the capacitor; and assert the bit-line between the duration of the second pulse after setting the bit-line to the ground voltage.

Example 1b is a method comprising: voltage boosting a word-line above a nominal voltage to generate a boosted word-line, wherein the boosted word-line has a first pulse, wherein the word-line is coupled to a gate terminal of a transistor, wherein the transistor is further coupled to a bit-line, wherein the transistor is coupled to a capacitor, wherein the capacitor has a first terminal coupled to a plate-line and a second terminal coupled to the transistor; and writing a first state and a second state to the capacitor in a first write phase via amplitude modulation of the bit-line and by asserting the plate-line between a first pulse of the word-line to generate an asserted plate-line, wherein the asserted plate-line has a second pulse shorter than the first pulse.

Example 2b is a method according to any example herein, in particular example 1, wherein the plate-line is parallel to the word-line and orthogonal to the bit-line.

Example 3b is a method according to any example herein, in particular example 1b, wherein writing the first state includes setting, after the asserted plate-line is generated and between the second pulse, the bit-line to a ground voltage to write the first state to the capacitor.

Example 4b is a method according to any example herein, in particular example 1b, wherein writing the second state includes setting, after the asserted plate-line is generated, the bit-line to a voltage level between a nominal voltage level and a ground voltage to write the second state to the capacitor; and asserting the bit-line between a duration of the second pulse after setting the bit-line to the ground voltage.

Example 5b is a method according to any example herein, in particular example 1b further includes writing a third state and a fourth state in a second write phase by de-asserting the plate-line or setting the plate-line to a ground voltage.

Example 6b is a method according to any example herein, in particular example 5b, wherein the first write phase is before the second write phase, or wherein the second write phase is before the first write phase.

Example 7b is a method according to any example herein, in particular example 5b, wherein writing the third state includes asserting, after the plate-line is de-asserted or set to the ground voltage and between a duration of the first pulse, the bit-line to a voltage between a nominal voltage level and a ground voltage for a duration of a third pulse to write the third state to the capacitor, wherein the third pulse is shorter than the first pulse, and wherein the duration of the third pulse is within a duration of the first pulse.

Example 8b is a method according to any example herein, in particular example 5b, wherein writing the fourth state includes asserting, after the plate-line is de-asserted or set to the ground voltage and between a duration of the first pulse, the bit-line to a nominal voltage level for a duration of a fourth pulse, wherein the fourth pulse is de-asserted prior to de-asserting the first pulse.

Example 9b is a method according to any example herein, in particular example 5b, wherein the capacitor has a first polarization loop and a second polarization loop, wherein the second polarization loop is within the first polarization loop.

Example 10b is a method according to any example herein, in particular example 9b, wherein first state and the fourth state are part of the first polarization loop, wherein second state and the third state are part of the second polarization loop.

Example 11b is a method according to any example herein, in particular example 5b further includes writing the fourth state prior to writing the first state or the second state.

Example 12b is a method according to any example herein, in particular example 5b further includes writing the first state prior to writing the third state or the fourth state.

Example 13b is a method according to any example herein, in particular example 1b, wherein the capacitor includes a first capacitor with a first non-linear polar material; and a second capacitor with a second non-linear polar material, wherein the first capacitor is coupled in parallel to the second capacitor.

Example 14b is a method according to any example herein, in particular example 13b, wherein the first non-linear polar material has a different thickness than the second non-linear polar material, and wherein first non-linear polar material has same doping as the second non-linear polar material.

Example 15b is a method according to any example herein, in particular example 13b, wherein the first non-linear polar material has a different doping than the second non-linear polar material, and wherein first non-linear polar material has a same thickness as the second non-linear polar material.

Example 16b is a method according to any example herein, in particular example 13b, wherein the capacitor further includes a resistive device coupled in series with the second capacitor, wherein the resistive device and the second capacitor in combination are parallel to the first capacitor.

Example 17b is a method according to any example herein, in particular example 13b, wherein the first capacitor has a first polarization loop, and wherein the second capacitor has a second polarization loop which is different from the first polarization loop.

Example 18b is a method according to any example herein, in particular example 13b, wherein the first non-linear polar material or the second non-linear polar material includes the non-linear polar materials discussed herein.

Example 19b is an apparatus comprising: a first circuitry to voltage boost a word-line above a nominal voltage to generate a boosted word-line, wherein the boosted word-line has a first pulse width, wherein the word-line is coupled to a gate terminal of a transistor, wherein the transistor is further coupled to a bit-line, wherein the transistor is coupled to a capacitor, wherein the capacitor has a first terminal coupled to a plate-line and a second terminal coupled to the transistor; and a second circuitry to write a first state and a second state to the capacitor in a first write phase via amplitude modulation of the bit-line and by assertion of the plate-line between a duration of a first pulse of the word-line to generate an asserted plate-line, wherein the asserted plate-line has a second pulse shorter than the first pulse.

Example 20b is an apparatus according to any example herein, in particular example 19, wherein second circuitry is to set, after the asserted plate-line is generated and between a duration of the second pulse, the bit-line to a ground voltage to write the first state to the capacitor, and wherein the second circuitry is to: set, after the asserted plate-line is generated, the bit-line to a voltage level between a nominal voltage level and a ground voltage to write the second state to the capacitor; and assert the bit-line between the duration of the second pulse after setting the bit-line to the ground voltage.

Example 1c is a method comprising: voltage boosting a word-line above a nominal voltage to generate a boosted word-line, wherein the boosted word-line has a first pulse, wherein the word-line is coupled to a gate terminal of a transistor, wherein the transistor is further coupled to a bit-line, wherein the transistor is coupled to a capacitor, wherein the capacitor has a first terminal coupled to a plate-line and a second terminal coupled to the transistor; and reading one of multiple states stored in the capacitor by asserting the plate-line between a duration of the first pulse to generate an asserted plate-line, wherein the asserted plate-line has a second pulse shorter than the first pulse.

Example 2c is a method according to any example herein, in particular example 1c, wherein the plate-line is parallel to the word-line and orthogonal to the bit-line.

Example 3c is a method according to any example herein, in particular example 1c, wherein the multiple states include a first state which is read by: pre-charging the bit-line to a ground voltage or a normal supply voltage before the word-line is boosted; placing the bit-line in a high-impedance state after pre-charging the bit-line; enabling a sense amplifier to read the first state according to a first voltage on the bit-line; and de-asserting the plate-line.

Example 4c is a method according to any example herein, in particular example 3c further comprises writing the first state to the capacitor after reading the first state.

Example 5c is a method according to any example herein, in particular example 4c, wherein writing the first state comprises: re-asserting the plate-line to generate a re-asserted plate-line with a third pulse shorter than the first pulse; and setting, after re-asserting the plate-line and between a duration of the third pulse, the bit-line to a ground voltage to write the first state to the capacitor.

Example 6c is a method according to any example herein, in particular example 1c, wherein the multiple states include a second state which is read by: pre-charging the bit-line to a ground voltage or a normal supply voltage before the word-line is boosted; placing the bit-line in a high-impedance state after pre-charging the bit-line; enabling a sense amplifier to read the second state according to a second voltage on the bit-line; and de-asserting the plate-line.

Example 7c is a method according to any example herein, in particular example 6c further comprises writing the second state to the capacitor after reading the second state.

Example 8c is a method according to any example herein, in particular example 7c, wherein writing the second state comprises: re-asserting the plate-line to generate a re-asserted plate-line with a third pulse shorter than the first pulse; setting, after the asserted plate-line is generated, the bit-line to a ground voltage to write a second state to the capacitor; and asserting the bit-line between the duration of the second pulse after setting the bit-line to the ground voltage.

Example 9c is a method according to any example herein, in particular example 1c, wherein the multiple states include a third state which is read by: pre-charging the bit-line to a ground voltage or a normal supply voltage before the word-line is boosted; placing the bit-line in a high-impedance state after pre-charging the bit-line; enabling a sense amplifier to read the third state according to a third voltage on the bit-line; and de-asserting the plate-line.

Example 10c is a method according to any example herein, in particular example 9c further comprises writing the third state to the capacitor after reading the third state.

Example 11c is a method according to any example herein, in particular example 10c, wherein writing the third state comprises: de-asserting the plate-line or setting the plate-line to a ground voltage; and asserting, after the plate-line is de-asserted or set to the ground voltage and between the duration of the first pulse, the bit-line for a duration of a third pulse to write the third state to the capacitor, wherein the third pulse is shorter than the first pulse, and wherein the duration of the third pulse is within the duration of the first pulse.

Example 12c is a method according to any example herein, in particular example 1c, wherein the multiple states include a fourth state which is read by: pre-charging the bit-line to a ground voltage or a normal supply voltage before the word-line is boosted; placing the bit-line in a high-impedance state after pre-charging the bit-line; enabling a sense amplifier to read the fourth state according to a fourth voltage on the bit-line; and de-asserting the plate-line after enabling the sense amplifier.

Example 13c is a method according to any example herein, in particular example 12c further comprises writing the fourth state to the capacitor after reading the fourth state.

Example 14 is a method according to any example herein, in particular example 13c, wherein writing the fourth state includes: asserting, after the plate-line is de-asserted or set to a ground voltage and between the duration of the first pulse, the bit-line for a duration of a fourth pulse, wherein the fourth pulse is de-asserted prior to de-asserting the first pulse.

Example 15 is a method according to any example herein, in particular example 1c, wherein the multiple states include a first state having a first voltage, a second state having a second voltage, a third state having a third voltage, and a fourth state having a fourth voltage, wherein the first voltage is lower than the second voltage, wherein the second voltage is lower than the third voltage, and wherein the fourth voltage is lower than the third voltage.

Example 16 is a method according to any example herein, in particular example 1c, wherein the capacitor includes: a first capacitor with a first non-linear polar material; and a second capacitor with a second non-linear polar material, wherein the first capacitor is coupled in parallel to the second capacitor, wherein the first capacitor has a first polarization loop, and wherein the second capacitor has a second polarization loop which is different from the first polarization loop.

Example 17 is a method according to any example herein, in particular example 16c, wherein the first non-linear polar material has a different thickness than the second non-linear polar material, and wherein the first non-linear polar material has same doping as the second non-linear polar material.

Example 18 is a method according to any example herein, in particular example 16c, wherein the first non-linear polar material has a different doping than the second non-linear polar material, and wherein the first non-linear polar material has a same thickness as the second non-linear polar material.

Example 19 is a method according to any example herein, in particular example 16c, wherein the capacitor further includes a resistive device coupled in series with the second capacitor, wherein the resistive device and the second capacitor in combination are parallel to the first capacitor.

Example 20 is an apparatus comprising: first circuitry to voltage boost a word-line above a nominal voltage to generate a boosted word-line, wherein the boosted word-line has a first pulse, wherein the word-line is coupled to a gate terminal of a transistor, wherein the transistor is further coupled to a bit-line, wherein the transistor is coupled to a capacitor, wherein the capacitor has a first terminal coupled to a plate-line and a second terminal coupled to the transistor; and a second circuitry to read one of multiple states stored in the capacitor by asserting the plate-line between a duration of the first pulse to generate an asserted plate-line, wherein the asserted plate-line has a second pulse shorter than the first pulse.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate example.

We claim:

1. An apparatus comprising:

a transistor having a gate terminal coupled to a word-line, wherein the transistor is further coupled to a bit-line; and a capacitor having a first terminal coupled to a plate-line and a second terminal coupled to the transistor, wherein the capacitor includes a non-linear polar material, and wherein the capacitor includes at least four stable states, and wherein the capacitor includes:

a first capacitor with a first non-linear polar material; and a second capacitor with a second non-linear polar material, wherein the first capacitor is coupled in parallel to the second capacitor.

2. The apparatus of claim 1, wherein the capacitor has a first polarization loop and a second polarization loop, and wherein the second polarization loop is within the first polarization loop.

3. The apparatus of claim 2, wherein first two states of the at least four stable states are part of the first polarization loop, and wherein second two states of the at least four stable states are part of the second polarization loop.

4. The apparatus of claim 3, wherein the at least four stable states include a first state, a second state, a third state, and a fourth state, and wherein a difference in voltages on the plate-line and the bit-line indicates a polarity, wherein the polarity is positive for the first state and the second state, and wherein the polarity is negative for the third state and the fourth state.

5. The apparatus of claim 1, further includes a circuitry to program the capacitor is by pulse width modulation or amplitude modulation of a voltage on the bit-line.

6. The apparatus of claim 1 further includes a circuitry to write a first state to the capacitor prior to a second state to the capacitor, and wherein the first state is a different state than the second state, and wherein the second state is a target state.

7. The apparatus of claim 1, wherein the first non-linear polar material has a different thickness than the second non-linear polar material, and wherein first non-linear polar material has same doping as the second non-linear polar material.

8. The apparatus of claim 1, wherein the first non-linear polar material has a different doping than the second non-linear polar material, and wherein first non-linear polar material has a same thickness as the second non-linear polar material.

9. The apparatus of claim 1, wherein the capacitor further includes a resistive device coupled in series with the second capacitor, and wherein the resistive device and the second capacitor in combination are parallel to the first capacitor.

10. The apparatus of claim 1, wherein the first capacitor has a first polarization loop, and wherein the second capacitor has a second polarization loop which is different from the first polarization loop.

11. The apparatus of claim 1, wherein the non-linear polar material includes one of:

a form ABB'$O_3$, wherein "A" includes one of: Ba, K, Bi, Y, La, Sc, Ce, Pr, Nd, Pm, Sm, Eu, Gd, Tb, Dy, Ho, Er, T, Yb, Lu, Li, Bi, K, or Na, wherein "B" includes one of Mn, Fe, Ta, or Nb, and wherein "B'" includes one of: Sc, Ti, V, Cr, Mn, Fe, Co, Ni, Cu, or Zn;

a form AA'B$O_3$, wherein "A" includes one of: Ba, K, Bi, Y, La, Sc, Ce, Pr, Nd, Pm, Sm, Eu, Gd, Tb, Dy, Ho, Er, T, Yb, Lu, Li, Bi, K, or Na, wherein "B" includes one of Mn, Fe, Ta, or Nb, wherein "A'" includes one of Y, La, Sc, Ce, Pr, Nd, Pm, Sm, Eu, Gd, Tb, Dy, Ho, Er, T, Yb, Lu, and wherein A' comprises a valency of site A, but different ferroelectric polarizability from A;

a form AB$O_3$, wherein "A" includes one of: Ba, K, Bi, Y, La, Sc, Ce, Pr, Nd, Pm, Sm, Eu, Gd, Tb, Dy, Ho, Er, T, Yb, Lu, Li, Bi, K, or Na, and wherein "B" includes one of Mn, Fe, Ta, or Nb;

bismuth ferrite (BFO), BFO with a first doping material, wherein the first doping material is one of lanthanum, elements from lanthanide series of a periodic table, or elements of 3d, 4d, 5d, 6d, 4f, or 5*f* series of periodic table;

lead zirconium titanate (PZT) or PZT with a second doping material, wherein the second doping material is one of La or Nb;

a perovskite material which includes one of: $BaTiO_3$, $PbTiO_3$, $KNbO_3$, $KNbO_3$, $NaTaO_3$, wherein the perovskite material is doped with La or Lanthanides, chemically substituted lead titanate, and wherein Zr, La, or Nb is substituted in Ti site;

a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST);

a $BaTiO_3$ (BTO) based relaxor which includes one of: $BaTiO_3$—$Bi(Zn_{1/2}Ti_{1/2})O_3$ (BTO-BZT), $BaTiO_3$—$BiScO_3$ (BTO-BS): $BiScO_3$, $Ba_{(1-x)}Sr_xTiO_3$ (BST), $BaTiO_3$—$Pb(Mg_{1/3}Nb_{2/3})O_3$ (BTO-PMN), $BaTi_{(1-x)}Zr_xO_3$ (BTZ), $BaTiO_3$—$Pb(Zn_{1/3}Nb_{2/3})O_3$ (BTO-PZN), $BaTiO_3$—$Pb(Sc_{1/2}Nb_{1/2})O_3$ (BTO-PSN);

a PZT based relaxor which includes one of: PZT-$Pb(Mg_{1/3} Nb_{2/3})O_3$ (PZT-PMN), PZT-$Pb(Ni_{1/3}Nb_{2/3})O_3$ (PZT-PNN), PZT-$Pb(Zn_{1/3}Nb_{2/3})O_3$ (PZT-PZN), PZT-$Pb(Sc_{1/2}Nb_{1/2})O_3$ (PZT-PSN), PZT-$Pb(Fe_{1/2}Nb_{1/2})O_3$ (PZT-PFN), PZT-Pb(La, Zr, Ti)$O_3$ (PZT-PLZT), or PZT-Pb(Ti,Mn)$O_3$ (PZT-PTM);

a $SrBi_2Ta_2O_9$ (SBT) based relaxor which includes one of: paraelectric SBT-$SrBi_2(Nb,Ta)_2O_9$ (SBT-SBNT), or SBT doped with one of: Mn, Fe, Co, La, Ce or Nd, Ba, or Ca;

a first hexagonal ferroelectric which includes one of: $YMnO_3$ or $LuFeO_3$;

a second hexagonal ferroelectric of a type $RMnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);

lithium niobate, lithium tantalate, lithium iron tantalum oxy fluoride, barium strontium niobate, sodium barium niobate, or potassium strontium niobate;

an improper ferroelectric material which includes one of: [PTO/STO]n or [LAO/STO]n, wherein 'n' is between 1 and 100;

Hafnium (Hf), Zirconium (Zr), Aluminum (Al), Silicon (Si), their oxides or their alloyed oxides;

Hafnium oxides of a form $Hf_{(1-x)}E_xO_y$, where E includes one of: Al, Ca, Ce, Dy, Er, Gd, Ge, La, Sc, Si, Sr, Sn, Zr, or Y, wherein 'x' and 'y' are first and second fractions, respectively;

$HfO_2$ doped with one of: Al, Ca, Ce, Dy, Er, Gd, Ge, La, Sc, Si, Sr, Sn, or Y;

$Al_{(1-X)}Sc_{(x)}N$, $Ga_{(1-x)}Sc_{(x)}N$, $Al_{(1-X)}Y_{(x)}N$or $Al_{(1-X-y)}Mg_{(x)}Nb_{(y)}N$, wherein 'x' and 'y' are third and fourth fractions, respectively; or $LiNbO_3$, $LiTaO_3$, $LiTaO_2F_2$, $Sr_{(x)}Ba_{(1-x)}Nb_2O_6$ where $0.32 \leq x \leq 0.8$, or $KSr_2Nb_5O_{15}$; or a paraelectric material comprising $SrTiO_3$, $Ba_{(x)}Sr_{(y)}TiO_3$, $HfZrO_2$, Hf—Si—O, or La-substituted $PbTiO_3$.

12. A system comprising:

a processor;

a memory coupled to the processor; and a communication circuitry coupled to the processor, wherein the memory includes a bit-cell that includes:

a transistor having a gate terminal coupled to a word-line, wherein the transistor is further coupled to a bit-line; and a capacitor having a first terminal coupled to a plate-line and a second terminal coupled to the transistor, wherein the capacitor includes a non-linear polar material, wherein the capacitor includes at least four stable states, and wherein the capacitor includes:

a first capacitor with a first non-linear polar material; and a second capacitor with a second non-linear polar material, wherein the first capacitor is coupled in parallel to the second capacitor.

13. The system of claim 12, wherein the capacitor has a first polarization loop and a second polarization loop, and wherein the second polarization loop is within the first polarization loop.

14. The system of claim 13, wherein first two states of the at least four stable states are part of the first polarization loop, and wherein second two states of the at least four stable states are part of the second polarization loop.

15. The system of claim 12, wherein the memory includes a circuitry to program the capacitor by pulse width modulation or amplitude modulation of a voltage on the bit-line.

16. The system of claim 12, wherein the memory includes a circuitry to write a first state to the capacitor prior to a second state to the capacitor, wherein the first state is a different state than the second state, and wherein the second state is a target state.

17. A method comprising:

forming a transistor having a gate terminal coupled to a word-line, wherein the transistor is further coupled to a bit-line; and forming a capacitor having a first terminal coupled to a plate-line and a second terminal coupled to the transistor, wherein the capacitor includes a non-linear polar material, and wherein the capacitor includes at least four stable states, and wherein the capacitor includes:

a first capacitor with a first non-linear polar material; and a second capacitor with a second non-linear polar material, wherein the first capacitor is coupled in parallel to the second capacitor.

18. The method of claim 17, wherein the capacitor has a first polarization loop and a second polarization loop, and wherein the second polarization loop is within the first polarization loop.

19. The method of claim 18, wherein first two states of the at least four stable states are part of the first polarization loop, and wherein second two states of the at least four stable states are part of the second polarization loop.

* * * * *